United States Patent [19]

Saitoh et al.

[11] Patent Number: 4,678,733

[45] Date of Patent: Jul. 7, 1987

[54] MEMBER HAVING LIGHT RECEIVING LAYER OF A-SI: GE (C,N,O) A-SI/SURFACE ANTIREFLECTION LAYER WITH NON-PARALLEL INTERFACES

[75] Inventors: Keishi Saitoh, Ibaraki; Masahiro Kanai, Tokyo; Tetsuo Sueda, Chofu; Teruo Misumi, Kawasaki; Yoshio Tsuezuki, Toride; Kyosuke Ogawa, Tokyo, all of Japan

[73] Assignee: Canon Kabushiki Kaisha, Tokyo, Japan

[21] Appl. No.: 786,970

[22] Filed: Oct. 11, 1985

[30] Foreign Application Priority Data

Oct. 15, 1984 [JP] Japan ................................ 59-214347
Oct. 16, 1984 [JP] Japan ................................ 59-215174
Oct. 17, 1984 [JP] Japan ................................ 59-216352
Oct. 18, 1984 [JP] Japan ................................ 59-217261
Oct. 19, 1984 [JP] Japan ................................ 59-218524
Oct. 20, 1984 [JP] Japan ................................ 59-219388

[51] Int. Cl.$^4$ ........................................ G03G 5/082
[52] U.S. Cl. ........................................ 430/57; 430/66; 430/84
[58] Field of Search .................. 430/56, 57, 58, 65, 430/69, 84, 66

[56] References Cited

U.S. PATENT DOCUMENTS 4,359,514 11/1982 Shimizu et al. ...................... 430/65
4,492,745 1/1985 Mimura et al. ...................... 430/67
4,514,483 4/1985 Matsuura et al. ..................... 430/84

FOREIGN PATENT DOCUMENTS 2733187 1/1978 Fed. Rep. of Germany ........ 430/65
56-150754 11/1981 Japan ..................................... 430/65

*Primary Examiner*—John L. Goodrow
*Attorney, Agent, or Firm*—Fitzpatrick, Cella, Harper & Scinto

[57] ABSTRACT

A light receiving member comprises a light receiving layer of a multi-layer structure having a first layer comprising an amorphous material containing silicon atoms and germanium atoms, a second layer comprising an amorphous material containing silicon atoms and exhibiting photoconductivity and a surface layer having reflection preventive function provided on a substrate successively from the substrate side, said light receiving layer containing at least one selected from oxygen atoms, carbon atoms and nitrogen atoms and having at least one pair of non-parallel interfaces within a short range and said non-parallel interfaces being arranged in a large number in at least one direction within the plane perpendicular to the layer thickness direction.

57 Claims, 85 Drawing Figures

FIG. 1
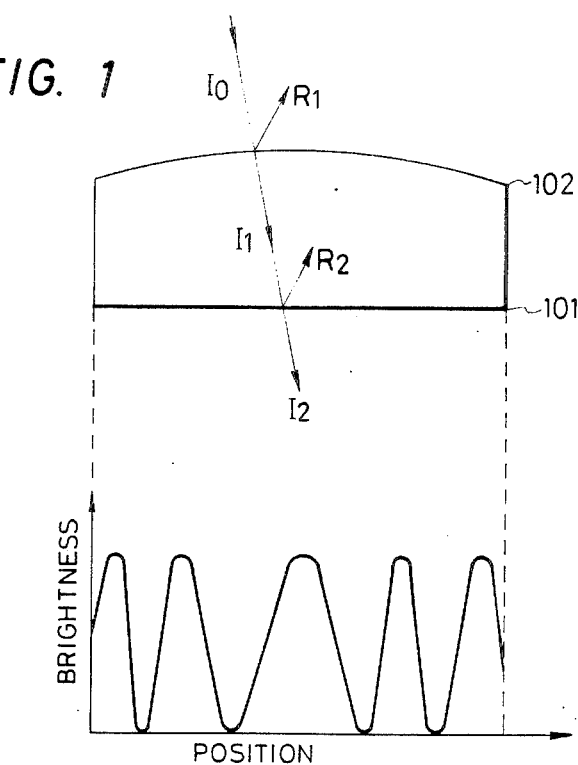
FIG. 2
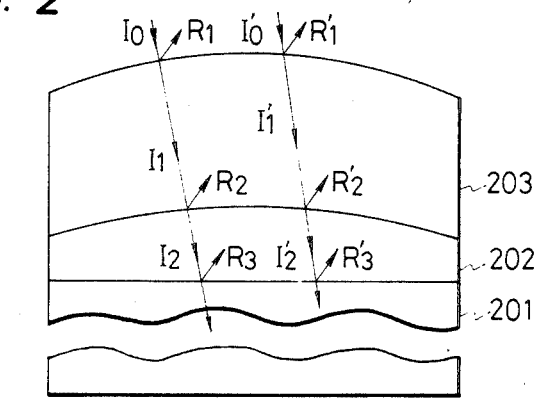
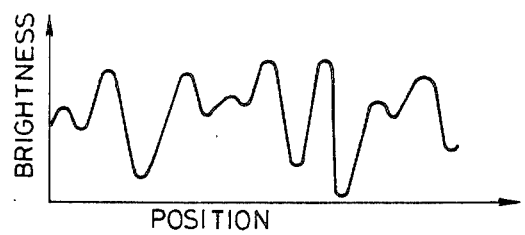

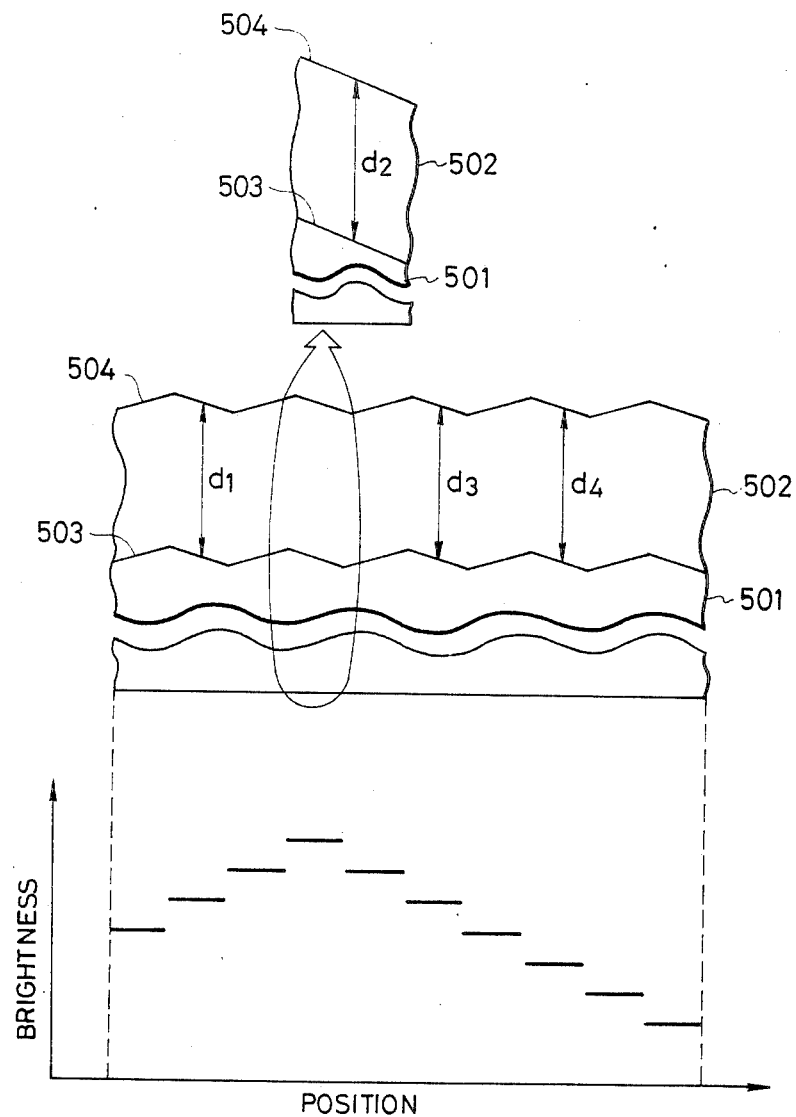

4,678,733

MEMBER HAVING LIGHT RECEIVING LAYER OF A-SI: GE (C,N,O) A-SI/SURFACE ANTIREFLECTION LAYER WITH NON-PARALLEL INTERFACES

CROSS-REFERENCE TO RELATED APPLICATIONS

This application contains subject matter related to commonly assigned, copending application Ser. Nos. 697,141; 699,868; 705,516; 709,888; 717,821; 719,980; 720,011; 725,751; 726,768; 739,867; 740,714; 740,901; 741,300; 752,920; 753,011 and 753,048.

BACKGROUND OF THE INVENTION

1. Field of the Invention

This invention relates to a light-receiving member having sensitivity to electromagnetic waves such as light [herein used in a broad sense, including ultraviolet rays, visible light, infrared rays, X-rays and gamma-rays]. More particularly, it pertains to a light-receiving member suitable for using a coherent light such as laser beam.

2. Description of the Prior Art

As the method for recording a digital image information as an image, there have been well known the methods in which an electrostatic latent image is formed by scanning optically a light-receiving member with a laser beam modulated corresponding to a digital image information, then said latent image is developed, followed by processing such as transfer or fixing, if desired, to record an image. Among them, in the image forming method employing electrophotography, image recording has been generally practiced with the use of a small size and inexpensive He-Ne laser or a semiconductor laser (generally having an emitted wavelength of 650–820 nm).

In particular, as the light-receiving member for electrophotography which is suitable when using a semiconductor laser, an amorphous material containing silicon atoms (hereinafter written briefly as "A-Si") as disclosed in Japanese Laid-open Patent Application Nos. 86341/1979 and 83746/1981 is attracting attention for its high Vickers hardness and non-polluting properties in social aspect in addition to the advantage of being by far superior in matching in its photosensitive region as compared with other kinds of light-receiving members.

However, when the photosensitive layer is made of a single A-Si layer, for ensuring dark resistance of $10^{12}$ ohm.cm or higher required for electrophotography while maintaining high photosensitivity, it is necessary to incorporate structurally hydrogen atoms or halogen atoms or boron atoms in addition thereto in controlled form within specific ranges of amounts. Accordingly, control of layer formation is required to be performed severely, whereby tolerance in designing of a light-receiving member is considerably limited.

As attempts to enlarge this tolerance in designing, namely to enable effective utilization of its high photosensitivity in spite of somewhat lower dark resistance, there have been proposed a light-receiving layer with a multi-layer structure of two or more laminated layers with different conductivity characteristics with formation of a depletion layer within the light receiving layer, as disclosed in Japanese Laid-open Patent Application Nos. 121743/1979, 4053/1982 and 4172/1982, or a light receiving member with a multi-layer structure in which a barrier layer is provided between the substrate and the photosensitive layer and/or on the upper surface of the photosensitive layer, thereby enhancing apparent dark resistance of the light-receiving layer as a whole, as disclosed in Japanese Laid-open Patent Application Nos. 52178/1982, 52179/1982, 52180/1982, 58159/1982, 58160/1982 and 58161/1982.

According to such proposals, A-Si type light receiving members have been greatly advanced in tolerance in designing of commercialization thereof or easiness in management of its production and productivity, and the speed of development toward commercialization is now further accelerated.

When carrying out laser recording by use of such a light receiving member having a light receiving layer of a multi-layer structure, due to irregularity in thickness of respective layers, and also because of the laser beam which is an coherent monochromatic light, it is possible that the respective reflected lights reflected from the free surface on the laser irradiation side of the light-receiving layer and the layer interface between the respective layers constituting the light-receiving layer and between the substrate and the light receiving layer (hereinafter "interface" is used to mean comprehensively both the free surface and the layer interface) may undergo interference.

Such an interference phenomenon results in the so-called interference fringe pattern in the visible image formed and causes a poor image. In particular, in the case of forming a medium tone image with high gradation, bad appearance of the image will become marked.

Moreover, as the wavelength region of the semiconductor laser beam is shifted toward longer wavelength, absorption of said laser beam in the photosensitive layer becomes reduced, whereby the above interference phenomenon becomes more marked.

This point is explained by referring to the drawings.

FIG. 1 shows a light $I_0$ entering a certain layer constituting the light receiving layer of a light receiving member, a reflected light $R_1$ from the upper interface 102 and a reflected light $R_2$ reflected from the lower interface 101.

Now, the average layer thickness of the layer is defined as d, its refractive index as n and the wavelength of the light as $\lambda$, and when the layer thickness of a certain layer is ununiform gently with a layer thickness difference of $\lambda/2n$ or more, changes in absorbed light quantity and transmitted light quantity occur depending on to which condition of $2nd = m\lambda$ (m is an integer, reflected lights are strengthened with each other) and $2nd = (m + \frac{1}{2})\lambda$ (m is an integer, reflected lights are weakened with each other) the reflected lights $R_1$ and $R_2$ conform.

In the light receiving member of a multi-layer structure, the interference effect as shown in FIG. 1 occurs at each layer, and there ensues a synergistic deleterious influence through respective interferences as shown in FIG. 2. For this reason, the interference fringe corresponding to said interference fringe pattern appears on the visible image transferred and fixed on the transfer member to cause bad images.

As the method for cancelling such an inconvenience, it has been proposed to subject the surface of the substrate to diamond cutting to provide unevenness of $\pm 500$ Å–$\pm 10000$ Å, thereby forming a light scattering surface (as disclosed in Japanese Laid-open Patent Application No. 162975/1983); to provide a light absorbing layer by subjecting the aluminum substrate surface to black Alumite treatment or dispersing carbon, color pigment or dye in a resin (as disclosed in Japanese Laid-open Patent Application No. 165845/1982); and to provide a light scattering reflection preventive layer on the substrate surface by subjecting the aluminum substrate surface to satin-like Alumite treatment or by providing a sandy fine unevenness by sand blast (as disclosed in Japanese Laid-open Patent Application No. 16554/1982).

However, according to these methods of the prior art, the interference fringe pattern appearing on the image could not completely be cancelled.

For example, because only a large number of unevenness with specific sized are formed on the substrate surface according to the first method, although prevention of appearance of interference fringe through light scattering is indeed effected, regular reflection light component yet exists. Therefore, in addition to remaining of the interference fringe by said regular reflection light, enlargement of irradiated spot occurs due to the light scattering effect on the surface of the substrate to be a cause for substantial lowering of resolution.

As for the second method, such a black Alumite treatment is not sufficient for complete absorption, but reflected light from the substrate surface remains. Also, there are involved various inconveniences. For example, in providing a resin layer containing a color pigment dispersed therein, a phenomenon of degassing from the resin layer occurs during formation of the A-Si photosensitive layer to markedly lower the layer quality of the photosensitive layer formed, and the resin layer suffers from a damage by the plasma during formation of A-Si photosensitive layer to be deteriorated in its inherent absorbing function. Besides, worsening of the surface state deleteriously affects subsequent formation of the A-Si photosensitive layer.

In the case of the third method of irregularly roughening the substrate surface, as shown in FIG. 3, for example, the incident light $I_0$ is partly reflected from the surface of the light receiving layer 302 to become a reflected light $R_1$, with the remainder progressing internally through the light receiving layer 302 to become a transmitted light $I_1$. The transmitted light $I_1$ is partly scattered on the surface of the substrate 301 to become scattered lights $K_1, K_2, K_3 \ldots K_n$, with the remainder being regularly reflected to become a reflected light $R_2$, a part of which goes outside as an emitted light $R_3$. Thus, since the reflected light $R_1$ and the emitted light $R_3$ which is an interferable component remain, it is not yet possible to extinguish the interference fringe pattern.

On the other hand, if diffusibility of the surface of the substrate 301 is increased in order to prevent multiple reflections within the light receiving layer 302 through prevention of interference, light will be diffused within the light receiving layer 302 to cause halation, whereby resolution is disadvantageously lowered.

Particularly, in a light receiving member of a multi-layer structure, as shown in FIG. 4, even if the surface of the substrate 401 may be irregularly roughened, the reflected light $R_2$ from the first layer 402, the reflected light $R_1$ from the second layer 403 and the regularly reflected light $R_3$ from the surface of the substrate 401 are interfered with each other to form an interference fringe pattern depending on the respective layer thicknesses of the light receiving member. Accordingly, in a light receiving member of a multi-layer structure, it was impossible to completely prevent appearance of interference fringes by irregularly roughening the surface of the substrate 401.

In the case of irregularly roughening the substrate surface according to the method such as sand blasting, etc., the roughness will vary so much from lot to lot, and there is also nonuniformity in roughness even in the same lot, and therefore production control could be done with inconvenience. In addition, relatively large projections with random distributions are frequently formed, hence causing local breakdown of the light receiving layer during charging treatment.

On the other hand, in the case of simply roughening the surface of the substrate 501 regularly, as shown in FIG. 5, since the light-receiving layer 502 is deposited along the uneven shape of the surface of the substrate 501, the slanted plane of the unevenness of the substrate 501 becomes parallel to the slanted plane of the unevenness of the light receiving layer 502.

Accordingly, for the incident light on that portion, $2nd_1 = m\lambda$ or $2nd_1 = (m+\frac{1}{2})\lambda$ holds, to make it a light portion or a dark portion. Also, in the light receiving layer as a whole, since there is nonuniformity in which the maximum difference among the layer thicknesses $d_1$, $d_2$, $d_3$ and $d_4$ of the light receiving layer is $\lambda/2n$ or more, there appears a light and dark fringe pattern.

Thus, it is impossible to completely extinguish the interference fringe pattern by only roughening regularly the surface of the substrate 501.

Also, in the case of depositing a light receiving layer of a multi-layer structure on the substrate, the surface of which is regularly roughened, in addition to the interference between the regularly reflected light from the substrate surface and the reflected light from the light receiving layer surface as explained for light receiving member of a single layer structure in FIG. 3, interferences by the reflected lights from the interfaces between the respective layers participate to make the extent of appearance of interference fringe pattern more complicated than in the case of the light receiving member of a single layer structure.

SUMMARY OF THE INVENTION

An object of the present invention is to provide a novel light-receiving member sensitive to light, which has cancelled the drawbacks as described above.

Another object of the present invention is to provide a light-receiving member which is suitable for image formation by use of a coherent monochromatic light and also easy in production management.

Still another object of the present invention is to provide a light-receiving member which can cancel the interference fringe pattern appearing during image formation and appearance of speckles on reversal developing at the same time and completely.

Still another object of the prevent invention is to provide a light-receiving member which is high in dielectric strength and photosensitivity and excellent in electrophotographic characteristics.

It is also another object of the present invention to provide a light-receiving member, which can provide an image of high quality which is high in density, clear in halftone and high in resolution and is suitable for electrophotography.

Still another object of the present invention is to provide a light receiving member which is capable of reducing light reflection from the surface of the light receiving member and utilizing incident light efficiently.

According to the present invention, there is provided a light-receiving member comprising a light-receiving layer of a multi-layer structure having a first layer comprising an amorphous material containing silicon atoms and germanium atoms, a second layer comprising an amorphous material containing silicon atoms and exhibiting photoconductivity and a surface layer having reflection preventive function provided on a substrate successively from the substrate side, said light-receiving layer containing at least one selected from oxgen atoms, carbon atoms and nitrogen atoms and having at least one pair of non-parallel interfaces within a short range and said non-parallel interfaces being arranged in a large number in at least one direction within the plane perpendicular to the layer thickness direction.

BRIEF DESCRIPTION OF THE DRAWINGS

FIG. 1 is a schematic illustration of interference fringe in general;

FIG. 2 is a schematic illustration of interference fringe in the case of a multi-layer light-receiving member;

FIG. 5 is a schematic illustration of interference fringe in the case where the interfaces of respective layers of a light-receiving member are parallel to each other;

DESCRIPTION OF THE PREFERRED EMBODIMENTS

Referring now to the accompanying drawings, the present invention is to be described in detail.

FIG. 6 is a schematic illustration for explanation of the basic principle of the present invention.

In the present invention, on a substrate (not shown) having a fine uneven shape smaller than the resolution required for the device, a light-receiving layer of a multi-layer constitution is provided along the uneven slanted plane, with the thickness of the second layer 602 being continuously changed from $d_5$ to $d_6$, as shown enlarged in a part of FIG. 6, and therefore the interface 603 and the interface 604 have respective gradients. Accordingly, the coherent light incident on this minute portion (short range region ) l [indicated schematically in FIG. 6 (C), and its enlarged view shown in FIG. 6 (A)] undergoes interference at said minute portion l to form a minute interference fringe pattern.

Figure 3:
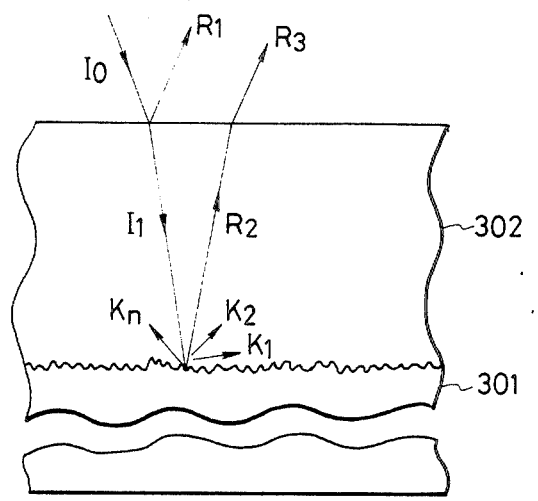
FIG. 3 is a schematic illustration of interference fringe by scattered light.
Figure 4:
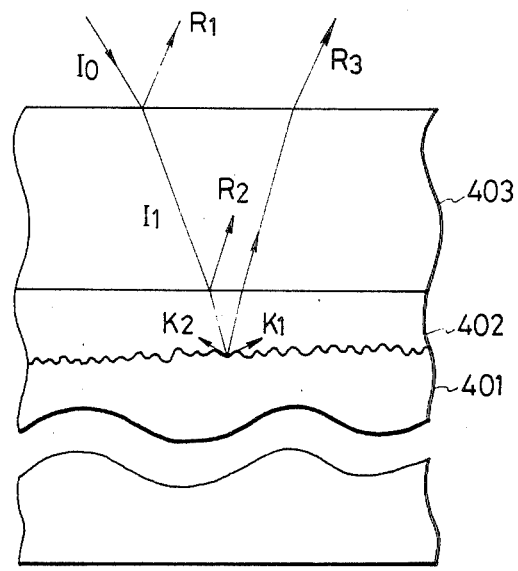
FIG. 4 is a schematic illustration of interference fringe by scattered light in the case of a multi-layer light-receiving member.
Figure 6A:
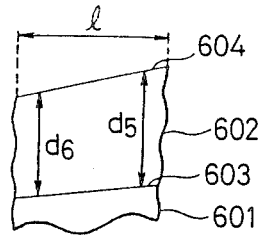
FIG. 6 (A), (B), (C) and (D) are schematic illustrations of no appearance of interference fringe in the case of non-parallel interfaces between respective layers of a light-receiving member.
Figure 6B:
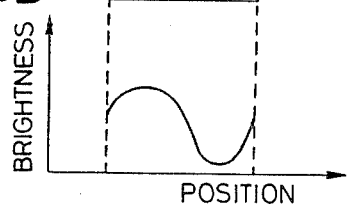
Figure 6C:
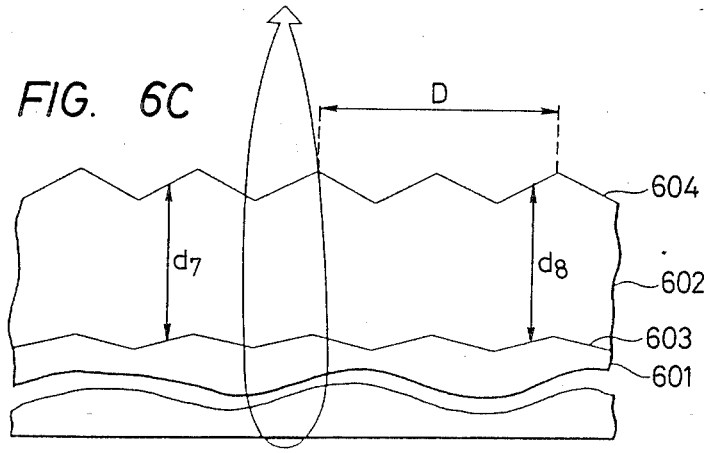
Figure 6D:
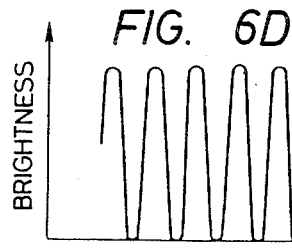
Figure 7A:
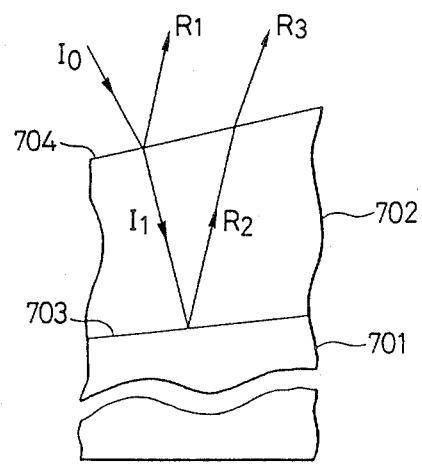
FIG. 7 (A), (B) and (C) are schematic illustration of comparison of the reflected light intensity between the case of parallel interfaces and non-parallel interfaces between the respective layers of a light-receiving member.
Figure 7B:
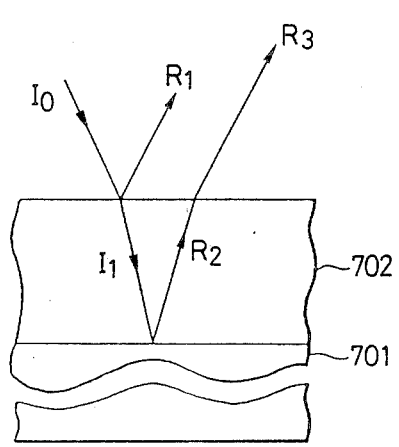
Figure 7C:
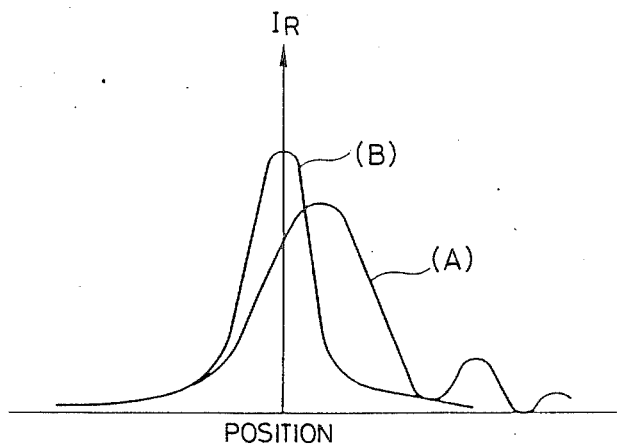
Figure 8:
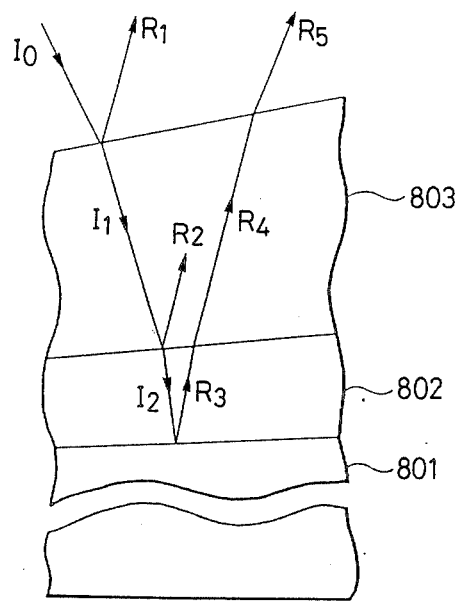
FIG. 8 is a schematic illustration of no appearance of interference fringe in the case of non-parallel interfaces between respective layers.

Also, as shown in FIG. 7, when the interface 703 between the first layer 701 and the second layer 702 and the free surface 704 are non-parallel to each other, the reflected light $R_1$ and the emitted light $R_3$ are different in direction of progress from each other relative to the incident light $I_0$ as shown in FIG. 7 (A), and therefore the degree of interference will be reduced as compared with the case (FIG. 7 (B)) when the interfaces 703 and 704 are parallel to each other.

Accordingly, as shown in FIG. 7 (C), as compared with the case "(B)" where a pair of the interfaces are in parallel relation, the difference in lightness and darkness in the interference fringe pattern becomes negligibly small even if interfered, if any, in the non-parallel case "(A)".

The same is the case, as shown in FIG. 6, even when the layer thickness of the layer 602 may be macroscopically ununiform ($d_7 \neq d_8$), and therefore the incident light quantity becomes uniform all over the layer region (see FIG. 6 (D)).

To describe about the effect of the present invention when coherent light is transmitted from the irradiation side to the first layer in the case of a light-receiving layer of a multi-layer structure, reflected lights $R_1$, $R_2$, $R_3$, $R_4$ and $R_5$ exits in connection with the incident light $I_0$. Accordingly, at the respective layers, the same phenomenon as described with reference to FIG. 7 occurs.

Therefore, when considered for the light-receiving layer as a whole, interference occurs as a synergetic effect of the respective layers and, according to the present invention, appearance of interference can further be prevented as the number of layers constituting the light-receiving layer is increased.

The interference fringe occurring within the minute portion cannot appear on the image, because the size of the minute portion is smaller than the spot size of the irradiated light, namely smaller than the resolution limit. Further, even if appeared on the image, there is no problem at all, since it is less than resolving ability of the eyes.

In the present invention, the slanted plane of unevenness should desirably be mirror finished in order to direct the reflected light assuredly in one direction.

The size l (one cycle of uneven shape) of the minute portion suitable for the present invention is $l \leq L$, wherein L is the spot size of the irradiation light.

Further, in order to accomplish more effectively the objects of the present invention, the layer thickness difference ($d_5 - d_6$) at the minute portion 1 should desirably be as follows:

$d_5 - d_6 \geq \lambda/2n$ (where $\lambda$ is the wavelength of the irradiation light and n is the refractive index of the second layer 602).

In the present invention, within the layer thickness of the minute portion 1 (hereinafter called as "minute column") in the light-receiving layer of a multi-layer structure, the layer thicknesses of the respective layers are controlled so that at least two interfaces between layers may be in non-parallel relationship, and, provided that this condition is satisfied, any other pair of two interfaces between layers may be in parallel relationship within said minute column.

However, it is desirable that the layers forming parallel interfaces should be formed to have uniform layer thicknesses so that the difference in layer thickness at any two positions may be not more than:

$\lambda/2n$ (n: refractive index of the layer).

For formation of the respective layers of the first layer and the second layer constituting the light-receiving layer, in order to accomplish more effectively and easily the objects of the present invention, the plasma chemical vapor deposition method (PCVD method), the optical CVD method and thermal CVD method can be employed, because the layer thickness can accurately be controlled on the optical level thereby.

The unevenness to be provided on the substrate surface can be formed by fixing a bite having a V-shaped cutting blade at a predetermined position on a cutting working machine such as milling machine, lathe, etc., and cut working accurately the substrate surface by, for example, moving regularly in a certain direction while rotating a cylindrical substrate according to a program previously designed as desired, thereby forming to a desired unevenness shape, pitch and depth. The reverse-V-shaped linear projection produced by the unevenness formed by such a cutting working has a spiral structure with the center axis of the cylindrical substrate as its center. The spiral structure of the reverse-V-shaped projection may be made into a mutiple spiral structure such as double or triple structure or a crossed spiral structure.

Alternatively, a straight line structure along the center axis may also be introduced in addition to the spiral structure.

Figure 9A:
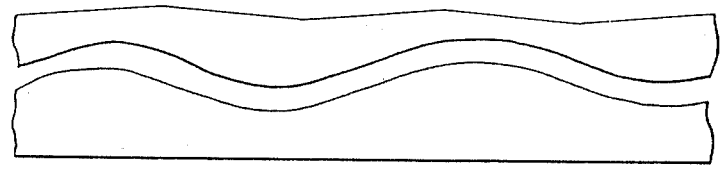
FIG. 9 (A), (B) and (C) are schematic illustrations of the surface condition of typical substrates.
Figure 9B:
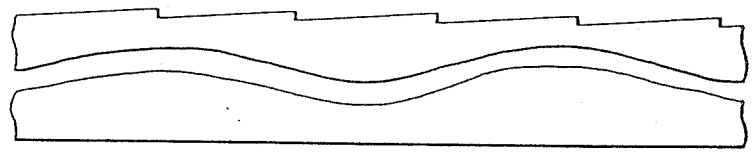
Figure 9C:
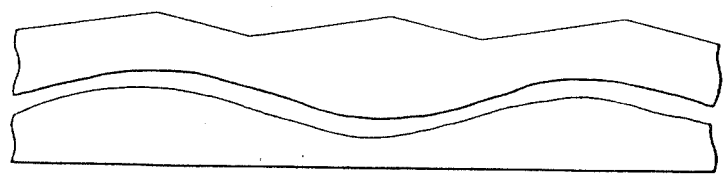

The shape of the longitudinal section of the protruded portion of the unevenness provided on the substrate surface is made reverse-V-shape in order to ensure managed ununiformization of layer thickness within minute columns of respective layers and good adhesion as well as desired electrical contact between the substrate and the layer provided directly on said substrate, and it should preferably be made as shown in FIG. 9 as isosceles triangle, a right triangle or a scalene triangle. Of these shapes, an isosceles triangle and a right triangle are preferred.

In the present invention, the respective dimensions of the unevenness provided on the substrate surface under managed condition are set so as to accomplish effectively the objects of the present invention in view of the following points.

More specifically, in the first place, the A-Si layer constituting the light receiving layer is sensitive to the structure of the surface on which the layer formation is effected, and the layer quality will be changed greatly depending on the surface condition.

Accordingly, it is desirable to set dimensions of the unevenness to be provided on the substrate surface so that lowering in layer quality of the A-Si layer may not be brought about.

Secondly, when there is extreme unevenness on the free surface of the light-receiving layer, cleaning cannot frequently be performed completely in cleaning step after image formation.

Further, in case of practicing blade cleaning, there is involved the problem that the blade will be damaged more earlier.

As the result of investigations of the problems is layer deposition as described above, problems in process of electrophotography and the conditions for prevention of interference fringe pattern, it has been found that the pitch at the recessed portion on the substrate surface should preferably be 500 μm to 0.3 μm, more preferably 200 μm to 1 μm, most preferably 50 μm to 5 μm.

It is also desirable that the maximum depth of the recessed portion should preferably be made 0.1 μm to 5 μm, more preferably 0.3 μm to 3 μm, most preferably 0.6 μm to 2 μm. When the pitch and the maximum depth of the recessed portions on the substrate surface are within the ranges as specified above, the gradient of the slanted plane at the recessed portion (or linear projection) may preferably be 1° to 20°, more preferably 3° to 15°, most preferably 4° to 10°.

On the other hand, the maximum of the difference in the layer thickness based on such an uniformness in layer thickness of the respective layers formed on such a substrate should preferably be made 0.1 μm to 2 μm within the same pitch, more preferably 0.1 μm to 1.5 μm, most preferably 0.2 μm to 1 μm.

The thickness of the surface layer having reflection preventive function should preferably be determined as follows in order to exhibit fully its reflection preventive function.

When the refractive index of the material for the surface layer is defined as n and the wavelength of the light irradiated is as $\lambda$, the thickness of the surface layer having reflection preventive function may preferably be:

$$d = \frac{\lambda}{4n} m \ (\underline{m} \text{ is an odd number}).$$

Also, as the material for the surface layer, when the second layer on which the surface layer is to be deposited is defined as $n_a$, a material having the following refractive index is most preferred:

$$n = \sqrt{n_a}.$$

By taking such optical conditions into considerations, the layer thickness of the reflection preventive layer may preferably be 0.05 to 2 μm, provided that the wavelength of the light for exposure is within the wavelength region of from near infrared light to visible light.

In the present invention, the material to be effectively used as having reflection preventive function may include, for example, inorganic fluorides, inorganic oxides or inorganic nitrides such as $MgF_2$, $Al_2O_3$, $ZrO_2$, $TiO_2$, $ZnS$, $CeO_2$, $CeF_2$, $SiO_2$, $SiO$, $Ta_2O_5$, $AlF_3$, $NaF$, $Si_3N_4$ and the like or organic compounds such as polyvinyl chloride, polyamide resin, polyimide resin, vinylidene fluoride, melamine resin, epoxy resin, phenol resin, cellulose acetate and others.

These materials can be formed into the surface layer according to the vapor deposition method, the sputtering method, the plasma chemical vapor deposition method (PCVD), the optical CVD method, the thermal CVD method and the coating method, since the layer thickness can be controlled accurately at optical level in order to accomplish the objects of the present invention more effectively.

Further, the light-receiving layer in the light-receiving member of the present invention has a multi-layer structure comprising a first layer constituted of an amorphous material containing silicon atoms and germanium atoms and a second layer constituted of an amorphous material containing silicon atoms and exhibiting photoconductivity provided on a substrate successively from the substrate side, and therefore can exhibit very excellent electrical, optical and photoconductive characteristics, dielectric strength as well as good use environmental characteristics.

In particular, when it is applied as a light-receiving member for electrophotography, there is no influence of residual potential on image formation at all, with its electrical properties being stable with high sensitivity and high SN ratio, also excellent in light fatigue resistance and repeated use characteristics, whereby it is possible to obtain repeatedly and stably images of high quality with high density, clear halftone and high resolution.

Further, the light-receiving member of the present invention is high in photosensitivity over the all visible light regions, particularly in photosensitivity to the light of longer wavelength region and is therefore excellent in matching to semiconductor laser and also rapid in light response.

Referring now the drawings, the light-receiving member of the present invention is to be described in detail.

Figure 10:
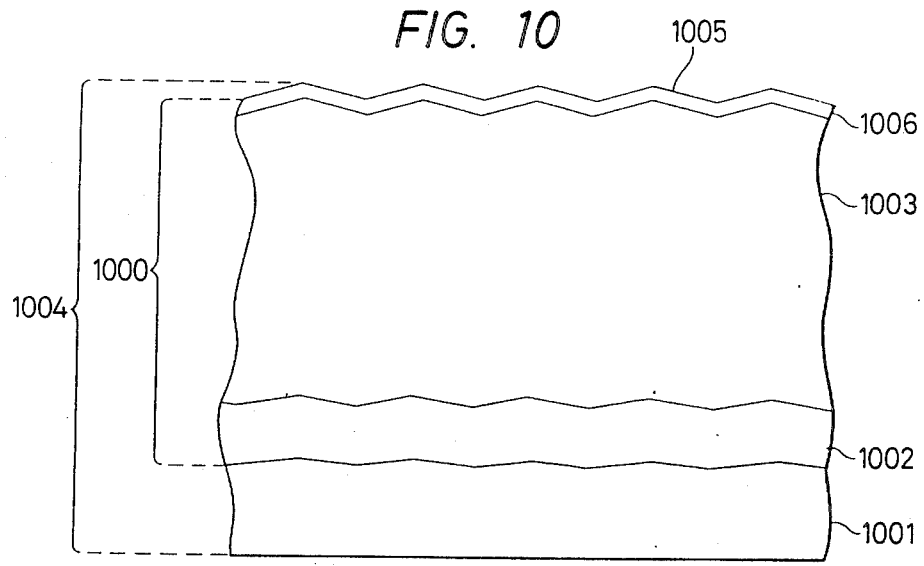
FIGS. 10, 45 and 46 are schematic illustrations of the layer constitution of a light-receiving member.

FIG. 10 is a schematic illustration of construction for explanation of the layer constitution of the light receiving member according to an embodiment of the present invention.

The light receiving member shown in FIG. 10 has a light receiving layer 1000 on a substrate 1001 for light receiving member 1004, the light receiving member having a free surface 1005 on one end surface thereof.

The light receiving layer has a layer structure, having a first layer (G) 1002 constituted of an amorphous material containing silicon atoms and germanium atoms, optionally together with hydrogen atoms and/or halogen atoms (X) (hereinafter abbreviated as A-SiGe(H,X), a second layer (S) 1003 constituted of A-Si optionally containing hydrogen atoms and/or halogen atoms (X) (hereinafter abbreviated as "A-Si(H,X)") and having photoconductivity and a surface layer 1006 having reflection preventive function laminated successively from the substrate 1001 side.

The germanium atoms contained in the first layer (G) 1002 may be contained so that the distribution state may be uniform within the first layer (G), or they can be contained continuously in the layer thickness direction in said first layer (G) 1002, being more enriched at the substrate 1001 side toward the side opposite to the side where said substrate 1001 is provided (the surface 1005 side of the light-receiving layer 1001).

When the distribution state of the germanium atoms contained in the first layer (G) is ununiform in the layer thickness direction, it is desirable that the distribution state should be made uniform in the interplanar direction in parallel to the surface of the substrate.

In the present invention, in the second layer (S) provided on the first layer (G), no germanium atoms is contained and by forming a light-receiving layer to such a layer structure, the light-receiving member obtained can be excellent in photosensitivity to the light with wavelengths of all the regions from relatively shorter wavelength to relatively longer wavelength, including visible light region.

Also, when the distribution state of germanium atoms in the first layer (G) is ununiform in the layer thickness direction, the germanium atoms are distributed continuously throughout the whole layer region while giving a change in distribution concentration C of the germanium atoms in the layer thickness direction which is decreased from the substrate toward the second layer (S), and therefore affinity between the first layer (G) and the second layer (S) is excellent. Also, as described as hereinafter, by extremely increasing the distribution concentration C of germanium atoms at the end portion on the substrate side extremely great, the light on the longer wavelength side which cannot substantially be absorbed by the second layer (S) can be absorbed in the first layer (G) substantially completely, when employing a semiconductor laser, whereby interference by reflection from the substrate surface can be prevented.

Also, in the light-receiving member of the present invention, the respective amorphous materials constituting the first layer (G) and the second layer (S) have the common constituent of silicon atoms, and therefore chemical stability can sufficiently be ensured at the laminated interface.

FIGS. 11 through 19 show typical examples of distribution in the layer thickness direction of germanium atoms contained in the first layer region (G) of the light-receiving member in the present invention.

In FIGS. 11 through 19, the abscissa indicates the content C of germanium atoms and the ordinate the layer thickness of the first layer (G), $t_B$ showing the position of the end surface of the first layer (G) on the substrate side and $t_T$ the position of the end surface of the first layer (G) on the side opposite to the substrate side. That is, layer formation of the first layer (G) containing germanium atoms proceeds from the $t_B$ side toward the $t_T$ side.

Figure 11:
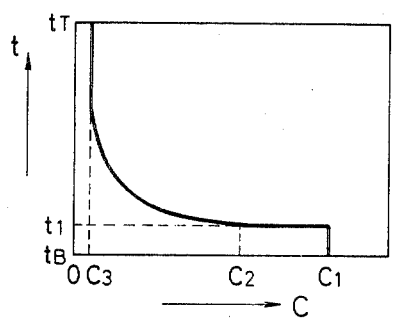
FIGS. 11 through 19 are schematic illustrations of the distribution states of germanium atoms in the first layer.

In FIG. 11, there is shown a first typical embodiment of the depth profile of germanium atoms in the layer thickness direction contained in the first layer (G).

In the embodiment as shown in FIG. 11, from the interface position $t_B$ at which the surface, on which the first layer (G) containing germanium atoms is to be formed, comes into contact with the surface of said first layer (G) to the position $t_1$, germanium atoms are contained in the first layer (G) formed, while the distribution concentration C of germanium atoms taking a constant value of $C_1$, the concentration being gradually decreased from the concentration $C_2$ continuously from the position $t_1$ to the interface position $t_T$. At the interface position $t_T$, the distribution concentration C of germanium atoms is made $C_3$.

Figure 12:
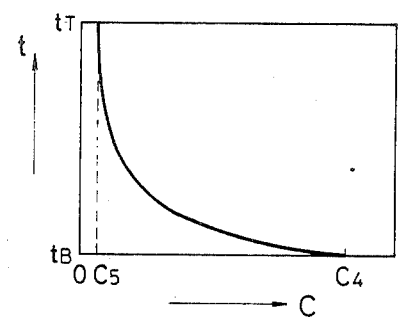

In the embodiment shown in FIG. 12, the distribution concentration C of germanium atoms contained is decreased gradually and continuously from the position $t_B$ to the position $t_T$ from the concentration $C_4$ until it becomes the concentration $C_5$ at the position $t_T$.

Figure 13:
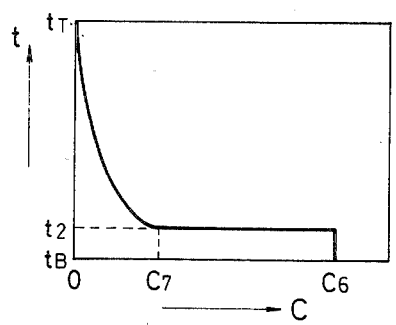

In case of FIG. 13, the distribution concentration C of germanium atoms is made constant as $C_6$ at the position $t_B$, gradually decreased continuously from the position $t_2$ to the position $t_T$, and the concentration C is made substantially zero at the position $t_T$ (substantially zero herein means the content less than the detectable limit).

Figure 14:
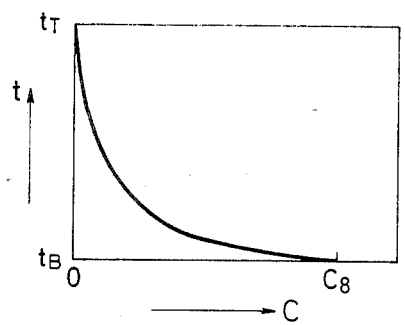

In case of FIG. 14, germanium atoms are decreased gradually and continuously from the position $t_B$ to the position $t_T$ from the concentration $C_8$, until it is made substantially zero at the position $t_T$.

Figure 15:
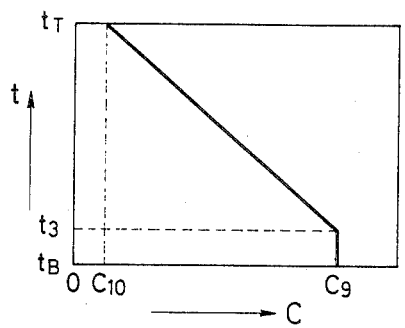

In the embodiment shown in FIG. 15, the distribution concentration C of germanium atoms is constantly $C_9$ between the position $t_B$ and the position $t_3$, and it is made $C_{10}$ at the position $t_T$. Between the position $t_3$ and the position $t_T$, the concentration C is decreased as a first order function from the position $t_3$ to the position $t_T$.

Figure 16:
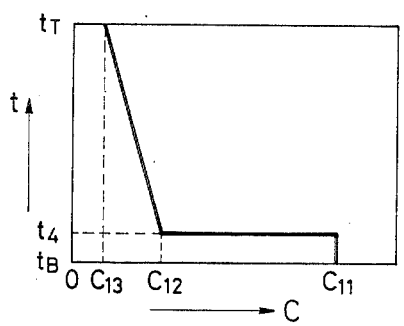

In the embodiment shown in FIG. 16, there is formed a depth profile such that the distribution concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 17:
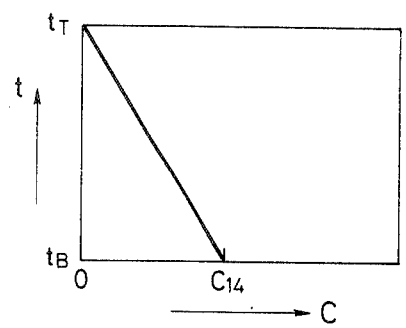

In the embodiment shown in FIG. 17, the distribution concentration C of germanium atoms is decreased as a first order function from the concentration $C_{14}$ to zero from the position $t_B$ to the position $t_T$.

Figure 18:
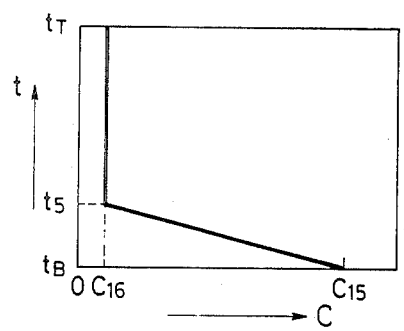

In FIG. 18, there is shown an embodiment, where the distribution concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 19:
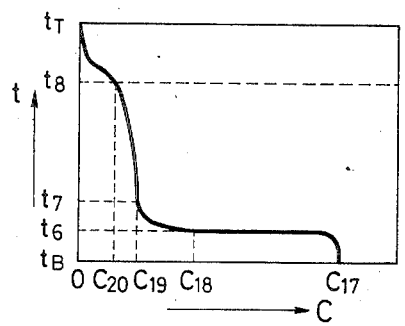

In the embodiment shown in FIG. 19, the distribution concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the first layer (G) in the direction of the layer thickness by referring to FIGS. 11 through 19, when the distribution state of germanium atoms is ununiform in the layer thickness direction, the first layer (G) is provided desirably in a depth profile so as to have a portion enriched in distribution concentration C of germanium atoms on the substrate side and a portion depleted in distribution concentration C of germanium atoms considerably lower than that of the substrate side on the interface $t_T$ side.

The first layer (G) constituting the light-receiving member in the present invention is desired to have a localized region (A) containing germanium atoms at a relatively higher concentration on the substrate side as described above.

In the present invention, the localized region (A), as explained in terms of the symbols shown in FIG. 11 through FIG. 19, may be desirably provided within $5\mu$ from the interface position $t_B$.

In the present invention, the above localized region (A) may be made to be identical with the whole of the layer region ($L_T$) on the interface position $t_B$ to the thickness of $5\mu$, or alternatively a part of the layer region ($L_T$).

It may suitably be determined depending on the characteristics required for the light-receiving layer to be formed, whether the localized region (A) is made a part or whole of the layer region ($L_T$).

The localized region (A) may preferably be formed according to such a layer formation that the maximum value Cmax of the concentrations of germanium atoms in a distribution in the layer thickness direction may preferably be 1000 atomic ppm or more, more preferably 5000 atomic ppm or more, most preferably $1 \times 10^4$ atomic ppm or more based on silicon atoms.

That is, according to the present invention, it is desirable that the layer region (G) containing germanium atoms is formed so that the maximum value Cmax of the distribution concentration C may exist within a layer thickness of $5\mu$ from the substrate side (the layer region within $5\mu$ thickness from $t_B$).

In the present invention, the content of germanium atoms in the first layer (G), which may suitably be determined as desired so as to acheive effectively the objects of the present invention, may preferably be 1 to $9.5 \times 10^5$ atomic ppm, more preferably 100 to $8 \times 10^5$ atomic ppm, most preferably 500 to $7 \times 10^5$ atomic ppm.

In the present invention, the layer thickness of the first layer (G) and the thickness of the second layer (S) are one of the important factors for accomplishing effectively the objects of the present invention, and therefore sufficient care should desirably be paid in designing of the light-receiving member so that desirable characteristics may be imparted to the light-receiving member formed.

In the present invention, the layer thickness $T_B$ of the first layer (G) may preferably be 30 Å to $50\mu$, more preferably 40 Å to $40\mu$, most preferably 50 Å to $30\mu$.

On the other hand, the layer thickness T of the second layer (S) may be preferably 0.5 to $90\mu$, more preferably 1 to $80\mu$, most preferably 2 to $50\mu$.

The sum of the above layer thicknesses T and $T_B$, namely $(T+T_B)$ may be suitably determined as desired in designing of the layers of the light-receiving member, based on the mutual organic relationship between the characteristics required for both layer regions and the characteristics required for the whole light-receiving layer.

In the light-receiving member of the present invention, the numerical range for the above $(T_B+T)$ may generally be from 1 to $100\mu$, preferably 1 to $80\mu$, most preferably 2 to $50\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer (G) is $1 \times 10^5$ atomic ppm or more, the layer thickness $T_B$ should desirably be made considerably thinner, preferably 30μ or less, more preferably 25μ or less, most preferably 20μ or less.

In the present invention, illustrative of halogen atoms (X), which may optionally be incorporated in the first layer (G) and the second layer (S) constituting the light-receiving layer, are fluorine, chlorine, bormine and iodine, particularly preferably fluorine and chlorine.

In the present invention, formation of the first layer (G) constituted of A-SiGe(H,X) may be conducted according to the vacuum deposition method utilizing a discharging phenomenon, such as glow discharge method, sputtering method or ion-plating method. For example, for formation of the first layer (G) constituted of A-SiGe(H,X) according to the glow discharge method, the basic procedure comprises introducing a starting gas for Si supply capable of supplying silicon atoms (Si), a starting gas for Ge supply capable of supplying germanium atoms (Ge) optionally together with a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position while controlling the depth profile of germanium atoms according to a desired rate of change curve to form a layer constituent of A-SiGe (H,X). Alternatively, for formation according to the sputtering method, when carrying out sputtering by use of two sheets of targets of a target constituted of Si and a target constituted of Ge, or a target of a mixture of Si and Ge in an atmosphere of an inert gas such as Ar, He, etc. or a gas mixture based on these gases, a gas for introduction of hydrogen atoms (H) and/or a gas for introduction of halogen atoms (X) may be introduced, if desired, into a deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred because of easiness in handling during layer formation and high efficiency for supplying Si.

As the substances which can be used as the starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred because of easiness in handling during layer formation and high efficiency for supplying Ge.

Effective starting gases for introduction of halogen atoms to be used in the present invention may include a large number of halogenic compounds, as exemplified preferably by halogenic gases, halides, interhalogen compounds, or gaseous or gasifiable halogenic compounds such as silane derivatives substituted with halogens.

Further, there may also be included gaseous or gasifiable hydrogenated silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the light-receiving member of the present invention is formed according to the glow discharge method by employment of such a silicon compound containing halogen atoms, it is possible to form the first layer (G) constituted of A-SiGe containing halogen atoms on a desired substrate without use of a hydrogenated silicon gas as the starting gas capable of supplying Si together with the starting gas for Ge supply.

In the case of forming the first layer (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer (G) and exciting glow discharge to form a plasma atmosphere of these gases, whereby the first layer (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

For formation of the first layer (G) comprising A-SiGe(H,X) according to the reactive sputtering method or the ion plating method, for example, in the case of the sputtering method, two sheets of a target of Si and a target of Ge or a target of Si and Ge is employed and subjected to sputtering in a desired gas plasma atmosphere. In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $siH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing halogen atoms can preferably be used as the starting material for introduction of halogens, because hydrogen atoms, which are very effective for controlling electrical or photoelectric characteristics, can be introduced into the layer simultaneously with introduction of halogen atoms during formation of the first layer (G).

For introducing hydrogen atoms structurally into the first layer (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer (G) constituting the light-receiving layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer (G), for example, the substrate temperature and/or the amount of the starting materials used for incorporation of hydrogen atoms (H) or halogen atoms (X) to be introduced into the deposition device system, discharging power, etc. may be controlled.

In the present invention, for formation of the second layer (S) constituted of A-Si(H,X), the starting materials (I) for formation of the first layer (G), from which the starting materials for the starting gas for supplying Ge are omitted, are used as the starting materials (II) for formation of the second layer (S), and layer formation can be effected following the same procedure and conditions as in formation of the first layer (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer (S) constituted of A-Si(H,X) according to the glow discharge method, the basic procedure comprises introducing a starting gas for Si supply capable of supplying silicon atoms (Si) as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising A-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer (S) constituting the light-receiving layer to be formed should preferably be 1 to 40 atomic %, more preferably 5 to 30 atomic %, most preferably 5 to 25 atomic %.

In the light-receiving member of the present invention, for the purpose of obtaining higher photosensitivity and dark resistance, and further for the purpose of improving adhesion between the substrate and the light-receiving layer, at least one kind of atoms selected from oxygen atoms, carbon atoms and nitrogen atoms is contained in the light-receiving layer in either uniform or ununiform distribution state in the layer thickness direction. Such atoms (OCN) to be contained in the light-receiving layer may be contained therein throughout the whole layer region of the light-receiving layer or localized by being contained in a part of the layer region of the light-receiving layer.

The distribution concentration C (OCN) of the atoms (OCN) should desirably be uniform within the plane parallel to the surface of the substrate.

In the present invention, the layer region (OCN) where atoms (OCN) are contained is provided so as to occupy the whole layer region of the light-receiving layer when it is primarily intended to improve photosensitivity and dark resistance, while it is provided so as to occupy the end portion layer region on the substrate side of the light-receving layer when it is primarily intended to strengthen adhesion between the substrate and the light-receiving layer.

In the former case, the content of atoms (OCN) contained in the layer region (OCN) should desirably be made relatively smaller in order to maintain high photosensitivity, while in the latter case relatively larger in order to ensure reinforcement of adhesion to the substrate.

In the present invention, the content of the atoms (OCN) to be contained in the layer region (OCN) provided in the light-receiving layer can be selected suitably in organic relationship with the characteristics required for the layer region (OCN) itself, or with the characteristic at the contacted interface with the substrate when the said layer region (OCN) is provided in direct contact with the substrate, etc.

When other layer regions are to be provided in direct contact with the layer region (OCN), the content of the atoms (OCN) may suitably be selected with due considerations about the characteristics of said other layer regions or the characteristics at the contacted interface with said other layer regions.

The amount of the atoms (OCN) contained in the layer region (OCN) may be determined as desired depending on the characteristics required for the light-receiving member to be formed, but it may preferably be 0.001 to 50 atomic %, more preferably 0.002 to 40 atomic %, most preferably 0.003 to 30 atomic %.

In the present invention, when the layer region (OCN) occupies the whole region of the light-receiving layer or, although not occupying the whole region, the proportion of the layer thickness $T_O$ of the layer region (OCN) occupied in the layer thickness T of the light-receiving layer is sufficiently large, the upper limit of the content of the atoms (OCN) contained in the layer region (OCN) should desirably be made sufficiently smaller than the value as specified above.

In the case of the present invention, when the proportion of the layer thickness $T_O$ of the layer region (OCN) occupied relative to the layer thickness T of the light-receiving layer is 2/5 or higher, the upper limit of the atoms (OCN) contained in the layer region (OCN) should desirably be made 30 atomic % or less, more preferably 20 atomic % or less, most preferably 10 atomic % or less.

According to a preferred embodiment of the present invention, it is desirable that the atoms (OCN) should be contained in at least the above first layer to be provided directly on the substrate. In short, by incorporating the atoms (OCN) at the end portion layer region on the substrate side in the light-receiving layer, it is possible to effect reinforcement of adhesion between the substrate and the light-receiving layer.

Further, in the case of nitrogen atoms, for example, under the co-presence with boron atoms, improvement of dark resistance and improvement of photosensitivity can further be ensured, and therefore they should preferably be contained in a desired amount in the light-receiving layer.

Plural kinds of these atoms (OCN) may also be contained in the light-receiving layer. For example, oxygen atoms may be contained in the first layer, nitrogen atoms in the second layer, or alternatively oxygen atoms and nitrogen atoms may be permitted to be co-present in the same layer region.

FIGS. 36 through 44 show typical examples of ununiform depth profiles in the layer thickness direction of the atoms (OCN) contained in the layer region (OCN) in the light-receiving member of the present invention.

In FIGS. 36 through 44 the abscissa indicates the distribution concentration C of the atoms (OCN), and the ordinate the layer thickness of the layer region (OCN), $t_B$ showing the position of the end surface of the layer region on the substrate side, while $t_T$ shows the position of the end face of the layer region (OCN) opposite to the substrate side. Thus, layer formation of the layer region (OCN) containing the atoms (OCN) proceeds from the $t_B$ side toward the $t_T$ side.

Figure 36:
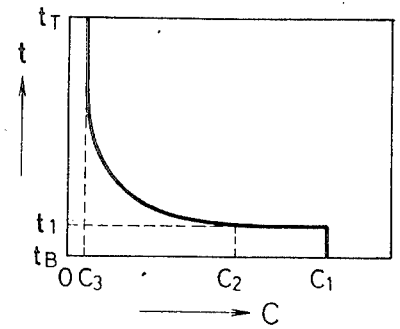
FIGS. 36 through 44 are schematic illustrations of the distribution state of the atoms (OCN) in the layer region (OCN).

FIG. 36 shows a first typical embodiment of the depth profile in the layer thickness direction of the atoms (OCN) contained in the layer region (OCN).

In the embodiment shown in FIG. 36, from the interface position $t_B$ where the surface on which the layer region (OCN) containing the atoms (OCN) is formed contacts the surface of said layer region (OCN) to the position of $t_1$, the atoms (OCN) are contained in the layer region (OCN) to be formed while the distribution concentration of the atoms (OCN) taking a constant value of $C_1$, said distribution concentration being gradually continuously reduced from $C_2$ from the position $t_1$ to the interface position $t_T$, until at the interface position $t_T$, the distribution concentration C is made $C_3$.

Figure 37:
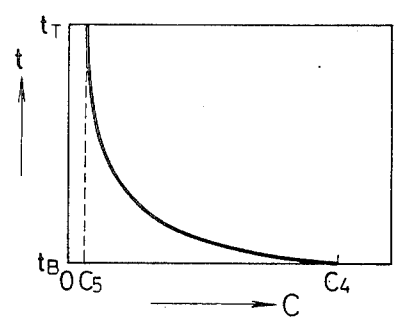

In the embodiment shown in FIG. 37, the distribution concentration C of the atoms (OCN) contained is reduced gradually continuously from the concentration $C_4$ from the position $t_B$ to the position $t_T$, at which it becomes the concentration $C_5$.

Figure 38:
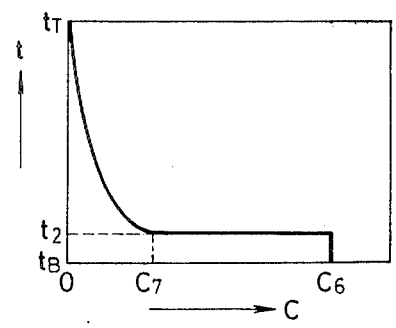

In the case of FIG. 38, from the position $t_B$ to the position $t_2$, the distribution concentration of the atoms (OCN) is made constantly at $C_6$, reduced gradually continuously from the concentration $C_7$ between the position $t_2$ and the position $t_T$, until at the position $t_T$, the distribution concentration C is made substantially zero (here substantially zero means the case of less than the detectable level).

Figure 39:
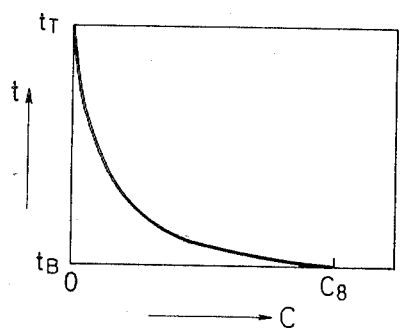

In the case of FIG. 39, the distribution concentration C of the atoms (OCN) is reduced gradually continuously from the concentration $C_8$ from the position $t_B$ up to the position $t_T$, to be made substantially zero at the position $t_T$.

Figure 40:
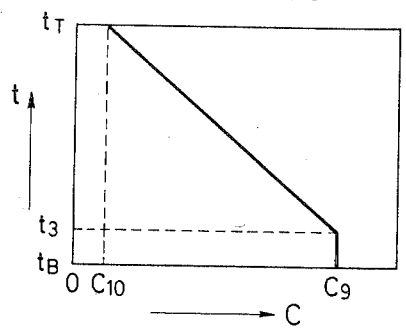

In the embodiment shown in FIG. 40, the distribution concentration C of the atoms (OCN) is made constantly $C_9$ between the position $t_B$ and the position $t_3$, and it is made the concentration $C_{10}$ at the position $t_T$. Between the position $t_3$ and the position $t_T$, the distribution concentration C is reduced from the concentration $C_9$ to substantially zero as a first order function from the position $t_3$ to the position $t_T$.

Figure 41:
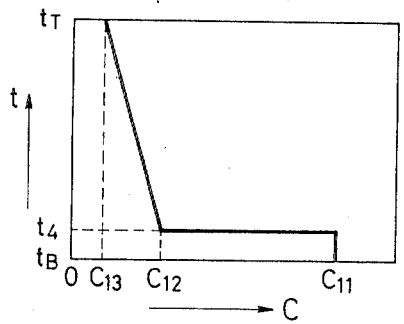

In the embodiment shown in FIG. 41, from the position $t_B$ to the position $t_4$, the distribution concentration C takes a constant value of $C_{11}$, while the distribution state is changed to a first order function in which the concentration is decreased from the concentration $C_{12}$ to the concentration $C_{13}$ from the position $t_4$ to the position $t_T$, and the concentration C is made substantially zero at the position $t_T$.

Figure 42:
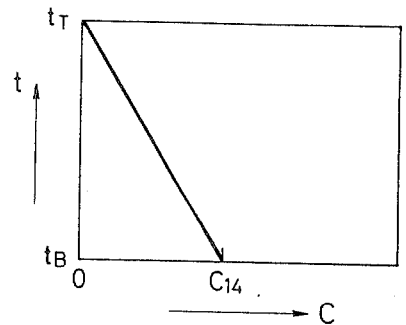

In the embodiment shown in FIG. 42, from the position $t_B$ to the position $t_T$, the distribution concentration C of the atoms (OCN) is reduced as a first order function from the concentration $C_{14}$ to substantially zero.

Figure 43:
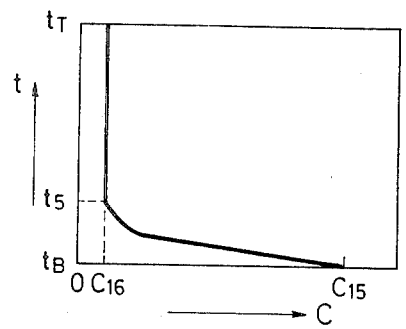

In FIG. 43, there is shown an embodiment, wherein from the position $t_B$ to the position $t_5$, the distribution concentration of the atoms (OCN) is reduced approximately as a first order function from the concentration $C_{15}$ to $C_{16}$, and it is made constantly $C_{16}$ between the position $t_5$ and the position $t_T$.

Figure 44:
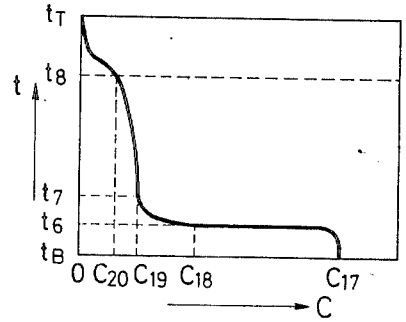

In the embodiment shown in FIG. 44, the distribution concentration C of the atoms (OCN) is $C_{17}$ at the position $t_B$, and, toward the position $t_6$, this $C_{17}$ is initially reduced gradually and then abruptly reduced near the position $t_6$, until it is made the concentration $C_{18}$ at the position $t_6$.

Between the position $t_6$ and the position $t_7$, the concentration is initially reduced abruptly and thereafter gently gradually reduced to become $C_{19}$ at the position $t_7$, and between the position $t_7$ and the position $t_8$, it is reduced very gradually to become $C_{20}$ at the position $t_8$. Between the position $t_8$ and the position $t_T$, the concentration is reduced from the concentration $C_{20}$ to substantially zero along a curve with a shape as shown in the Figure.

As described above about some typical examples of depth profiles in the layer thickness direction of the atoms (OCN) contained in the layer region (OCN) by referring to FIGS. 36 through 44, it is desirable in the present invention that, when the atoms (OCN) are to be contained ununiformly in the layer region (OCN), the atoms (OCN) should be distributed in the layer region (OCN) with higher concentration on the substrate side, while having a portion considerably depleted in concentration on the interface $t_T$ side as compared with the substrate side.

The layer region (OCN) containing atoms (OCN) should desirably be provided so as to have a localized region (B) containing the atoms (OCN) at a relatively higher concentration on the substrate side as described above, and in this case, adhesion between the substrate and the light-receiving layer can be further improved.

The above localized region (B) should desirably be provided within 5μ from the interface position $t_B$, as explained in terms of the symbols indicated in FIGS. 36 through 44.

In the present invention, the above localized region (B) may be made the whole of the layer region ($L_T$) from the interface position $t_B$ to $5\mu$ thickness or a part of the layer region ($L_T$).

It may suitably be determined depending on the characteristics required for the light-receiving layer to be formed whether the localized region (B) is made a part or the whole of the layer region ($L_T$).

The localized region (B) should preferably be formed to have a depth profile in the layer thickness direction such that the maximum value Cmax of the distribution concentration of the atoms (OCN) may preferably be 500 atomic ppm or more, more preferably 800 atomic ppm or more, most preferably 1000 atomic ppm or more.

In other words, in the present invention, the layer region (OCN) containing the atoms (OCN) should preferably be formed so that the maximum value Cmax of the distribution concentration C may exist within $5\mu$ layer thickness from the substrate side (in the layer region with $5\mu$ thickness from $t_B$).

In the present invention, when the layer region (OCN) is provided so as to occupy a part of the layer region of the light-receiving layer, the depth profile of the atoms (OCN) should desirably be formed so that the refractive index may be changed moderately at the interface between the layer region (OCN) and other layer regions.

By doing so, reflection of the light incident upon the light-receiving layer from the interface between contacted interfaces can be inhibited, whereby appearance of interference fringe pattern can more effectively be prevented.

It is also preferred that the distribution concentration C of the atoms (OCN) in the layer region (OCN) should be changed along a line which is changed continuously and moderately, in order to give smooth refractive index change.

In this regard, it is preferred that the atoms (OCN) should be contained in the layer region (OCN) so that the depth profiles as shown, for example, in FIGS. 36 through 39, FIG. 42 and FIG. 44 may be assumed.

In the present invention, for provision of a layer region (OCN) containing the atoms (OCN) in the light-receiving layer, a starting material for introduction of the atoms (OCN) may be used together with the starting material for formation of the light-receiving layer during formation of the light-receiving layer and incorporated in the layer formed while controlling its amount.

When the glow discharge method is employed for formation of the layer region (OCN), a starting material for introduction of the atoms (OCN) is added to the material selected as desired from the starting materials for formation of the light-receiving layer as described above. For such a starting material for introduction of the atoms (OCN), there may be employed most of gaseous or gasified gasifiable substances containing at least the atoms (OCN) as the constituent atoms.

More specifically, there may be included, for example, oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$); lower siloxanes containing silicon atom (Si), oxygen atom (O) and hydrogen atom (H) as constituent atoms, such as disiloxane ($H_3SiOSiH_3$), trisiloxane ($H_3SiOSiH_2OSiH_3$), and the like; saturated hydrocarbons having 1-5 carbon atoms such as methane ($CH_4$), ethane ($C_2H_6$), propane ($C_3H_8$), n-butane (n-$C_4H_{10}$), pentane ($C_5H_{12}$); ethylenic hydrocarbons having 2-5 carbon atoms such as ethylene ($C_2H_4$), propylene ($C_3H_6$), butene-1 ($C_4H_8$), butene-2 ($C_4H_8$), isobutylene ($C_4H_8$), pentene ($C_5H_{10}$); acetylenic hydrocarbons having 2-4 carbon atoms such as acetylene ($C_2H_2$), methyl acetyllene ($C_3H_4$), butyne ($C_4H_6$); and the like; nitrogen ($N_2$), ammonia ($NH_3$), hydrazine ($H_2NNH_2$), hydrogen azide ($HN_3$), ammonium azide ($NH_4N_3$), nitrogen trifluoride ($F_3N$), nitrogen tetrafluoride ($F_4N$) and so on.

In the case of the sputtering method, as the starting material for introduction of the atoms (OCN), there may also be employed solid starting materials such as $SiO_2$, $Si_3N_4$ and carbon black in addition to those gasifiable as enumerated for the glow discharge method. These can be used in the form of a target for sputtering together with the target of Si, etc.

In the present invention, when forming a layer region (OCN) containing the atoms (OCN) during formation of the light-receiving layer, formation of the layer region (OCN) having a desired depth profile in the direction of layer thickness formed by varying the distribution concentration C of the atoms (OCN) contained in said layer region (OCN) may be conducted in the case of glow discharge by introducing a starting gas for introduction of the atoms (OCN) the distribution concentration C of which is to be varied into a deposition chamber, while varying suitably its gas flow rate according to a desired change rate curve.

For example, by the manual method or any other method conventionally used such as an externally driven motor, etc., the opening of a certain needle valve provided in the course of the gas flow channel system may be gradually varied. During this operation, the rate of variation is not necessarily required to be linear, but the flow rate may be controlled according to a variation rate curve previously designed by means of, for example, a microcomputer to give a desired content curve.

When the layer region (OCN) is formed according to the sputtering method, formation of a desired depth profile of the atoms (OCN) in the layer thickness direction by varying the distribution concentration C of the atoms (OCN) may be performed first similarly as in the case of the glow discharge method by employing a starting material for introduction of the atoms (OCN) under gaseous state and varying suitably as desired the gas flow rate of said gas when introduced into the deposition chamber. Secondly, formation of such a depth profile can also be achieved by previously changing the composition of a target for sputtering. For example, when a target comprising a mixture of Si and $SiO_2$ is to be used, the mixing ratio of Si to $SiO_2$ may be varied in the direction of layer thickness of the target.

In the light-receiving member 1004, by incorporating a substance (C) for controlling conductivity in at least the first layer (G) 1002 and/or the second layer (S) 1003, desired conductivity characteristics can be given to the layer containing said substance (C).

In this case, the substance (C) for controlling conductivity may be contained throughout the whole layer region in the layer containing the substance (C) or contained locally in a part of the layer region of the layer containing the substance (C).

Also, in the layer region (PN) containing said substance (C), the distribution state of said substance (C) in the layer thickness direction may be either uniform or nonuniform, but desirably be made uniform within the plane in parallel to the substrate surface. When the distribution state of the substance (C) is nonuniform in the layer thickness direction, and when the substance (C) is to be incorporated in the whole layer region of the first layer (G), said substance (C) is contained in the first layer (G) so that it may be more enriched on the substrate side of the first layer (G).

Thus, in the layer region (PN), when the distribution concentration in the layer thickness direction of the above substance (C) is made nonuniform, optical and electrical junction at the contacted interface with other layers can further be improved.

In the present invention, when the substance (C) for controlling conductivity is incorporated in the first layer (G) so as to be locally present in a part of the layer region, the layer region (PN) in which the substance (C) is to be contained is provided as an end portion layer region of the first layer (G), which is to be determined case by case suitably as desired depending on.

In the present invention, when the above substance (C) is to be incorporated in the second layer (S), it is desirable to incorporate the substance (C) in the layer region including at least the contacted interface with the first layer (G).

When the substance (C) for controlling conductivity is to be incorporated in both the first layer (G) and the second layer (S), it is desirable that the layer region containing the substance (C) in the first layer (G) and the layer region containing the substance (C) in the second layer (S) may contact each other.

Also, the above substance (C) contained in the first layer (G) may be either the same as or different from that contained in the second layer (S), and their contents may be either the same or different.

However, in the present invention, when the above substance (C) is of the same kind in the both layers, it is preferred to make the content in the first layer (G) sufficiently greater, or alternatively to incorporate substances (C) with different electrical characteristics in respective layers desired.

In the present invention, by incorporating a substance (C) for controlling conductivity in at least the first layer (G) and/or the second layer (S) constituting the light-receiving layer, conductivity of the layer region containing the substance (C) [which may be either a part or the whole of the layer region of the first layer (G) and/or the second layer (S)] can be controlled as desired. As a substance (C) for controlling conductivity characteristics, there may be mentioned so called impurities in the field of semiconductors. In the present invention, there may be included p-type impurities giving p-type conductivity characteristics and n-type impurities and/or giving n-type conductivity characteristics to A-Si(H,X) and/or A-SiGe(H,X) constituting the light receiving layer to be formed.

More specifically, there may be mentioned as p-type impurities atoms belonging to the group III of the periodic table (Group III atoms), such as B (boron), Al (aluminum), Ga(gallium), In(indium), Tl(thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) may be suitably be determined depending on the conductivity required for said layer region (PN), or when said layer region (PN) is provided in direct contact with the substrate, the organic relationships such as relation with the characteristics at the contacted interface with the substrate, etc.

Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the light-receiving layer can be effectively inhibited when the free surface of the light-receiving layer is subjected to the charging treatment to $\oplus$ polarity. On the other hand, when the substance to be incorporated is a n-type impurity, migration of positive holes injected from the substrate side into the light-receiving layer may be effectively inhibited when the free surface of the light-receiving layer is subjected to the charging treatment to $\ominus$ polarity.

In the case as mentioned above, the layer region (Z) at the portion excluding the above layer region (PN) under the basic constitution of the present invention as described above may contain a substance for controlling conductivity of the other polarity, or a substance for controlling conductivity having characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other, thus providing a so called depletion layer at said contact region.

In short, for example, a layer containing the aforesaid p-type impurity and a layer region containing the aforesaid n-type impurity are provided in the light-receiving layer in direct contact with each other to form the so called p-n junction, whereby a depletion layer can be provided.

FIGS. 27 through 35 show typical examples of the depth profiles in the layer thickness direction of the substance (C) contained in the layer region (PN) in the light-receiving layer of the present invention. In each of these Figures, representations of layer thickness and concentration are shown in rather exaggerated forms for illustrative purpose, since the difference between respective Figures will be indistinct if represented by the real values as such, and it should be understood that these Figures are schematic in nature. As practical distribution, the values of ti ($1<i<9$) or Ci ($1<i<17$) should be chosen so as to obtain desired distribution concentration lines, or values obtained by multiplying the distribution curve as a whole with an appropriate coefficient should be used.

In FIGS. 27 through 35, the abscissa shows the distribution concentration C of the substance (C), and the ordinate the layer thickness of the layer region (PN), $t_B$ indicating the position of the end surface on the substrate side of the layer region (G) and $t_T$ the position of the end surface on the side opposite to the substrate side. Thus, layer formation of the layer region (PN) containing the substance (C) proceeds from the $t_B$ side toward the $t_T$ side.

Figure 27:
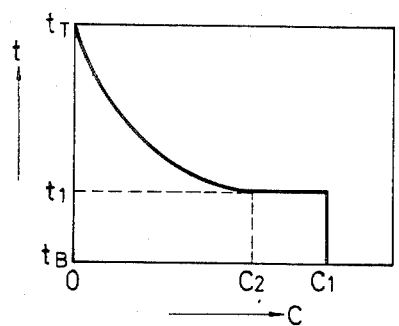
FIGS. 27 through 35 are schematic illustrations of the distribution state of the atoms (OCN) in the layer region (OCN).

FIG. 27 shows a first typical example of the depth profile of the substance (C) in the layer thickness direction contained in the layer region (PN).

In the embodiment shown in FIG. 27, from the interface position $t_B$ where the surface at which the layer region (PN) containing the substance (C) contacts the surface of said layer (G) to the position $t_1$, the substance (C) is contained in the layer region (PN) formed while the distribution concentration C of the substance (C) taking a constant value of $C_1$, and the concentration is gradually decreased from the concentration $C_2$ continuously from the position $t_1$ to the interface position $t_T$. At the interface position $t_T$, the distribution concentration C of the substance (C) is made substantially zero (here substantially zero means the case of less than detectable limit).

Figure 28:
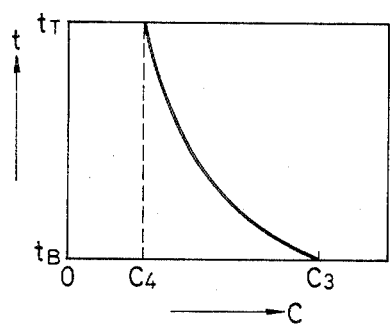

In the embodiment shown in FIG. 28, the distribution concentration C of the substance (C) contained is decreased from the position $t_B$ to the position $t_T$ gradually and continuously from the concentration $C_3$ to the concentration $C_4$ at $t_T$.

Figure 29:
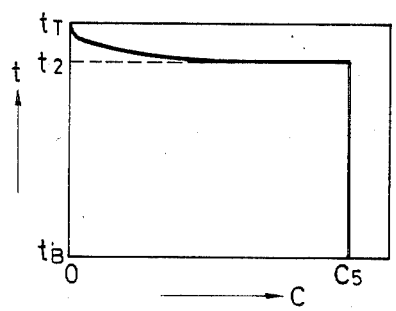

In the case of FIG. 29, from the position $t_B$ to the position $t_2$, the distribution concentration C of the substance (C) is made constantly at $C_5$, while between the position $t_2$ and the position $t_T$, it is gradually and continuously decreased, until the distribution concentration is made substantially zero at the position $t_T$.

Figure 30:
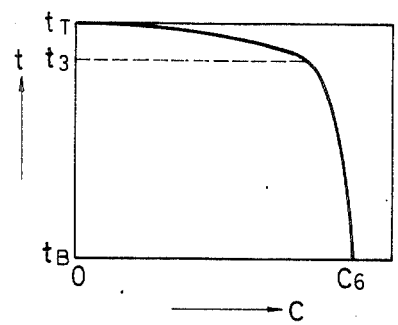

In the case of FIG. 30, the distribution concentration C of the substance (C) is first decreased continuously and gradually from the concentration $C_6$ from the position $t_B$ to the position $t_3$, from where it is abruptly decreased to substantially zero at the position $t_T$.

Figure 31:
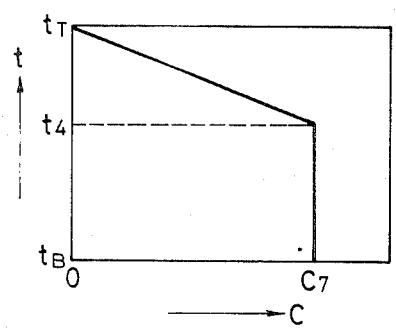

In the embodiment shown in FIG. 31, the distribution concentration of the substance (C) is constantly $C_7$ between the position $t_B$ and the position $t_T$, and the distribution concentration is made zero at the position $t_T$. Between the $t_4$ and the position $t_T$, the distribution concentration C is decreased as a first order function from the position $t_4$ to the position $t_T$.

Figure 32:
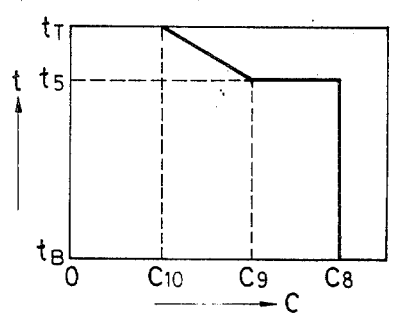

In the embodiment shown in FIG. 32, the distribution concentration C takes a constant value of $C_8$ from the position $t_B$ to the position $t_5$, while it was decreased as a first order function from the concentration $C_9$ to the concentration $C_{10}$ from the position $t_5$ to the position $t_T$.

Figure 33:
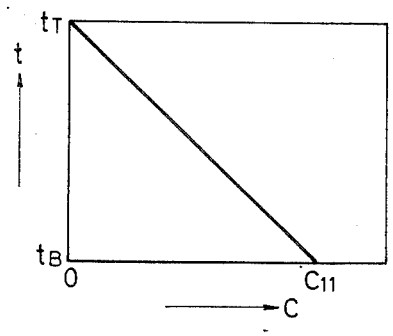

In the embodiment shown in FIG. 33, from the position $t_B$ to the position $t_T$, the distribution concentration C of the substance (C) is decreased continuously as a first order function from the concentration $C_{11}$ to zero.

Figure 34:
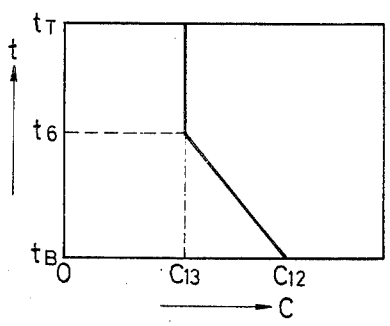

In FIG. 34, there is shown an embodiment, in which, from the position $t_B$ to the position $t_6$, the distribution concentration C of the substance C is decreased as a first order function from the concentration $C_{12}$ to the concentration $C_{13}$, and the concentration is made a constant value of $C_{13}$ between the position $t_6$ and the position $t_T$.

Figure 35:
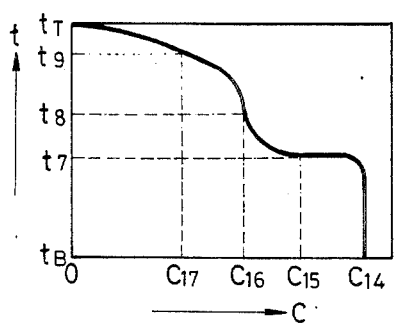

In the embodiment shown in FIG. 35, the distribution concentration C of the substance (C) is $C_{14}$ at the position $t_B$, which is gradually decreased initially from $C_{14}$ and then abruptly near the position $t_7$, where it is made $C_{15}$ at the position $t_7$.

Between the position $t_7$ and the position $t_8$, the concentration is initially abruptly decreased and then moderately gradually, until it becomes $C_{16}$ at the position $t_8$, and between the position $t_8$ and the position $t_9$, the concentration is gradually decreased to reach $C_{17}$ at the position $t_9$. Between the position $t_9$ and the position $t_T$, the concentration is decreased from $C_{17}$, following the curve with a shape as shown in Figure, to substantially zero.

As described above by referring to some typical examples of depth profiles in the layer thickness direction of the substance (C) contained in the layer region (PN) shown FIGS. 27 through 35, it is desirable in the present invention that a depth profile of the substance (C) should be provided in the layer region (PN) so as to have a portion with relatively higher distribution concentration C of the substance (C) on the substrate side, while having a portion on the interface $t_T$ side where said distribution concentration is made considerably lower as compared with the substrate side.

The layer region (PN) constituting the light-receiving member in the present invention is desired to have a localized region (B) containing the substance (C) preferably at a relatively higher concentration on the substrate side as described above.

In the present invention, the localized region (B) as explained in terms of the symbols shown in FIGS. 27 through 35, may be desirably provided within $5\mu$ from the interface position $t_B$.

In the present invention, the above localized region (B) may be made to be identical with the whole of the layer region (L) from the interface position $t_B$ to the thickness of $5\mu$, or alternatively a part of the layer region (L).

It may suitably be determined depending on the characteristics required for the light-receiving layer to be formed whether the localized region (B) should be made a part or the whole of the layer region (L).

For formation of the layer region (PN) containing the aforesaid substance (C) by incorporating a substance (C) for controlling conductivity such as the group III atoms or the group V atoms structurally into the light-receiving layer, a starting material for introduction of the group III atoms or a starting material for introduction of the group V atoms may be introduced under gaseous state into a deposition chamber together with other starting materials for formation of the respective layers during layer formation.

As the starting material which can be used for introduction of the group III atoms, it is desirable to use those which are gaseous at room temperature under atmospheric pressure or can readily be gasified under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydrides such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $SbCl$, $BiH_3$, $BiCl_3$, $BiBr_3$ and the like effectively as the starting material for introduction of the group V atoms.

The substrate to be used in the present invention may be either electroconductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light-receiving member 1004 in FIG. 10 is to be used as the light-receiving member for electrophotography, it may desirably be formed into an endless belt or a cylinder for use in continuous high speed copying. The substrate may have a thickness, which is conveniently determined so that the light-receiving member as desired may be formed. When the light-receiving member is required to have a flexibility, the substrate is made as thin as possible, so far as the function of a support can be exhibited. However, in such a case, the thickness is generally 10μ or more from the points of fabrication and handling of the substrate as well as its mechanical strength.

Figure 26:
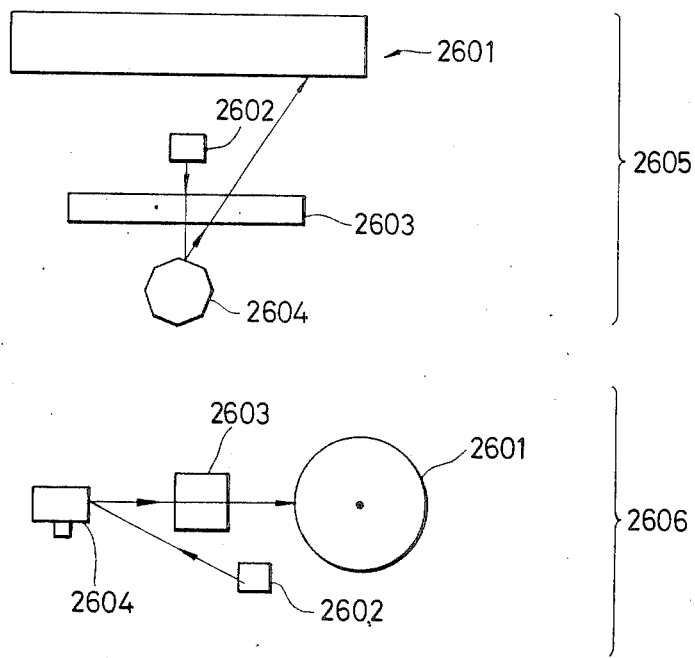
FIG. 26 is a schematic illustration of the image exposure device employed in Examples.

FIG. 26 is a schematic illustration of an example of the image forming device employing electrophotographic technique in which the light receiving member of the present invention is mounted.

In this Figure, 2601 is a drum-shaped light receiving member of the present invention prepared for use in electrophotography, 2602 is a semiconductor laser device which is the light source for apply exposure on the light receiving member 2601 corresponding to the information to be recorded, 2603 is a fθ lens, 2604 is a polygon-mirror, 2605 shows the plane view of the device and 2606 shows the side view of the device.

In FIG. 26, devices to be generally employed for practicing electrophotographic image formation, such as developing device, transfer device, fixing device, cleaning device, etc., are not shown.

Next, an example of the process for producing the light-receiving member of this invention is to be briefly described.

Figure 20:
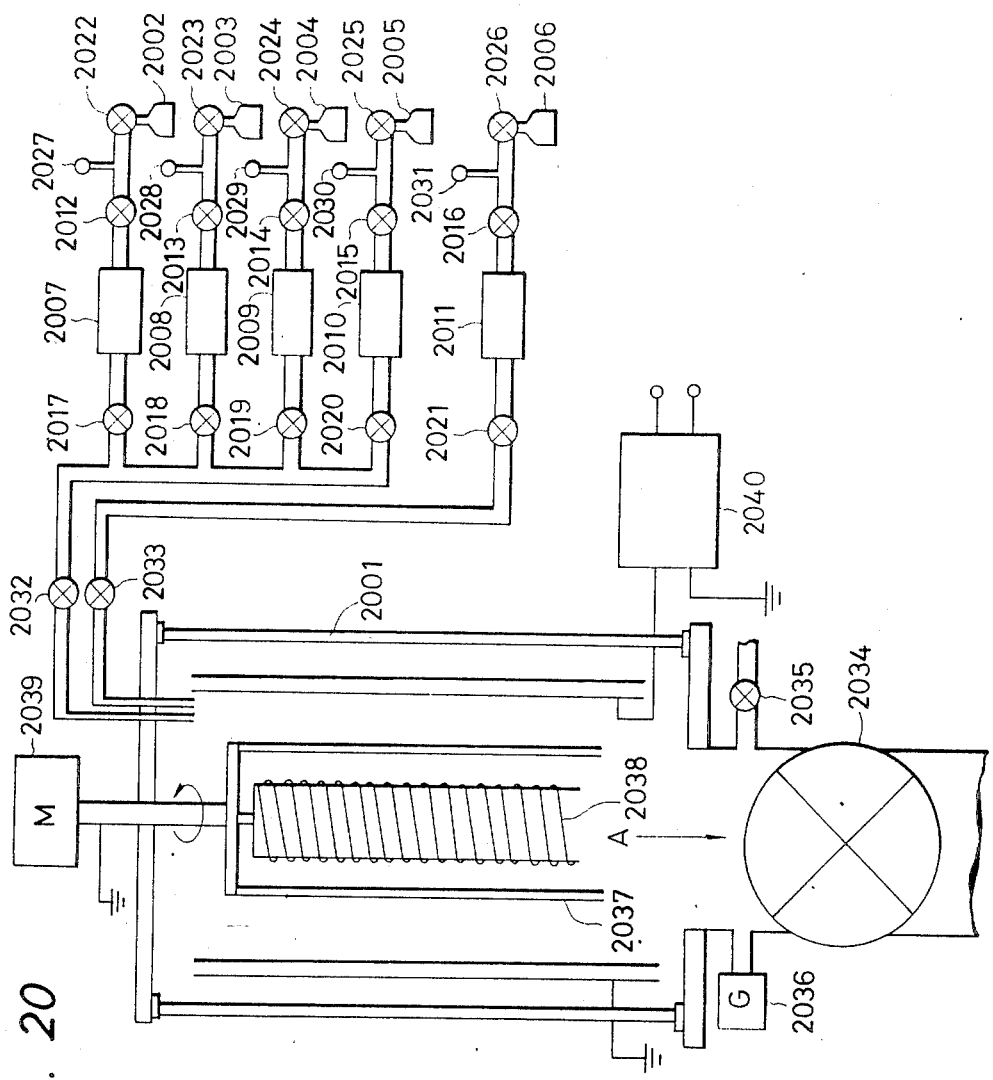
FIG. 20 is a schematic illustration of the vacuum deposition device for preparation of the light-receiving members employed in Examples.

FIG. 20 shows one example of a device for producing a light-receiving member.

In the gas bombs 2002 to 2006, there are hermetically contained starting gases for formation of the light receiving member of the present invention. For example, 2002 is a bomb containing $SiH_4$ gas (purity 99.999%, hereinafter abbreviated as $SiH_4$), 2003 is a bomb containing $GeH_4$ gas (purity 99.999%, hereinafter abbreviated as $GeH_4$), 2004 is a bomb containing $SiF_4$ gas (purity 99.99%, hereinafter abbreviated as $SiF_4$), 2005 is bomb containing $B_2H_6$ gas diluted with $H_2$ (purity 99.999%, hereinafter abbreviated as $B_2H_6/H_2$) and 2006 is a bomb containing $H_2$ gas (purity: 99.999%).

For allowing these gases to flow into the reaction chamber 2001, on confirmation of the valves 2022 to 2026 of the gas bombs 2002 to 2006 and the leak valve 2035 to be closed, and the inflow valves 2012 to 2016, the outflow valves 2017 to 2021 and the auxiliary valves 2032 and 2033 to be opened, the main valve 2034 is first opened to evacuate the reaction chamber 2001 and the gas pipelines. As the next step, when the reading on the vacuum indicator 2036 becomes above $5\times10^{-6}$ Torr, the auxiliary valves 2032, 2033 and the outflow valves 2017 to 2021 are closed.

Referring now to an example of forming a light receiving layer on the cylindrical substrate 2037, $SiH_4$ gas from the gas bomb 2002, $GeH_4$ gas from the gas bomb 2003, $B_2H_6/H_2$ gas from the gas bomb 2005 and $H_2$ gas from the gas bomb 2006 are permitted to flow into the mass-flow controllers 2007, 2008, 2010 and 2011, respectively, by opening the valves 2022, 2023, 2025 and 2026 and controlling the pressures at the output pressure gauges 2027, 2028, 2030 and 2031 to 1 Kg/cm² and opening gradually the inflow valves, 2012, 2013, 2015 and 2016, respectively. Subsequently, the outflow valves 2017, 2018, 2020 and 2021 and the auxiliary valves 2032 and 2033 were gradually opened to permit respective gases to flow into the reaction chamber 2001. The outflow valves 2017, 2018, 2020 and 2021 are controlled so that the flow rate ratio of $SiH_4$ gas, $GeH_4$ gas, $B_2H_6/H_2$ gas, and $H_2$ gas may have a desired value and opening of the main valve 2034 is also controlled while watching the reading on the vacuum indicator 2036 so that the pressure in the reaction chamber 2001 may reach a desired value. And, after confirming that the temperature of the substrate 2037 is set at 50° to 400° C. by the heater 2038, the power source 2040 is set at a desired power to excite glow discharge in the reaction chamber 2001, simultaneously with controlling of the distribution concentrations of germanium atoms and boron atoms to be contained in the layer formed by carrying out the operation to change gradually the openings of the valves 2018, 2020 by the manual method or by means of an externally driven motor, etc. thereby changing the flow rates of $GeH_4$ gas and $B_2H_6$ gas according to previously designed change rate curves.

By maintaining the glow discharge as described above for a desired period time, the first layer (G) is formed on the substrate 2037 to a desired thickness. At the stage when the first layer (G) is formed to a desired thickness, the second layer (S) containing substantially no germanium atom can be formed on the first layer (G) by maintaining glow discharge according to the same conditions and procedure as those in formation of the first layer (G) except for closing completely the outflow valve 2018 and changing, if desired, the discharging conditions. Also, in the respective layers of the first layer (G) and the second layer (S), by opening or closing as desired the outflow valve 2020, boron atoms may be contained or not, or boron atoms may be contained only in a part of the layer region of the respective layers.

On the light receiving member whose layers up to the above second layer (S) have been formed, the surface layer is formed according to the sputtering method.

In the device shown in FIG. 20, a material for the surface layer is placed all over the cathode electrode and $H_2$ gas is replaced with Ar gas.

Next, the light receiving member whose layers up to the second layer (S) have been formed is set in the devide, followed by sufficient evacuation of the device, and then Ar gas is introduced to a predetermined inner pressure. And, by introduction of a predetermined high frequency power, the material on the cathode electrode is sputtered to form the surface layer on the second layer (S).

During layer formation, it is desirable to rotate the substrate 2037 by a motor 2039 in order to effect uniformization of layer formation.

The present invention is described in more detail by referring to the following Examples.

EXAMPLE 1

In this Example, a semiconductor laser (wavelength: 780 nm) with a spot size of 80 μm was employed. Thus, on a cylindrical aluminum substrate (length (L) 357 mm, outerdiameter (r) 80 mm) a spiral groove with a pitch (P) of 25 μm and a depth (D) of 0.8 S was prepared.

Next, under the conditions as shown in Table 1A, by use of the film deposition device as shown in FIG. 20, an a-Si type light-receiving member for electrography having a surface laminated thereon was prepared following predetermined operational procedures.

NO gas was introduced, while controlling the flow rate by setting the mass flow controller so that its initial value may be 3.4 vol % based on the sum of $SiH_4$ gas flow rate and $GeH_4$ gas flow rate.

The surface layer was formed by placing a target of various materials (thickness 3 mm; $ZrO_2$ in this Example) as shown in Table 30A on the entire surface of the cathode electrode in the film deposition device as shown in FIG. 20, and after $H_2$ gas employed during formation of the first layer and the second layer was replaced with Ar gas, evacuating the device to about $5 \times 10^{-6}$ torr, then introducing Ar gas thereinto and exciting glow discharging at a high frequency power of 300 W to effect sputtering of the $ZrO_2$ target on the cathode electrode. In the following Examples, except for changing the material for formation of the surface layer, formation of the surface layer was carried out as in this Example.

Figure 45:
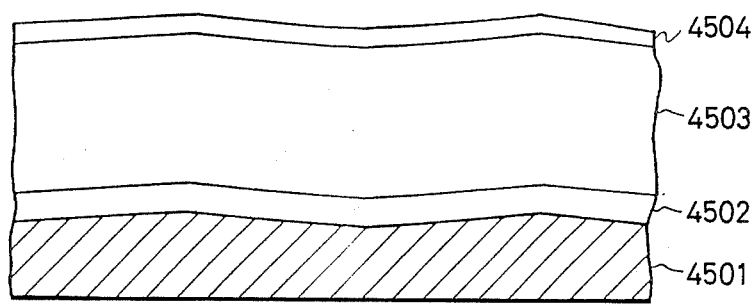

Separately, under the same conditions and with the same preparation means as described above, except for applying a high frequency power of 40 W on the cylindrical aluminum substrate with the same surface characteristic, the first layer 4502, the second layer 4503 and the reflection preventive layer 4504 were formed on the substrate. As the result, as shown in FIG. 45, the surface of the light-receiving layer was found to be in parallel to the uneven flat plane of the substrate 4501. The difference in total layer thickness between the center and the both ends of the aluminum substrate was found to be 1 μm.

Figure 46:
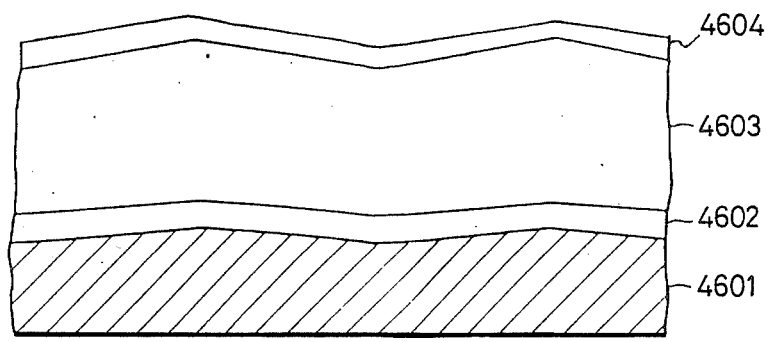

On the other hand, in the above mentioned case where the high frequency power was 160 W, as shown in FIG. 46, the surface of light-receiving layer was in non-parallel to the surface of the substrate 4601. In this case, the difference in average layer thickness between the center and both ends of the substrate was found to be 2 μm.

For the two kinds of light-receiving members for electrophotography, image exposure was effected by means of a device as shown in FIG. 26 (wavelength of laser beam: 780 nm, spot diameter 80 μm), followed by development and transfer to obtain an image. In the light-receiving member having the surface characteristic as shown in FIG. 45, of which layers are prepared at a high frequency power of 40 W, interference fringe pattern was observed.

On the other hand, in the light-receiving member having the surface characteristic as shown in FIG. 46, no interference fringe pattern was observed to give a product exhibiting practically satisfactory electrophotographic characteristics.

EXAMPLE 2

The surface of a cylindrical aluminum substrate was worked as shown in Table 2A. On these cylindrical aluminum substrates (Cylinder No. 101-108) were prepared light-receiving members for electrophotography under the same conditions as in Example 1 where no interference fringe pattern was observed (high frequency power 160 W) (Sample No. 111A–118A)

The difference in average layer thickness between the center and both ends of the aluminum substrate of this light-receiving member for electrophotography was found to be 2.2 μm.

The cross-sections of these light-receiving members for electrophotography were observed by an electron microscope and the differences within the pitch in the second layer were measured to obtain the results as shown in Table 3A. For these light-receiving members, image exposure was effected with a semiconductor laser of 780 nm in wavelength with a spot diameter of 80 μm by means of the device shown in FIG. 26 to obtain the results as shown in Table 3A.

EXAMPLE 3

A light-receiving member was prepared under the same conditions as in Example 2 except for the following points. The layer thickness of the first layer was changed to 10 μm. The difference in average layer thickness between the center and both ends of the first layer was 1.2 μm, and the difference in average layer thickness between the center and both ends of the second layer was 2.3 μm. The thicknesses of the respective layer of the Samples No. 121A–128A were measured by an electron microscope to obtain the results as shown in Table 4A. For these light-receiving members, in the same image exposure device as in Example 1, image exposure was effected to obtain the results as shown in Table 4A.

EXAMPLE 4

On cylindrical aluminum substrates having the surface characteristics as shown in Table 2A (Cylinder No. 101–108), light-receiving members having the first layer containing nitrogen provided thereon were formed under the conditions shown in Table 5A (Sample No. 401A–408A).

The cross-sections of the light-receiving members prepared under the above conditions were observed with an electron microscope. The difference in average layer thickness of the first layer between the center and both ends of the cylinder was 0.09 $\mu$m. The difference in average layer thickness of the second layer between the center and both ends of the cylinder was 3 $\mu$m.

The layer thickness difference within the short range of the second layer in respective light-receiving members was found to have the value as shown in Table 6A. Each of these light-receiving members was subjected to image exposure by laser beam similarly as in Example 1 to give the results as shown in Table 6A.

EXAMPLE 5

On cylindrical aluminum substrates having the surface characteristics as shown in Table 2A (Cylinder No. 101–108), light-receiving members having the first layer containing nitrogen provided thereon were formed under the conditions shown in Table 7A (Sample No. 501A–508A).

The cross-sections of the light-receiving members prepared under the above conditions were observed with an electron microscope. The difference in average layer thickness of the first layer between the center and both ends of the cylinder was 0.3 $\mu$m. The difference in average layer thickness of the second layer between the center and both ends of the cylinder was 3.2 $\mu$m.

The layer thickness difference within the short range of each layer in respective light-receiving members was found to have the value as shown in Table 8A. Each of these light-receiving members was subjected to image exposure by laser beam similarly as in Example 1 to give the results as shown in Table 8A.

EXAMPLE 6

On cylindrical aluminum substrates having the surface characteristics as shown in Table 2A (Cylinder No. 101–108), light-receiving members having the first layer containing carbon provided thereon were formed under the conditions shown in Table 9A (Sample No. 901A–908A).

The cross-sections of the light-receiving members prepared under the above conditions were observed with an electron microscope. The difference in average layer thickness between the center and both ends of the first layer was 0.08 $\mu$m. The difference in average layer thickness of the second layer between the center and both ends of the cylinder was 205 $\mu$m.

The layer thickness difference within the short range of the second layer in each light-receiving members was found to have the value as shown in Table 10A. Each of these light-receiving members was subjected to image exposure by laser beam similarly as in Example 1 to give the results as shown in Table 10A.

EXAMPLE 7

On cylindrical aluminum substrates having the surface characteristics as shown in Table 2A (Cylinder No. 101–108), light-receiving members having the first layer containing carbon provided thereon were formed under the conditions shown in Table 11A (Sample No. 1101A–1108A).

The cross-sections of the light-receiving members prepared under the above conditions were observed with an electron microscope. The difference in average layer thickness of the first layer between the center and both ends of the cylinder was 1.1 $\mu$m. The difference in average layer thickness of the second layer between the center and both ends of the cylinder was 3.4 $\mu$m.

The layer thickness difference within the short range of each layer in respective light-receiving members was found to have the value as shown in Table 12A. Each of these light-receiving members was subjected to image exposure by laser beam similarly as in Example 1 to give the results as shown in Table 12A.

EXAMPLE 8

During formation of the first layer, NO gas flow rate was changed relative to the sum of SiH$_4$ gas flow rate GeH$_4$ gas flow rate as shown in FIG. 42 until the NO gas flow rate was made zero on completion of the layer formation, and following otherwise the same conditions as in Example 1 when the high frequency power was made 160 W, a light-receiving member for electrophotography was prepared. Separately, under the same conditions and with the same preparation means as described above, except for applying a high frequency power of 40 W on the cylindrical aluminum substrate with the same surface characteristic, the first layer and the second layer were formed on the substrate. As the result, as shown in FIG. 45, the surface of the light-receiving layer was found to be in parallel to the flat plane of the substrate 4501. The difference in total layer thickness between the center and the both ends of the aluminum substrate was found to be 1 $\mu$m.

On the other hand, in the above mentioned case where the high frequency power was 160 W, as shown in FIG. 46, the surface of the second layer 4603 was in non-parallel to the surface of the substrate 4601. In this case, the difference in average layer thickness between the center and both ends of the substrate was found to be 2 $\mu$m.

For the two kinds of light-receiving members for electrophotography, image exposure was effected by means of a device as shown in FIG. 26 (wavelength of laser beam: 780 nm, spot diameter 80 $\mu$m), followed by development and transfer to obtain an image. In the light-receiving member having the surface characteristic as shown in FIG. 45, of which layers are prepared at a high frequency power of 40 W, interference fringe pattern was observed.

On the other hand, in the light-receiving member having the surface characteristic as shown in FIG. 46, no interference fringe pattern was observed to give a product exhibiting practically satisfactory electrophotographic characteristics.

EXAMPLE 9

The surface of a cylindrical aluminum substrate was worked as shown in Table 2A. On these cylindrical aluminum substrates (Cylinder No. 101–108) were prepared light-receiving members for electrophotography under the same conditions as in Example 1 where no interference fringe pattern was observed (high frequency power 160 W) (Sample No. 1201A–1208A).

The difference in average layer thickness between the center and both ends of the aluminum substrate of this light-receiving member for electrophotography was found to be 2.2 μm.

The cross-sections of these light-receiving members for electrophotography were observed by an electron microscope and the differences within the pitch in the second layer were measured to obtain the results as shown in Table 13A. For these light-receiving members, image exposure was effected in the same manner as in Example 8 with a semiconductor laser of 780 nm in wavelength with a spot diameter of 80 μm by means of the device shown in FIG. 26 to obtain the results as shown in Table 13A.

EXAMPLE 10

Light-receiving members were prepared under the same conditions as in Example 9 except for the following points (Sample No. 1301A-1308A). The layer thickness of the first layer was changed to 10 μm. The difference in average layer thickness between the center and both ends of the first layer was 1.2 μm, and the difference in average layer thickness between the center and both ends of the second layer was 2.3 μm. The thicknesses of the respective layers of the Samples No. 1301A-1308A were measured by an electron microscope to obtain the results as shown in Table 14A. For these light-receiving members, in the same image exposure device as in Example 1, image exposure was effected to obtain the results as shown in Table 14A.

EXAMPLE 11

On cylindrical aluminum substrates having the surface characteristics as shown in Table 2A (Cylinder No. 101-108), light-receiving members having the first layer containing nitrogen provided thereon were formed following the same conditions and the procedure as in Example 9 except for setting the conditions as shown in Table 15A (Sample No. 1501A-1508A).

The cross-sections of the light-receiving members prepared under the above conditions were observed with an electron microscope. The difference in average layer thickness between the center and both ends of the first layer was 0.09 μm. The difference in average layer thickness between the center and both ends of the second layer was 3 μm.

The layer thickness difference within the short range of the second layer in each light-receiving member (Sample No. 1501A-1508A) was found to have the value as shown in Table 16A.

Each of these light-receiving members (Sample No. 1501A-1508A) was subjected to image exposure by laser beam similarly as in Example 1 to give the results as shown in Table 16A.

EXAMPLE 12

On cylindrical aluminum substrates having the surface characteristics as shown in Table 2A (Cylinder No. 101-108), light-receiving members having the first layer containing nitrogen provided thereon were formed following the same conditions and the procedure as in Example 9 except for setting the conditions as shown in Table 17A (Sample No. 1701A-1708A).

The cross-sections of the light-receiving members (Sample No. 1701A-1708A) prepared under the above conditions were observed with an electron microscope. The difference in average layer thickness between the center and both ends of the first layer was 0.3 μm. The difference in average layer thickness between the center and both ends of the light-receiving layer 0.3 μm.

The layer thickness difference within the short range of each layer in each light-receiving member (Sample No. 1701A-1708A) was found to have the value as shown in Table 18A.

Each of these light-receiving members was subjected to image exposure by laser beam similarly as in Example 1 to give the results as shown in Table 18A.

EXAMPLE 13

On cylindrical aluminum substrates having the surface characteristics as shown in Table 2A (Cylinder No. 101-108), light-receiving members having the first layer containing carbon provided thereon were formed following the same conditions and the same procedure as in Example 9 except for setting the conditions as shown in Table 19A (Sample No. 1901A-1908A).

The cross-sections of the light-receiving members (Sample No. 1901A-1908A) prepared under the above conditions were observed with an electron microscope. The difference in average layer thickness between the center and both ends of the first layer was 0.08 μm. The difference in average layer thickness between the center and both ends of the second layer was 2.5 μm.

The layer thickness difference within the short range of the second layer in each light-receiving member (Sample No. 1901A-1908A) was found to have the value as shown in Table 20A.

Each of these light-receiving members (Sample No. 1901A-1908A) was subjected to image exposure by laser beam similarly as in Example 1 to give the results as shown in Table 20A.

EXAMPLE 14

On cylindrical aluminum substrates having the surface characteristics as shown in Table 2A (Cylinder No. 101-108), light-receiving members having the first layer containing carbon provided thereon were formed following the same conditions and the same procedure as in Example 9 except for setting the conditions shown in Table 2A (Sample No. 2101A-2108A).

The cross-sections of the light-receiving members prepared under the above conditions were observed with an electron microscope. The difference in average layer thickness between the center and both ends of the first layer was 1.1 μm. The difference in average layer thickness between the center and both ends of the second layer was 3.4 μm.

The layer thickness difference within the short range of the second layer in each light-receiving member (Sample No. 2101A-2108A) was found to have the value as shown in Table 22A.

Each of these light-receiving members (Sample No. 2101A-2108A) was subjected to image exposure by laser beam similarly as in Example 1 to give the results as shown in Table 22A.

EXAMPLE 15

By means of the preparation device as shown in FIG. 20, on cylindrical aluminum substrates (Cylinder No. 105), layer formation was conducted by varying the gas flow rate ratio of NO to $(SiH_4+GeH_4)$ according to the change rate curve of gas flow rate ratio as shown in FIG. 57 through 60 under the respective conditions as shown in Table 23A to 26A with lapse of time for layer formation, to prepare light-receiving members for electrophotography (Sample No. 2201A-2204A), respectively. The surface layer was formed of $ZrO_2$ as the material in the same manner as in Example 1.

The characteristic evaluations were performed for the respective light-receiving members thus obtained under the same conditions and by the same means as in Example 1, with the result that no interference fringe pattern was observed with naked eyes at all and satisfactorily good electrophotographic characteristics were exhibited to be suited for the objects of the present invention.

EXAMPLE 16

Figure 57:
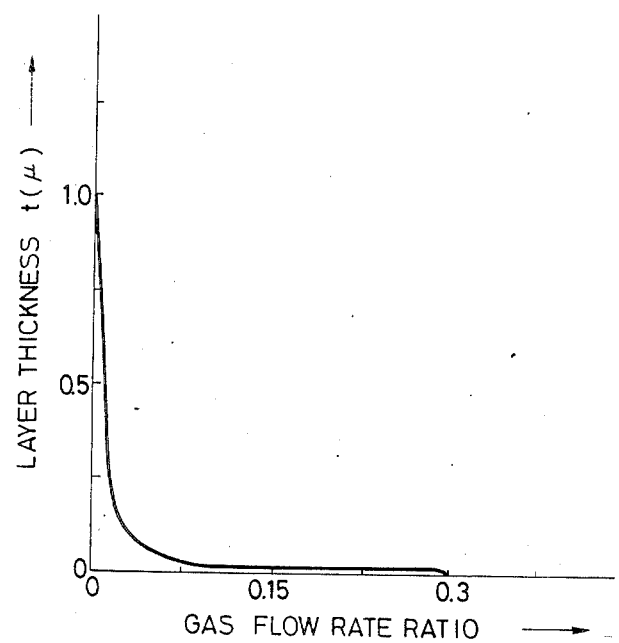
Figure 58:
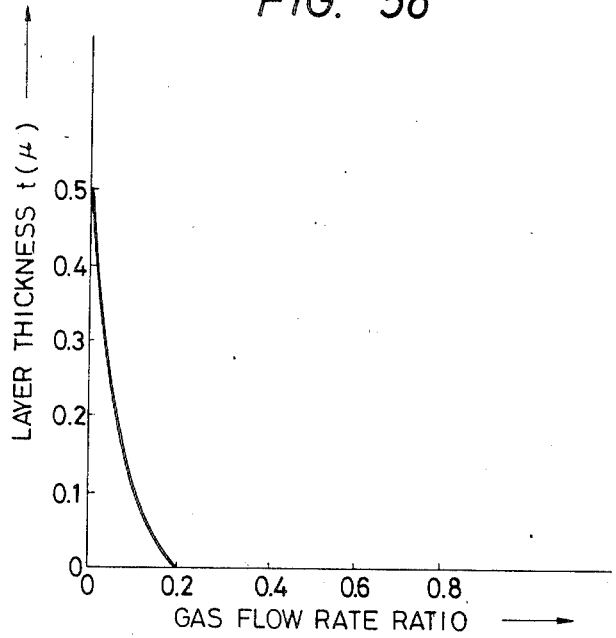

By means of the preparation device as shown in FIG. 20, on cylindrical aluminum substrate (Cylinder No. 105), layer formation was conducted by varying the gas flow rate ratio of NO to ($SiH_4 + GeH_4$) according to the change rate curve of gas flow rate ratio as shown in FIG. 57 under the conditions as shown in Table 27A with lapse of time for layer formation, to prepare a light-receiving member for electrophotography. The surface layer was formed of $ZrO_2$ as the material in the same manner as in Example 1.

The characteristic evaluations were performed for the light-receiving members thus obtained under the same conditions and by the same means as in Example 1, with the result that no interference fringe pattern was observed with naked eyes at all and satisfactorily good electrophotographic characteristics were exhibited to be suited for the objects of the present invention.

EXAMPLE 17

Figure 59:
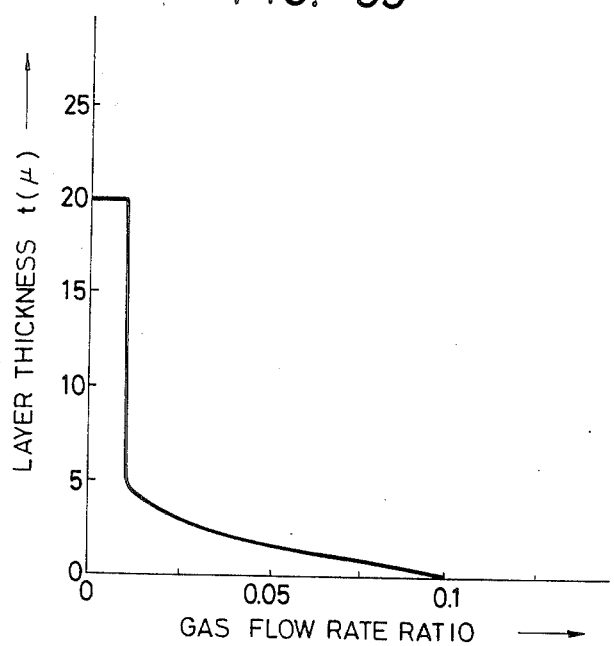
Figure 60:
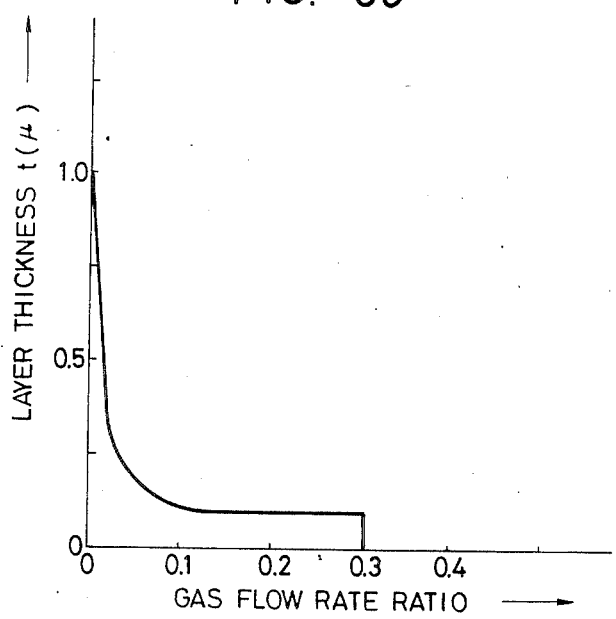

By means of the preparation device as shown in FIG. 20, on cylindrical aluminum substrates (Cylinder No. 105), layer formation was conducted by varying the gas flow rate ratio of $NH_3$ to ($SiH_4 + GeH_4$) and $CH_4$ to ($SiH_4 + GeH_4$) according to the change rate curves of gas flow rate ratio as shown in FIG. 59 under the respective conditions as shown in Table 28A and Table 29A with lapse of time for layer formation, to prepare light-receiving members for electrophotography (Sample No. 2206A–2207A). The surface layer was formed of $ZrO_2$ as the material in the same manner as in Example 1.

The characteristic evaluations were performed for the respective light-receiving members thus obtained under the same conditions and by the same means as in Example 1, with the result that no interference fringe pattern was observed with naked eyes at all and satisfactorily good electrophotographic characteristics were exhibited to be suited for the objects of the present invention.

EXAMPLE 18

By means of the preparation device as shown in FIG. 20, on a cylindrical substrate (Cylinder No. 105), 22 a-Si type light-receiving members for electrophotography were prepared following the same conditions and the procedure as in Example 1 except for changing the material for the surface layer to various materials and layer thicknesses under the conditions No. 2701–2711 shown in Table 30A (Sample No. 2701A–2722A).

For these light-receiving members for electrophotography, image exposure was effected by means of an image exposure device shown in FIG. 26 (wavelength of laser beam 780 nm; spot diameter 80 μm), followed by development and transfer, to obtain an image. No interference fringe pattern was observed in any image obtained by using Samples No. 2701A–2722A, and each Sample was satisfactory in practical application.

EXAMPLE 19

Figure 21:
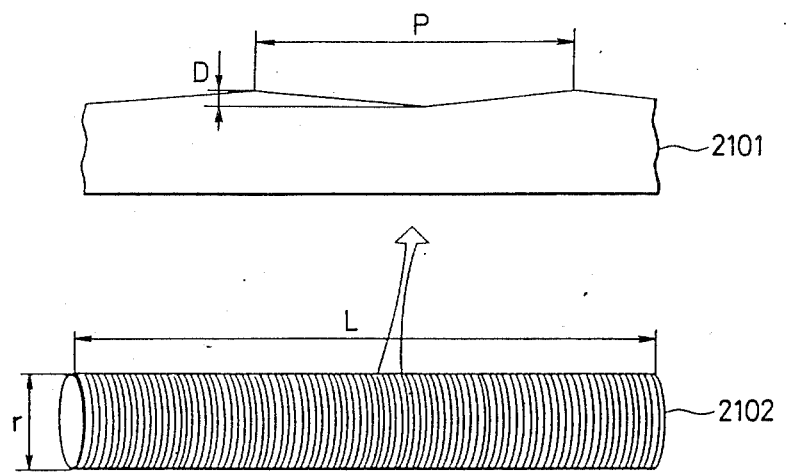
FIG. 21 is a schematic illustration of the surface state of the aluminum substrates employed in Examples.

By means of a lathe, aluminum sustrate (length (L): 357 mm, outerdiameter (r): 80 mm) were worked under the conditions as shown in Table 2A (Cylinder Nos. 104–106, 109) to have the surface characteristic as shown in FIG. 21.

Next, a-Si type light-receiving members for electrophotography were prepared following predetermined procedures using the deposition device as shown in FIG. 20 under the conditions as shown in Table 1B (Sample Nos. 201B–204B).

Figure 22:
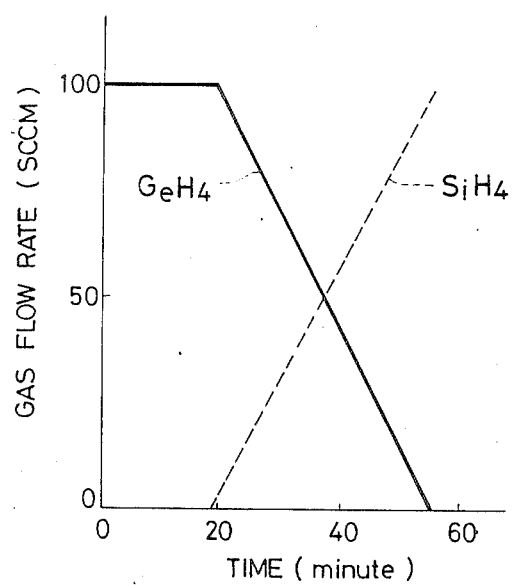
FIGS. 22 through 25, FIGS. 47 through 78 are schematic illustrations of the changes in gas flow rates of the respective gases in Examples.

In preparation of the first layer, the mass flow controllers 2007 and 2008 were controlled by a computer (HP9845B) so that the flow rates of respective gases of $GeH_4$ and $SiH_4$ might be as shown in FIG. 22. The surface layer was prepared according to the same procedure under the same conditions as in Example 1 by placing targets (thickness 3 mm) of various materials as shown in Table 20A on the entire surface of the cathode electrode in the device as shown in FIG. 20.

The layer thicknesses of the respective layers of each light-receiving member thus prepared were measured by an electron microscope to give the results as shown in Table 2B.

These light-receiving members for electrophotography as prepared above were subjected to image exposure by means of a device as shown in FIG. 26 (wavelength of laser beam: 780 nm, spot diameter 80 μm), followed by development and transfer to obtain an image. In any of the Samples No. 201B–204B, the image was free from any interference fringe pattern observed and proved to be satisfactory for practical application.

EXAMPLE 20

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the deposition device as shown in FIG. 20 in the same manner as in Example 19 except for changing the conditions to those as shown in Table 3B in which the surface layer material was made $TiO_2$ (Sample Nos. 401B–404B).

Figure 23:
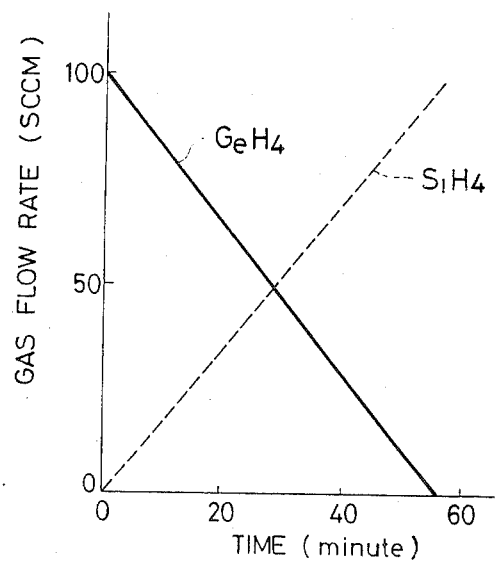

In preparation of the first layer, the mass flow controllers 2007 and 2008 were controlled by a computer (HP9845B) so that the flow rates of respective gases of $GeH_4$ and $SiH_4$ might be as shown in FIG. 23.

The layer thicknesses of the respective layers of each light-receiving member thus prepared were measured by an electron microscope to give the results as shown in Table 4B.

These light-receiving members for electrophotography as prepared above were subjected to image exposure by means of a device as shown in FIG. 26 (wavelength of laser beam: 780 nm, spot diameter 80 μm), followed by development and transfer to obtain an image. In any of the Samples No. 401B–404B, the image was free from any interference fringe pattern observed and proved to be satisfactory for practical application.

EXAMPLE 21

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the deposition device as shown in FIG. 20 in the same manner as in Example 19 except for changing the conditions to those as shown in Table 5B in which the surface layer material was made $CeO_2$ (Sample Nos. 601B–604B).

Figure 24:
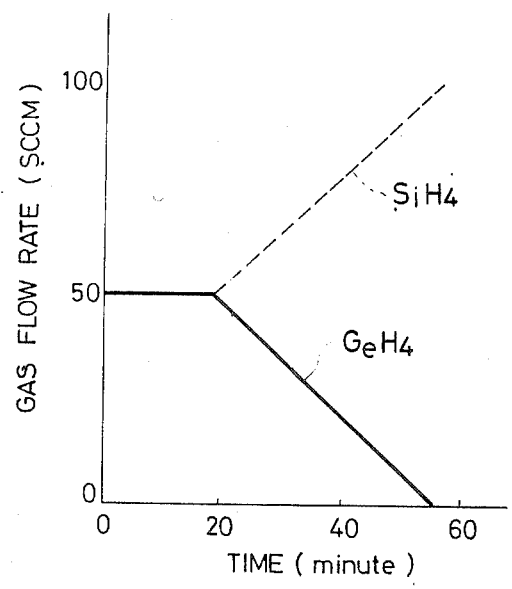

In preparation of the first layer, the mass flow controllers 2007 and 2008 were controlled by a computer (HP9845B) so that the flow rates of respective gases of $GeH_4$ and $SiH_4$ might be as shown in FIG. 24.

The layer thicknesses of the respective layers of each light-receiving member thus prepared were measured by an electron microscope to give the results as shown in Table 6B.

These light-receiving members for electrophotography as prepared above were subjected to image exposure by means of a device as shown in FIG. 26 (wavelength of laser beam: 780 nm, spot diameter 80 μm), followed by development and transfer to obtain an image. In any of the Samples No. 601B–604B, the image was free from any interference fringe pattern observed and proved to be satisfactory for practical application.

EXAMPLE 22

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the deposition device as shown in FIG. 20 in the same manner as in Example 19 except for changing the conditions to those as shown in Table 7B in which the surface layer material was made ZnS (Sample Nos. 801B–804B).

Figure 25:
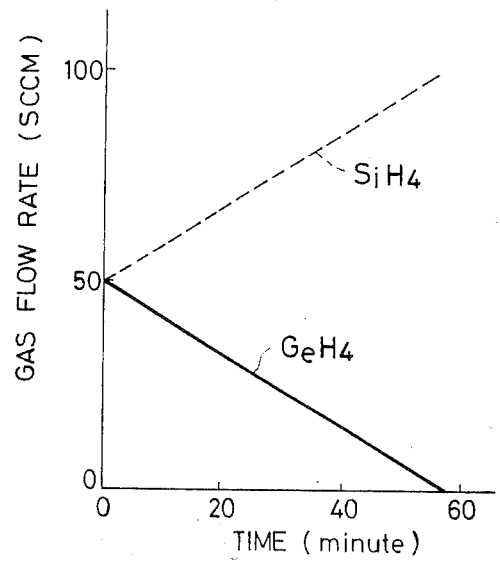

In preparation of the first layer, the mass flow controllers 2007 and 2008 were controlled by a computer (HP9845B) so that the flow rates of respective gases of $GeH_4$ and $SiH_4$ might be as shown in FIG. 25.

The layer thicknesses of the respective layers of each light-receiving member thus prepared were measured by an electron microscope to give the results as shown in Table 8B.

These light-receiving members for electrophotography as prepared above were subjected to image exposure by means of a device as shown in FIG. 26 (wavelength of laser beam: 780 nm, spot diameter 80 μm), followed by development and transfer to obtain an image. In any of the Samples No. 801B–804B, the image was free from any interference fringe pattern observed and proved to be satisfactory for practical application.

EXAMPLE 23

Following the same conditions and the procedure as in Example 22 except for changing $NH_3$ gas used in Example 22 to NO gas, a-Si type light-receiving members for electrophotography were prepared.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 24

Following the same conditions and the procedure as in Example 22 except for changing $NH_3$ gas used in Example 22 to $CH_4$ gas, a-Si type light-receiving members for electrophotography were prepared.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 25

Figure 61:
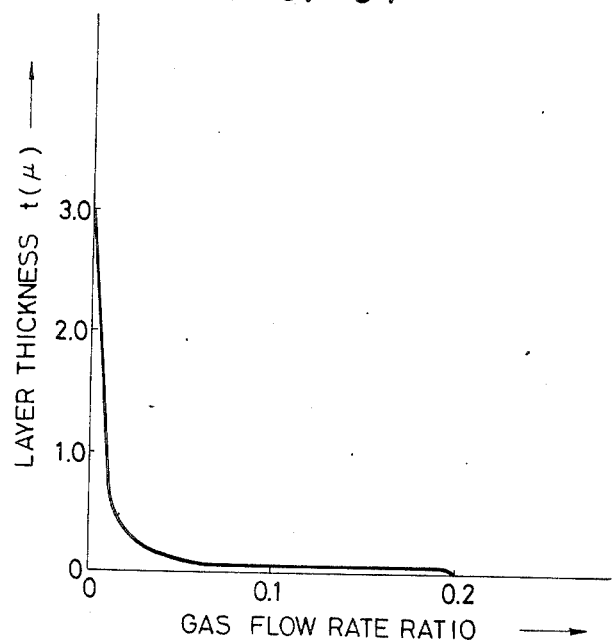
Figure 62:
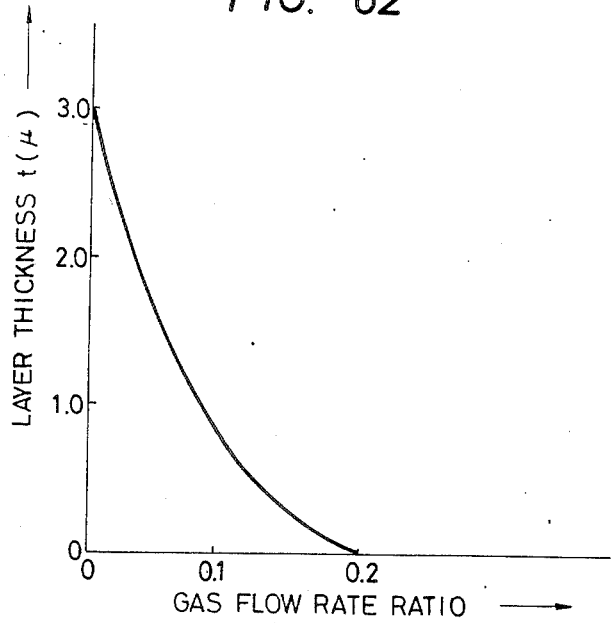

By means of the film deposition device shown in FIG. 20, on an aluminum substrate (Cylinder No. 102), light-receiving members for electrophotography were prepared under the same conditions as in Example 19 except for changing the flow rate ratio of NO gas according to the change rate curve of the gas flow rate ratio as shown in FIG. 61 with layer formation time under the conditions shown in Table 9B.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 26

By means of the film deposition device shown in FIG. 20, on an aluminum substrate (Cylinder No. 102), light-receiving members for electrophotography were prepared under the same conditions as in Example 19 except for changing the flow rate ratio of NO gas according to the change rate curve of the gas flow rate ratio as shown in FIG. 61 with layer formation time under the conditions shown in Table 10B.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 27

Figure 63:
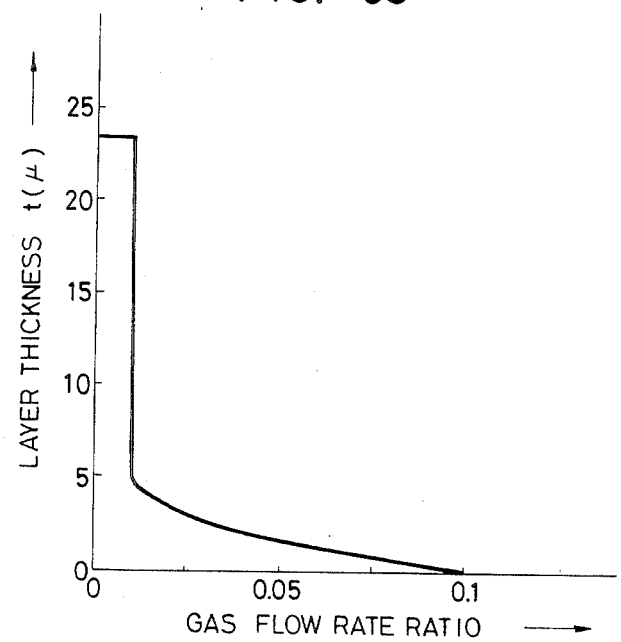

By means of the film deposition device shown in FIG. 20, on an aluminum substrate (Cylinder No. 102), light-receiving members for electrophotography were prepared under the same conditions as in Example 19 except for changing the flow rate ratio of NO gas according to the change rate curve of the gas flow rate ratio as shown in FIG. 63 with layer formation time under the conditions shown in Table 11B.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 28

Following the same conditions and the procedure as in Example 27 except for changing NO gas used in Example 27 to NH₃ gas, a-Si type light-receiving members for electrophotography were prepared.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 29

Following the same conditions and the procedure as in Example 27 except for changing NO gas used in Example 27 to CH₄ gas, a-Si type light-receiving members for electrophotography were prepared.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 30

Figure 64:
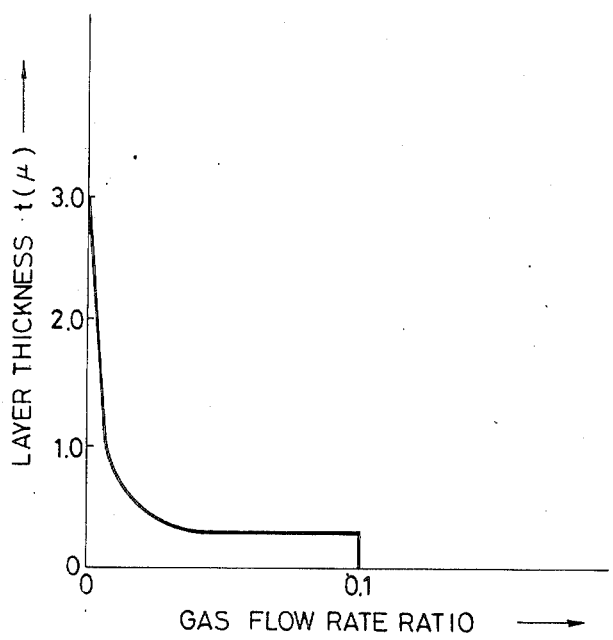

By means of the film deposition device shown in FIG. 20, on an aluminum substrate (Cylinder No. 102), light-receiving members for electrophotography were prepared under the same conditions as in Example 19 except for changing the flow rate ratio of CH₄ gas according to the change rate curve of the gas flow rate ratio as shown in FIG. 64 with layer formation time under the conditions shown in Table 11B.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 31

By use of an aluminum substrate (Cylinder No. 102), with the surface layer material and layer thickness being as shown in Table 30A, under otherwise the same conditions as in Example 19, a-Si type light-receiving members for electrophotography were prepared (Sample No. 2701B–2722B).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 32

By means of a lathe, aluminum substrates (length (L): 357 mm, outerdiameter (r): 80 mm) were worked under the conditions as shown in Table 2A (Cylinder No. 104–106, 109) to have the surface characteristic as shown in FIG. 21.

Next, a-Si type light-receiving members for electrophotography were prepared following predetermined procedures using the film deposition device as shown in FIG. 20 under the conditions as shown in Table 1C (Sample Nos. 201C–204C).

The layer thicknesses of the respective layers of each light-receiving member thus prepared were measured by an electron microscope to give the results as shown in Table 2C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 33

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 3C (Sample Nos. 401C–404C).

The layer thicknesses of the respective layers of each light-receiving member thus prepared were measured by an electron microscope to give the results as shown in Table 4C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 34

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 5C in which the surface layer material was made TiO₂ (Sample Nos. 601C–604C).

The layer thicknesses of the respective layers of each light-receiving member thus prepared were measured by an electron microscope to give the results as shown in Table 6C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 35

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 7C (Sample Nos. 801C–804C).

The layer thicknesses of the respective layers of each light-receiving member thus prepared were measured by an electron microscope to give the results as shown in Table 8C.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained was free from interference fringe pattern observed and proved to be satisfactory for practical application.

EXAMPLE 36

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 9C in which the surface layer material was made $CeO_2$ (Sample Nos. 1001C–1004C).

The layer thicknesses of the respective layers of each light-receiving member thus prepared were measured by an electron microscope to give the results as shown in Table 10C.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained was free from interference fringe pattern observed and proved to be satisfactory for practical application.

EXAMPLE 37

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 11C in which the surface layer material was made ZnS (Sample Nos. 1201C–1204C).

The layer thicknesses of the respective layers of each light-receiving member thus prepared were measured by an electron microscope to give the results as shown in Table 12C.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained was free from interference fringe pattern observed and proved to be satisfactory for practical application.

EXAMPLE 38

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 13C in which the surface layer material was made $Al_2O_3$ (Sample Nos. 1401C–1404C).

Figure 65:
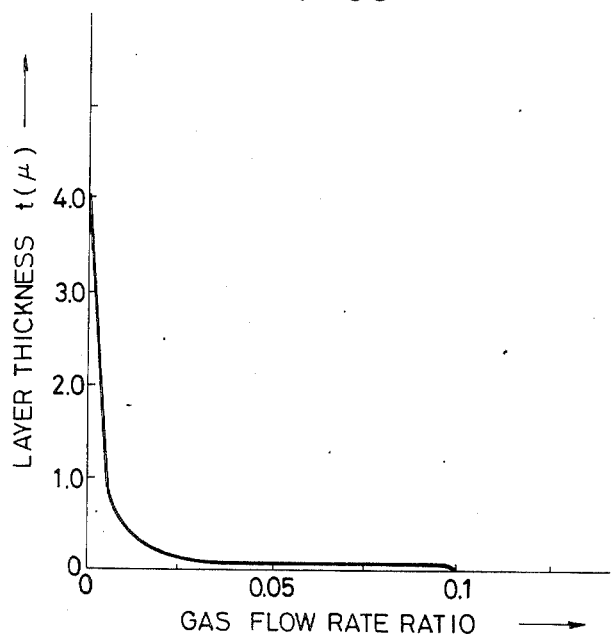

In formation of the first layer, the mass flow controller of $CH_4$ gas 2009 was controlled by a computer (HP9845B) so that the flow rate ratio of $CH_4$ gas relative to the sum of $SiH_4$ gas and $CH_4$ gas should become as shown in FIG. 65.

The layer thicknesses of the respective layers of each light-receiving member thus prepared were measured by an electron microscope to give the results as shown in Table 14C.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained was free from interference fringe pattern observed and proved to be satisfactory for practical application.

EXAMPLE 39

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 15C in which the surface layer material was made $CeF_3$ (Sample Nos. 1601C–1604C).

Figure 66:
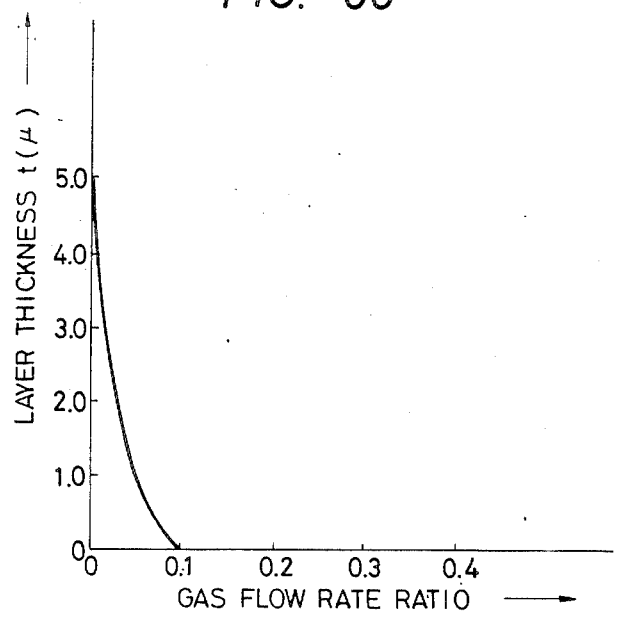

In formation of the first layer, the mass flow controller of NO gas 2009 was controlled by a computer (HP9845B) so that the flow rate ratio of NO gas to the sum of $GeH_4$ gas and $SiH_4$ gas should become as shown in FIG. 66.

The layer thicknesses of the respective layers of each light-receiving member thus prepared were measured by an electron microscope to give the results as shown in Table 16C.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained was free from interference fringe pattern observed and proved to be satisfactory for practical application.

EXAMPLE 40

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 17C in which the surface layer material was made $MgF_2$ (Sample Nos. 1801C–1804C).

Figure 67:
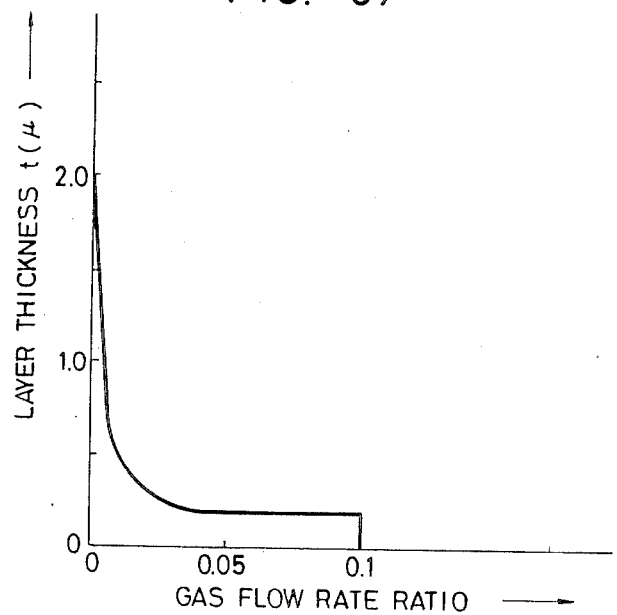

In formation of the first layer, the mass flow controller of $NH_3$ gas 2009 was controlled by a computer (HP9845B) so that the flow rate ratio of $NH_3$ gas to the sum of $GeH_4$ gas and $SiH_4$ gas should become as shown in FIG. 67.

The layer thicknesses of the respective layers of each light-receiving member thus prepared were measured by an electron microscope to give the results as shown in Table 18C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 41

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 19C in which the surface layer material was made $SiO_2$ (Sample Nos. 2001C–2004C).

Figure 68:
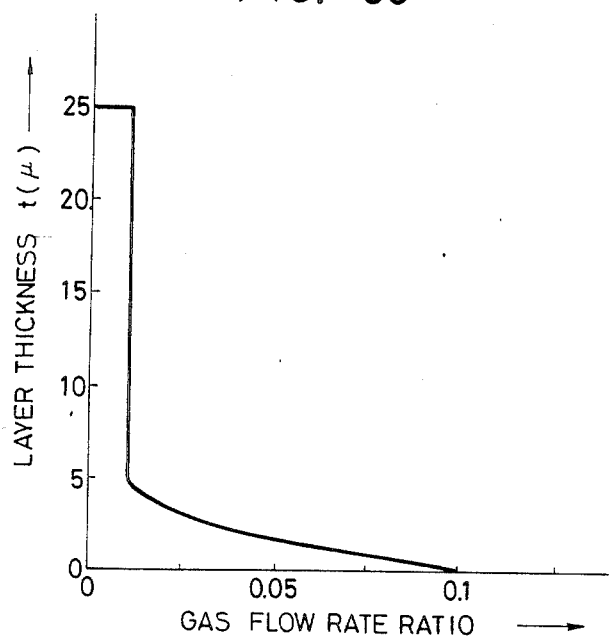

In formation of the first layer, the mass flow controller of $CH_4$ gas 2009 was controlled by a computer (HP9845B) so that the flow rate ratio of $CH_4$ gas to the sum of $GeH_4$ gas and $SiH_4$ gas should become as shown in FIG. 68.

The layer thicknesses of the respective layers of each light-receiving member thus prepared were measured by an electron microscope to give the results as shown in Table 20C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 42

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 21C in which the surface layer material was made $ZrO_2$ and $TiO_2$ (weight ratio: 6:1) (Sample No. 2201C–2204C).

Figure 69:
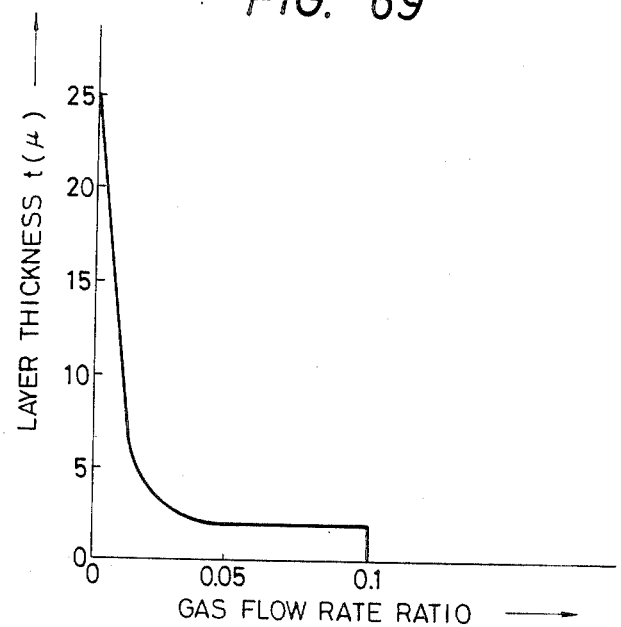

In formation of the layers, the mass flow controller of NO gas 2009 was controlled by a computer (HP9845B) so that the flow rate ratio of NO gas to the sum of $GeH_4$ gas and $SiH_4$ gas should become as shown in FIG. 69.

The layer thicknesses of the respective layers of each light-receiving member thus prepared were measured by an electron microscope to give the results as shown in Table 22C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 43

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 23C in which the surface layer material was made $Al_2O_3/ZrO_2 = 1/1$ (weight ratio) (Sample No. 2401C–2404C).

Figure 70:
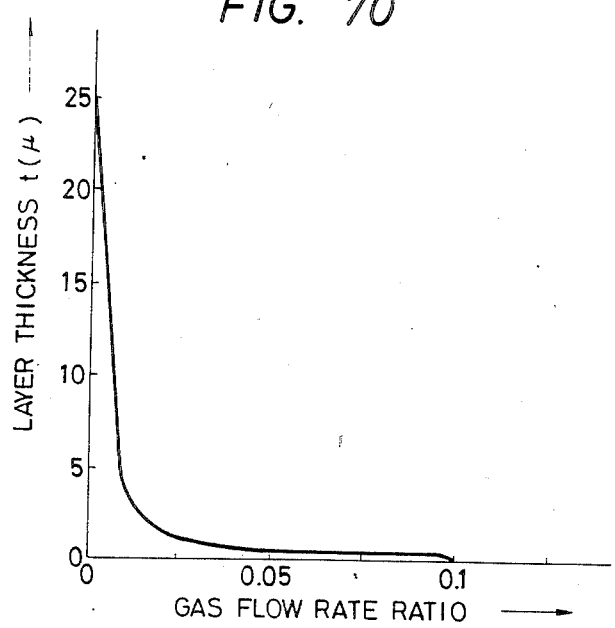

In formation of the layers, the mass flow controller of $NH_3$ gas 2009 was controlled by a compouter (HP9845B) so that the flow rate ratio of $NH_3$ gas to the sum of $GeH_4$ gas and $SiH_4$ gas should become as shown in FIG. 70.

The layer thicknesses of the respective layers of each light-receiving member thus prepared were measured by an electron microscope to give the results as shown in Table 24C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 44

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared accordirg to various procedures using the film deposition device as shown in FIG. 20 in the same manner as in Example 32 except for changing the conditions to those as shown in Table 25C in which the surface layer material was made $MgF_2$ (Sample Nos. 2601C–2604C.)

The layer thicknesses of the respective layers of each light-receiving member thus prepared were measured by an electron microscope to give the results as shown in Table 26C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 45

By means of a lathe, aluminum substrate (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 32 except for changing the conditions to those as shown in Table 27C (Sample No. 2801C–2804C).

The layer thicknesses of the respective layers of each light-receiving member thus prepared were measured by an electron microscope to give the results as shown in Table 28C.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 46

Examples 32 to 45 were repeated except that $PH_3$ gas diluted with $H_2$ to 3000 vol. ppm was used in place of $B_2H_6$ gas diluted with $H_2$ to 3000 vol. ppm to prepare light-receiving members for electrophotography.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from any interference fringe pattern observed and proved to be satisfactory for practical application.

EXAMPLE 47

By use of an aluminum substrate (Cylinder NO. 102), with the surface layer material and the surface layer thickness being as shown in Table 30A, under otherwise the same conditions as in Example 32, a-Si type light-sensitive members for electrophotography were prepared (Sample Nos. 2701C–2722C).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 48

By means of a lathe, aluminum substrates (length (L): 357 mm, outerdiameter (r): 80 mm) were worked under the conditions as shown in Table 2A (Cylinder No. 104–106, 109) to have the surface characteristic as shown in FIG. 21.

Next, a-Si type light-receiving members for electrophotography were prepared following predetermined procedures using the film deposition device as shown in FIG. 20 under the conditions as shown in Table 2D (Sample No. 201D–204D).

In preparation of the first layer of a-SiGe:H: B:O, the mass flow controllers 2007, 2008 and 2010 were controlled by a computer (HP9845B) so that the flow rates of respective gases of $GeH_4$ and $SiH_4$ might be as shown in FIG. 22. The surface layer was prepared according to the same procedure as in Example 1.

The layer thicknesses of the first layer and the second layer thus prepared were measured to obtain the results shown in Table 3D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 49

By means of a lathe, aluminum substrate (length (L): 357 mm, outerdiameter (r): 80 mm) were worked to the surface characteristics as shown in FIG. 21 under the condition as shown in Table 1D.

In preparation of the first layer of a-SiGe:H: B:O, under the conditions as shown in Table 2D, the mass flow controllers 2008 and 2007 were controlled by a computer (HP9845B) so that the flow rates of respective gases of $GeH_4$ and $SiH_4$ might be as shown in FIG. 23.

Otherwise, a-Si type light-receiving members for electrophotography were prepared according to various procedures using the film deposition device as shown in FIG. 20 in the same manner as in Example 48 (Sample No. 301D–304D).

The layer thicknesses of the first layer and the second layer thus prepared were measured to obtain the results shown in Table 4D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 50

Following the same conditions and the procedure as in Example 48 except for changing NO gas used in Example 48 to $NH_3$ gas, a-Si type light-receiving members for electrophotography were prepared (Sample Nos. 401D–404D).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 51

Following the same conditions and the procedure as in Example 48 except for changing NO gas used in Example 48 to CH$_4$ gas, a-Si type light-receiving members for electrophotography were prepared (Sample Nos. 501D–504D).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 52

By means of a lathe, aluminum substrate (length (L): 357 mm, outerdiameter (r): 80 mm) were worked to the surface characteristics as shown in FIG. 21 under the conditions as shown in Table 2A (Cylinder Nos. 104–106, 109).

Next, a-Si type light-receiving members for electrophotography were prepared according to various procedures using the film deposition device as shown in FIG. 20 in the same manner as in Example 48 except for changing the conditions to those as shown in Table 5D in which the surface layer material was made TiO$_2$ (Sample Nos. 601D–604D).

In preparation of the first layer a-SiGe:H: B:N, the mass flow controllers 2008 and 2007 were controlled by a computer (HP9845B) so that the flow rates of respective gases of GeH$_4$ and SiH$_4$ might be as shown in FIG. 24.

The layer thicknesses of the respective layers of each light-receiving member thus prepared were measured by an electron microscope to give the results as shown in Table 6D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 53

By means of a lathe, aluminum substrate (length (L): 357 mm, outerdiameter (r): 80 mm) were worked to the surface characteristics as shown in FIG. 21 under the conditions as shown in Table 1D.

Next, a-Si type light-receiving members for electrophotography were prepared according to various procedures using the film deposition device as shown in FIG. 20 in the same manner as in Example 48 except for changing the conditions to those as shown in Table 5D in which the surface layer material was made TiO$_2$ (Sample No. 701D–704D).

In preparation of the first layer a-SiGe:H: B:N, the mass flow controllers 2008 and 2007 were controlled by a computer (HP9845B) so that the flow rates of respective gases of GeH$_4$ and SiH$_4$ might be as shown in FIG. 25.

The layer thicknesses of the first layer and the second layer thus prepared were measured to obtain the results as shown in Table 7D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 54

Following the same conditions and the procedure as in Example 52 except for changing NH$_3$ gas used in Example 52 to NO gas, a-Si type light-receiving members for electrophotography were prepared (Sample No. 801D–804D).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 55

Following the same conditions and the procedure as in Example 52 except for changing NH$_3$ gas used in Example 52 to CH$_4$ gas, a-Si type light-receiving members for electrophotography were prepared (Sample No. 901D–904D).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 56

By means of a lathe, aluminum substrate (length (L): 357 mm, outerdiameter (r): 80 mm) were worked to the surface characteristics as shown in FIG. 21 under the conditions as shown in 2A (Cylinder Nos. 104–106, 109).

Next, light-receiving members for electrophotography were prepared according to various procedures using the film deposition device as shown in FIG. 20 in the same manner as in Example 48 except for changing the conditions to those as shown in Table 8D in which the surface layer material was made CeO$_2$ (Sample No. 1001D–1004D).

In preparation of the first layer a-SiGe:H: B:C, the mass flow controllers 2008 and 2007 were controlled by a computer (HP9845B) so that the flow rates of respective gases of GeH$_4$ and SiH$_4$ might be as shown in FIG. 22.

The flow rate ratio of CH$_4$ gas relative to the sum of GeH$_4$ gas and SiH$_4$ gas was changed according to the change rate curve as shown in FIG. 64.

The layer thicknesses of the first layer and the second layer thus prepared were measured to obtain the results shown in Table 9D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 57

Following the same conditions and the procedure as in Example 56 except for changing CH$_4$ gas used in Example 56 to NO gas, a-Si type light-receiving members for electrophotography were prepared (Sample No. 1101D-1104D).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 58

Following the same conditions and the procedure as in Example 56 except for changing CH$_4$ gas used in Example 56 to NH$_3$ gas, a-Si type light-receiving members for electrophotography were prepared (Sample No 1201D-1204D).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 59

By means of a lathe, aluminum substrate (length (L): 357 mm, outerdiameter (r): 80 mm) were worked to the surface characteristics as shown in FIG. 21 under the conditions as shown in Table 2A (Cylinder Nos. 104-106, 109).

Next, a-Si type light-receiving members for electrophotography were prepared according to various procedures using the film deposition device as shown in FIG. 20 in the same manner as in Example 48 except for changing the conditions to those as shown in Table 10D in which the surface layer material was made Zns (Sample Nos. 1301D-1304D).

In preparation of the first layer a-SiGe:H: B:O, the mass flow controllers 2008 and 2007 were controlled by a computer (HP9845B) so that the flow rates of respective gases of GeH$_4$ and SiH$_4$ might be as shown in FIG. 24.

The flow rate ratio of NO gas relative to the sum of GeH$_4$ gas and SiH$_4$ gas was changed according to the change rate curve as shown in FIG. 63.

The layer thicknesses of the first layer and the second layer thus prepared were measured to obtain the results shown in Table 11D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 60

By means of a lathe, aluminum substrate (length (L): 357 mm, outer diameter (r): 80 mm) were worked to the surface characteristics as shown in FIG. 21 under the conditions as shown in Table 2A (Cylinder Nos. 104-106, 109).

Next, a-Si type light-receiving members for electrophotography were prepared according to various procedures using the film deposition device as shown in FIG. 20 in the same manner as in Example 48 except for changing the conditions to those as shown in Table 12D in which the surface layer material was made ZnS (Sample Nos. 1401D-1404D).

In preparation of the first layer a-SiGe:H: B:N, the mass flow controllers 2008 and 2007 were controlled by a computer (HP9845B) so that the flow rates of respective gases of GeH$_4$ and SiH$_4$ might be as shown in FIG. 25.

Figure 71:
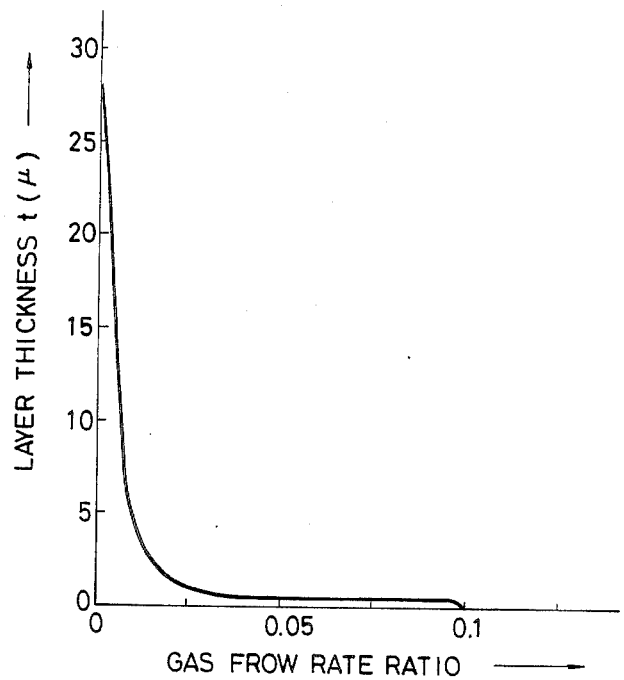

The flow rate ratio of NH$_3$ gas relative to the sum of GeH$_4$ gas and SiH$_4$ gas was changed according to the change rate curve as shown in FIG. 71.

The layer thicknesses of the first layer and the second layer thus prepared were measured to obtain the results shown in Table 13D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 61

By means of a lathe, aluminum substrate (length (L): 357 mm, outer diameter (r): 80 mm) were worked to the surface characteristics as shown in FIG. 21 under the conditions as shown in Table 2A (Cylinder Nos. 104-106, 109).

Next, a-Si type light-receiving members for electrophotography were prepared according to various procedures using the film deposition device as shown in FIG. 20 in the same manner as in Example 48 except for changing the conditions to those as shown in Table 14D in which the surface layer material was made ZnS (Sample Nos. 1501D-1504D).

In preparation of the first layer a-SiGe:H: B:C, the mass flow controllers 2008 and 2007 were controlled by a computer (HP9845B) so that the flow rates of respective gases of GeH$_4$ and SiH$_4$ might be as shown in FIG. 23.

Figure 72:
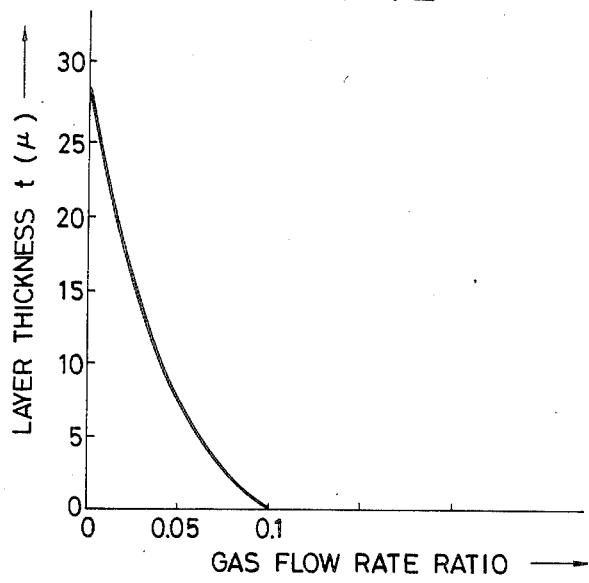

The flow rate ratio of CH$_4$ gas relative to the sum of GeH$_4$ gas and SiH$_4$ gas was changed according to the change rate curve as shown in FIG. 72.

The layer thicknesses of the first layer and the second layer thus prepared were measured to obtain the results shown in Table 15D.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 62

Examples 48 to 61 were repeated except that $PH_3$ gas diluted with $H_2$ to 3000 vol. ppm was used in place of $B_2H_6$ gas diluted with $H_2$ to 3000 vol. ppm to prepare light-receiving members for electrophotography (Sample Nos. 1601D–1656D).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 63

By using the substrate shown by Cylinder No. 104 in Table 2A used in Example 48, various materials shown in Table 30A as the surface layer material and two kinds of the surface layer formation time (one is the same as in Example 48, and the other is about 2-fold of Example 48), following otherwise the same conditions and the procedure as in Example 48, a-Si type light-receiving members for electrophotography were prepared (Sample No. 2701-1D–2722-1D, 2701-2D–2722-2D).

These light-receiving members for electrophotography as prepared above were subjected to image exposure by means of a device as shown in FIG. 26 (wavelength of laser beam: 780 nm, spot diameter 80 μm), followed by development and transfer to obtain an image. In any of the Samples No. 2701-1D–2722-1D, 2701-2D–2722-2D, the image was free from any interference pattern observed and proved to be satisfactory for practical application.

EXAMPLE 64

By means of a lathe, aluminum substrate (length (L): 357 mm, outer diameter (r): 80 mm) were under the conditions as shown in Table 2A (Cylinder No. 104) to have the surface characteristic as shown in FIG. 21.

Next, a-Si type light-receiving members for electrophotography were prepared following predetermined procedures using the film deposition device as shown in FIG. 20 under the conditions as shown in Table 1E. The surface layer was prepared according to the same procedure as in Example 1.

The layer thickness distribution of the a-Si type light-receiving member for electrophotography thus prepared was measured by an electron microscope. As the result, the difference in average layer thickness was 0.1 μm between the center and both ends of the first layer, 2 μm between the center and both ends of the second layer, while the layer thickness difference at the minute portion in the first layer was 0.02 μm, and 0.3 μm in the second layer.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 65

By means of a lathe, aluminum substrate (length (L): 357 mm, outer diameter (r): 80 mm) were worked under the same condition as in Example 64 to have the surface characteristic as shown in Table 2A (Cylinder No. 105).

Next, a-Si type light-receiving members for electrophotography were prepared following various procedures using the film deposition device as shown in FIG. 20 in the same manner as in Example 64 except for setting the conditions as shown in Table 2E.

The layer thickness distribution of the a-Si type light-receiving member for electrophotography thus prepared was measured by an electron microscope. As the result, the difference in average layer thickness was 0.1 μm between the center and both ends of the first layer, 2 μm between the center and both ends of the second layer, while the layer thickness difference at the minute portion in the first layer was 0.03 μm, and 0.3 μm in the second layer.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application. Example 66

By means of a lathe, aluminum substrates (length (L): 357 mm, outerdiameter (r): 80 mm) were worked under the same conditions as in Example 64 to have the surface characteristic as shown in Table 2A (Cylinder No. 106).

Next, a-Si type light-receiving members for electrophotography were prepared according to various procedures using the film deposition device as shown in FIG. 20 in the same manner as in Example 64 except for changing the conditions to those as shown in Table 3E in which the surface layer material was made $TiO_2$.

The layer thickness distribution of the a-Si type light-receiving member for electrophotography thus prepared was measured by an electron microscope. As the result, the difference in average layer thickness was 0.6 μm between the center and both ends of the first layer, 2 μm between the center and both ends of the second layer, while the layer thickness difference at the minute portion in the first layer was 0.01 μm, and 0.3 μm in the second layer.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 67

By means of a lathe, aluminum substrates (length (L): 357 mm, outerdiameter (r): 80 mm) were worked in the same manner as in Example 64 to have the surface characteristic as shown in Table 2A (Cylinder NO. 109).

Next, a-Si type light-receiving members for electrophotography were prepared following various procedures using the film deposition device as shown in FIG. 20 in the same manner as in Example 64 except for setting the conditions as shown in Table 4E.

The layer thickness distribution of the a-Si type light-receiving member for electrophotography thus prepared was measured by an electron microscope. As the result, the difference in average layer thickness was 0.8 μm between the center and both ends of the first layer, 2 μm between the center and both ends of the second layer, while the layer thickness difference at the minute portion in the first layer was 0.15 μm, and 0.3 μm in the second layer.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 68

Following the same conditions and the procedure as in Example 66 except for changing $CH_4$ gas used in Example 66 to $NH_3$ gas, a-Si type light-receiving members for electrophotography were prepared.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 69

Following the same conditions and the procedure as in Example 67 except for changing NO gas used in Example 67 to $CH_4$ gas, a-Si type light-receiving members for electrophotography were prepared.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 70

By means of a lathe, aluminum substrates (length (L): 357 mm, outerdiameter (r): 80 mm) were worked to have the surface characteristic as shown in Table 2A (Cylinder Nos. 104–106, 109).

Next, a-Si type light-receiving members for electrophotography were prepared according to various procedures using the film deposition device as shown in FIG. 20 in the same manner as in Example 64 except for changing the conditions to those as shown in Table 5E in which the surface layer material was made $CeO_2$ (Sample Nos. 701E–704E).

Figure 54:
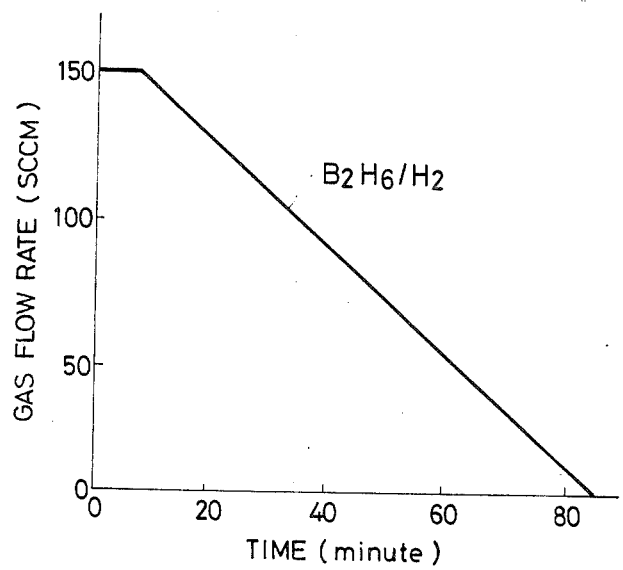
Figure 73:
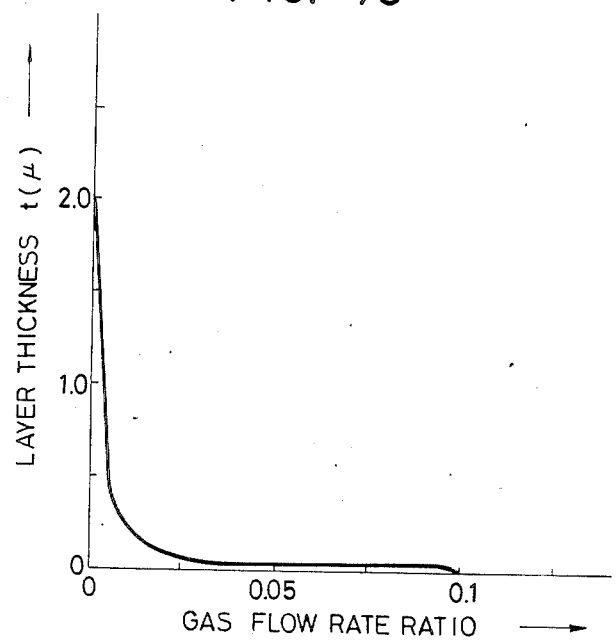

In formation of the boron containing layer, the mass flow controllers 2010 and 2009 of respective $B_2H_6/H_2$ and $NH_3$ were controlled by a computer (HP9845B) so that the flow rate of $B_2H_6/H_2$ should become as shown in FIG. 54 and that of $NH_3$ as shown in FIG. 73.

The layer thicknesses of the respective layers of each light-receiving member thus prepared were measured by an electron microscope to give the results as shown in Table 6E.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 71

Following the same conditions and the procedure as in Example 70 except for changing $NH_3$ gas used in Example 70 to NO gas, a-Si type light-receiving members for electrophotography were prepared (Sample Nos. 801E–804E).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained (Sample Nos. 801E–804E) was free from interference fringe pattern observed and proved to be satisfactory for practical application.

EXAMPLE 72

Following the same conditions and the procedure as in Example 70 except for changing $NH_3$ gas used in Example 70 to $CH_4$ gas, a-Si type light-receiving members for electrophotography were prepared (Sample Nos. 901E–904E).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained (Sample Nos. 901E–904E) was free from interference fringe pattern observed and proved to be satisfactory for practical application.

EXAMPLE 73

By means of a lathe, aluminum substrates (length (L): 357 mm, outerdiameter (r): 80 mm) were worked to have the surface characteristic as shown in Table 2A (Cylinder Nos. 104–106, 109).

Next, a-Si type light-receiving members for electrophotography were prepared according to various procedures using the film deposition device as shown in FIG. 20 in the same manner as in Example 64 except for changing the conditions to those as shown in Table 7E in which the surface layer material was made ZnS (Sample Nos. 1001E–1004E).

Figure 55:
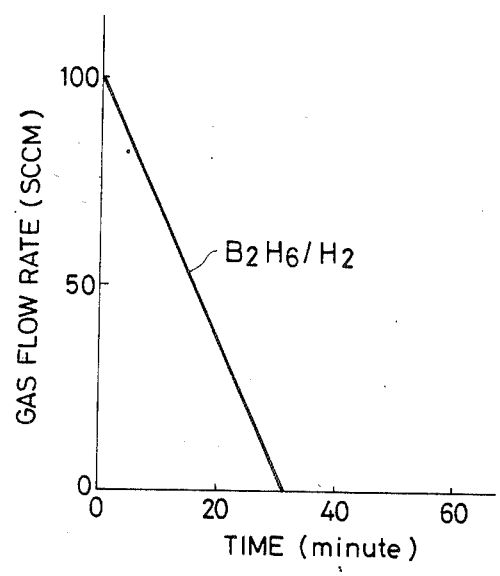
Figure 74:
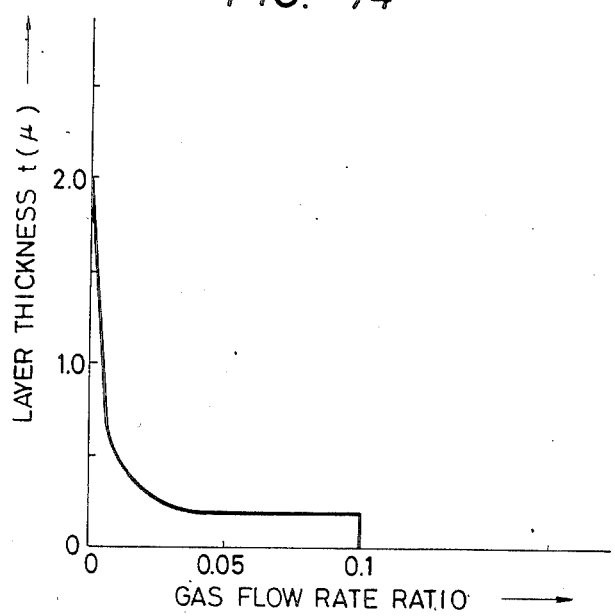

In formation of the boron containing layer, the mass flow controllers 2010 and 2009 of respective $B_2H_6/H_2$ and $CH_4$ were controlled by a computer (HP9845B) so that the flow rate of $B_2H_6/H_2$ should become as shown in FIG. 55 and that of $CH_4$ as shown in FIG. 74.

The layer thicknesses of the respective layers of each light-receiving member thus prepared were measured by an electron microscope to give the results as shown in Table 8E.

These light-receiving members for electrophotography as prepared above were subjected to image exposure by means of a device as shown in FIG. 26 (wavelength of laser beam: 780 nm, spot diameter 80 μm), followed by development and transfer to obtain an image. The resulting image was free from any interference fringe pattern observed and proved to be satisfactory for practical application.

EXAMPLE 74

Following the same conditions and the procedure as in Example 73 except for changing $CH_4$ gas used in Example 73 to NO gas, a-Si type light-receiving members for electrophotography were prepared (Sample Nos. 1101E-1104E).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained (Sample Nos. 1101E-1104E) was free from interference fringe pattern observed and proved to be satisfactory for practical application.

EXAMPLE 75

Following the same conditions and the procedure as in Example 73 except for changing $CH_4$ gas used in Example 73 to $NH_3$ gas, a-Si type light-receiving members for electrophotography were prepared (Sample Nos. 1201E-1204E).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained (Sample Nos. 1201E-1204E) was free from interference fringed pattern observed and proved to be satisfactory for practical application.

EXAMPLE 76

By means of a lathe, aluminum substrates (length (L): 357 mm, outerdiameter (r): 80 mm) were worked to have the surface characteristic as shown in Table 2A (Cylinder Nos. 104-106, 109).

Next, a-Si type light-receiving members for electrophotography were prepared according to various procedures using the film deposition device as shown in FIG. 20 in the same manner as in Example 64 except for changing the conditions to those as shown in Table 9E in which the surface layer material was made $Al_2O_3$ (Sample Nos. 1301E-1304E).

Figure 56:
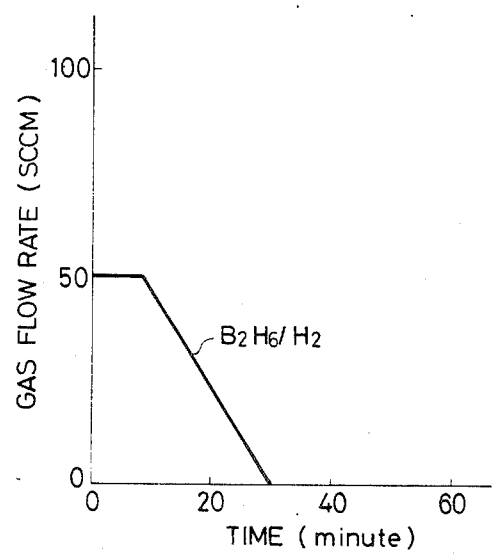

In formation of the boron containing layer, the mass flow controllers 2010 and 2009 of respective $B_2H_6/H_2$ and NO were controlled by a computer (HP9845B) so that the flow rate of $B_2H_6/H_2$ should become as shown in FIG. 56 and that of NO as shown in FIG. 63.

The layer thicknesses of the respective layers of each light-receiving member thus prepared were measured by an electron microscope to give the results as shown in Table 10E.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 77

Following the same conditions and the procedure as in Example 76 except for changing NO gas used in Example 76 to $NH_3$ gas, a-Si type light-receiving members for electrophotography were prepared (Sample Nos. 1401E-1404E).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained (Sample Nos. 1401E-1404E) was free from interference fringe pattern observed and proved to be satisfactory for practical application.

EXAMPLE 78

Following the same conditions and the procedure as in Example 76 except for changing NO gas used in Example 76 to $CH_4$ gas, a-Si type light-receiving members for electrophotography were prepared (Sample Nos. 1501E-1504E).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained (Sample Nos. 1501E-1504E) was free from interference fringe pattern observed and proved to be satisfactory for practical application.

EXAMPLE 79

By means of a lathe, aluminum substrates (length (L): 357 mm, outerdiameter (r): 80 mm) were worked to have the surface characteristic as shown in Table 2A (Cylinder Nos. 104-106, 109).

Next, a-Si type light-receiving members for electrophotography were prepared according to various procedures using the film deposition device as shown in FIG. 20 in the same manner as in Example 64 except for changing the conditions to those as shown in Table 11E in which the surface layer material was made $CeF_3$ (Sample Nos. 1601E-1604E).

Figure 50:
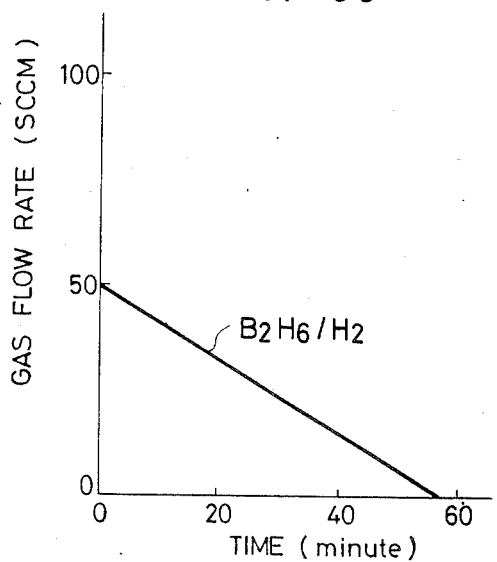
Figure 75:
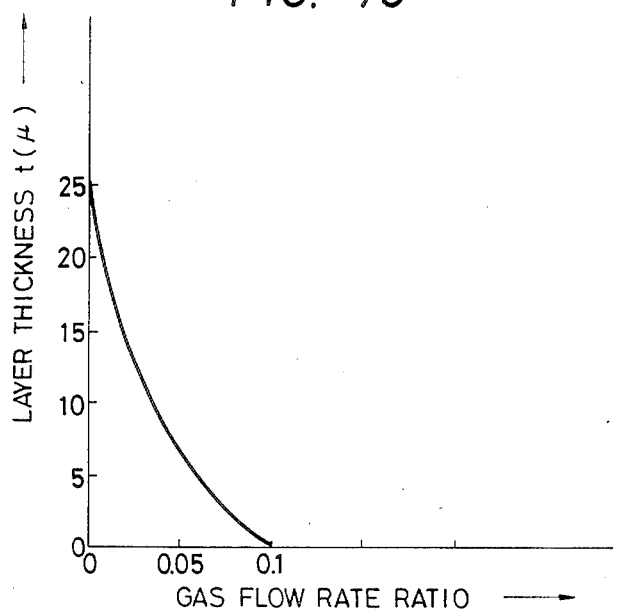

In formation of the boron containing layer, the mass flow controllers 2010 and 2009 of respective $B_2H_6/H_2$ and $NH_3$ were controlled by a computer (HP9845B) so that the flow rate of $B_2H_6/H_2$ should become as shown in FIG. 50 and that of $NH_3$ as shown in FIG. 75.

The layer thicknesses of the respective layers of each light-receiving member thus prepared were measured by an electron microscope to give the results as shown in Table 12E.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 80

Following the same conditions and the procedure as in Example 79 except for changing $NH_3$ gas used in Example 79 to NO gas, a-Si type light-receiving members for electrophotography were prepared (Sample Nos. 1701E-1704E).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained (Sample Nos. 1701E-1704E) was free from interference fringe pattern observed and proved to be satisfactory for practical application.

EXAMPLE 81

Following the same conditions and the procedure as in Example 79 except for changing NH$_3$ gas used in Example 79 to CH$_4$ gas, a-Si type light-receiving members for electrophotography were prepared (Sample Nos. 1801E-1804E).

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained (Sample Nos. 1801E-1804E) was free from interference fringe pattern observed and proved to be satisfactory for practical application.

EXAMPLE 82

Examples 64 to 81 were repeated except that PH$_3$ gas diluted with H$_2$ to 3000 vol. ppm was used in place of B$_2$H$_6$ gas diluted with H$_2$ to 3000 vol. ppm to prepare light-receiving members for electrophotography (Sample Nos. 1901E-1950E).

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. In any of the Samples No. 1901E-1950E, the image was free from any interference fringe pattern observed and proved to be satisfactory for practical application.

EXAMPLE 83

By use of an aluminum substrate worked by a lathe to have the surface characteristic as shown in Table 2A (Cylinder No. 104), with the surface layer material and layer thickness being as shown in Table 30A, under otherwise the same conditions as in Example 64, a-Si type light-receiving members for electrophotography were prepared (Sample Nos. 2701E-2722E).

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained was free from interference fringe pattern observed and proved to be satisfactory for practical application.

EXAMPLE 84

By means of a lathe, aluminum substrates (length (L): 357 mm, outerdiameter (r): 80 mm) were worked under the conditions as shown in Table 2A (Cylinder Nos. 104–106, 109) to have the surface characteristic as shown in FIG. 21.

Next, a-Si type light-receiving members for electrophotography were prepared following predetermined procedures using the film deposition device as shown in FIG. 20 under the conditions as shown in Table 1F. (Sample Nos. 101F-104F).

Figure 47:
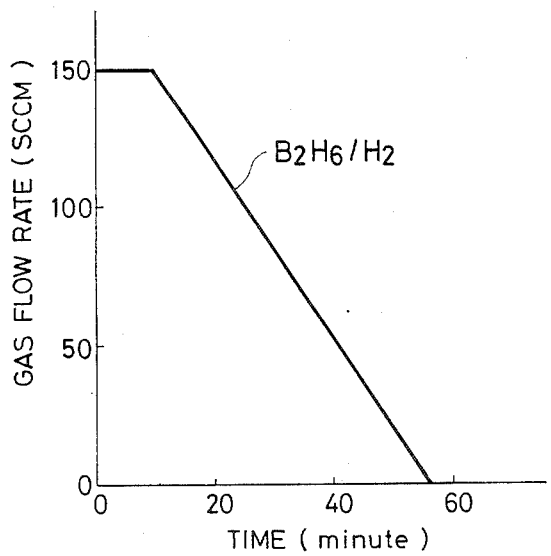

In preparation of the first layer, the mass flow controllers 2007, 2008 and 2010 controlled by a computer (HP9845B) so that the flow rates of respective gases of GeH$_4$, SiH$_4$ and B$_b$H$_6$/H$_2$ might be as shown in FIG. 22 and FIG. 47. The surface layer was prepared in the same manners as in Example 1.

The layer thicknesses of the respective layers of each light-receiving member thus prepared were measured by an electron microscope to give the results as shown in Table 2F.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. In any of the Samples N. 101F-104F, the image was free from any interference fringe pattern observed and proved to be satisfactory for practical application.

EXAMPLE 85

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 under the conditions as shown in Table 1F. (Sample Nos. 201F-204F).

Figure 48:
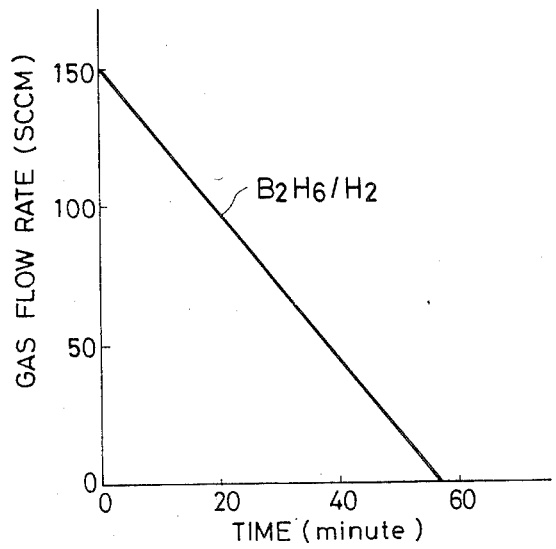

In preparation of the first layer, the mass flow controllers 2007, 2008 and 2010 controlled by a computer (HP9845B) so that the flow rates of respective gases of GeH$_4$, SiH$_4$ and B$_2$H$_6$/H$_2$ might be as shown in FIG. 23 and in FIG. 48.

The layer thicknesses of the respective layers of each light-receiving member thus prepared were measured by an electron microscope to give the results as shown in Table 3F.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. In any of the Sample Nos. 201F-204F, the image was free from any interference fringe pattern observed and proved to be satisfactory for practical application.

EXAMPLE 86

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 84 except for changing the conditions to those as shown in Table 4F in which the surface layer material was made TiO$_2$ (Sample Nos. 301F-304F).

Figure 49:
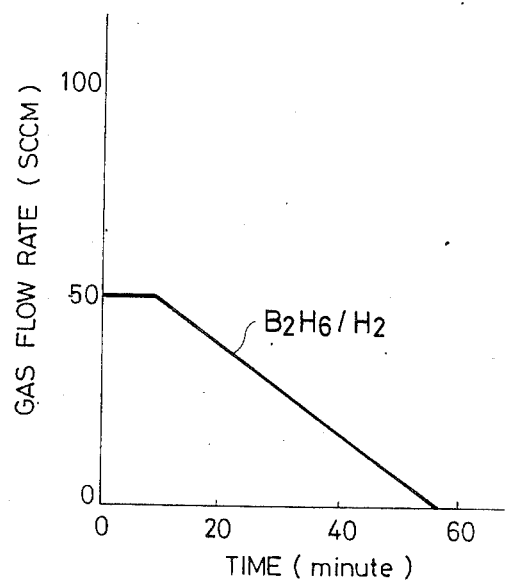

In preparation of the first layer, the mass flow controllers 2007, 2008 and 2010 controlled by a computer (HP9845B) so that the flow rates of respective gases of GeH$_4$, SiH$_4$ and B$_2$H$_6$/H$_2$ might be as shown in FIG. 24 and FIG. 49.

The layer thicknesses of the respective layers of each light-receiving member thus prepared were measured by an electron microscope to give the results as shown in Table 5F.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. In any of the Sample Nos. 301F–304F, and proved to be satisfactory for practical application.

EXAMPLE 87

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared following predetermined procedures using the film deposition device as shown in FIG. 20 under the conditions as shown in Table 4F (Sample Nos. 401F–404F).

In preparation of the first layer, the mass flow controllers 2007, 2008 and 2010 controlled by a computer (HP9845B) so that the flow rates of respective gases of GeH$_4$, SiH$_4$ and B$_2$H$_6$/H$_2$ might be as shown in FIG. 25 and FIG. 50.

The layer thicknesses of the respective layers of each light-receiving member thus prepared were measured by an electron microscope to give the results as shown in Table 6F.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. In any of the Sample Nos. 401F–404F, the image was free from any interference fringe pattern observed and proved to be satisfactory for practical application.

EXAMPLE 88

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 84 except for changing the conditions to those as shown in Table 7F in which the surface layer material was made CeO$_2$. (Sample Nos. 501F–504F).

Figure 51:
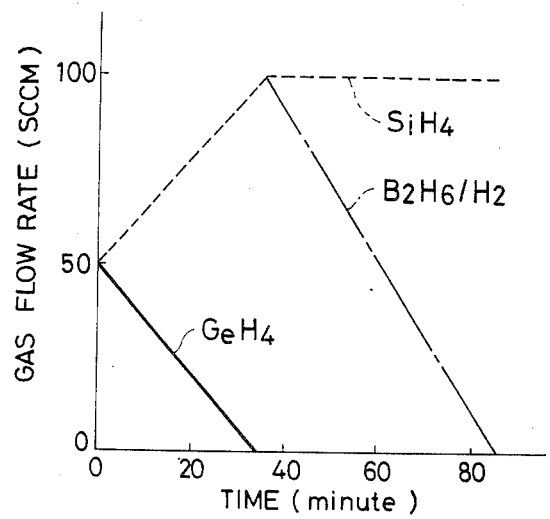

In preparation of the first layer and layer A, the mass flow controllers 2007, 2008 and 2010 were controlled by a computer (HP9845B) so that the flow rates of respective gases of GeH$_4$, SiH$_4$ and B$_2$H$_6$/H$_2$ might be as shown in FIG. 51.

The layer thicknesses of the respective layers of each light-receiving member thus prepared were measured by an electron microscope to give the results as shown in Table 8F.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the images obtained was free from any interference fringe pattern observed and proved to be satisfactory for practical application.

EXAMPLE 89

By means of a lathe, aluminum substrates (length (L): 357 mm, outerdiameter (r): 80 mm) were worked to the surface characteristics as shown in Table 2A (Cylinder Nos. 104 106, 109).

Next, a-Si type light-receiving members for electrophotography were prepared according to various procedures using the film deposition device as shown in FIG. 20 in the same manner as in Example 84 except for changing the conditions to those as shown in Table 9F in which the surface layer material was made ZnS (Sample Nos. 601F–604F).

Figure 52:
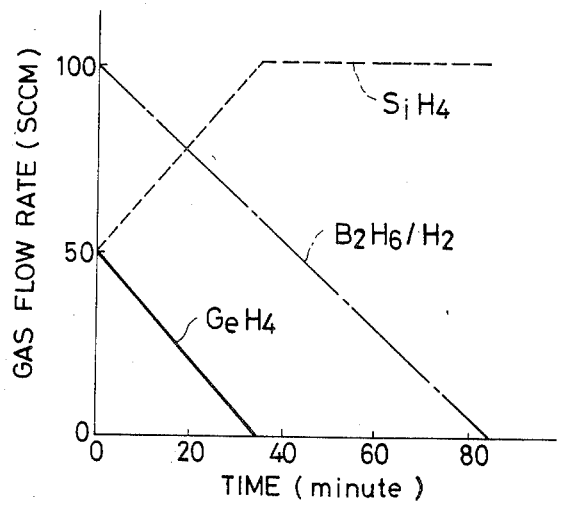

In preparation of the first layer and layer A, the mass flow controllers 2007, 2008 and 2010 were controlled by a computer (HP9845B) so that the flow rates of respective gases of GeH$_4$, SiH$_4$ and B$_2$H$_6$/H$_2$ might be as shown in FIG. 52.

The layer thicknesses of the respective layers of each light-receiving member thus prepared were measured by an electron microscope to give the results as shown in Table 10F.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satifactory for practical application.

EXAMPLE 90

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 84 except for changing the conditions to those as shown in Table 11F in which the surface layer material was made Al$_2$O$_3$ (Sample Nos. 701F–704F).

Figure 53:
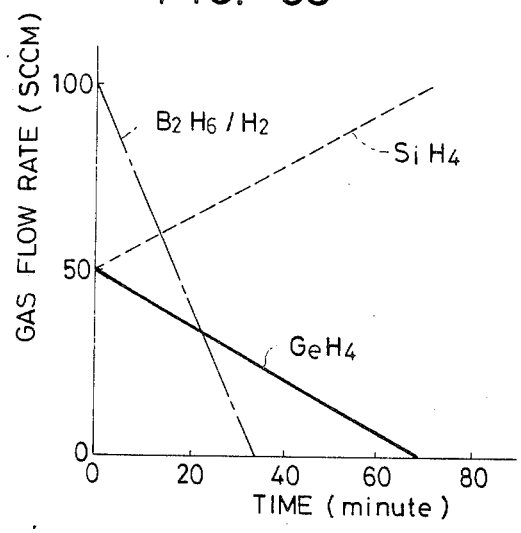

In preparation of the first layer, the mass flow controllers 2007, 2008 and 2010 controlled by a computer (HP9845B) so that the flow rates of respective gases of GeH$_4$, SiH$_4$ and B$_2$H$_6$/H$_2$ might be as shown in FIG. 24 and FIG. 53.

The layer thicknesses of the respective layers of each light-receiving member thus prepared were measured by an electron microscope to give the results as shown in Table 12F.

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. In any of the Sample Nos. 701F–704F, the image was free from any interference fringe pattern observed and proved to be satisfactory for practical application.

EXAMPLE 91

Following the same conditions and the procedure as in Example 84 except for changing NO gas used in Example 84 to NH$_3$ gas, a-Si type light-receiving members for electrophotography were prepared (Sample Nos. 801F–804F).

These light-receiving members for electrophotography as prepared above were subjected to image exposure by means of a device as shown in FIG. 26 (wavelength of laser beam: 780 nm, spot diameter 80 $\mu$m), followed by development and transfer to obtain an image. Any of the Sample Nos. 801F–804F, the image was free from interference fringe pattern observed and proved to be satisfactory for practical application.

EXAMPLE 92

Following the same conditions and the procedure as in Example 84 except for changing NO gas used in Example 84 to CH₄ gas, a-Si type light-receiving members for electrophotography were prepared (Sample Nos. 901F-904F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 901F-904F, the image was free from interference fringe pattern observed and proved to be satisfactory for practical application.

EXAMPLE 93

Following the same conditions and the procedure as in Example 86 except for changing NH₃ gas used in Example 86 to NO gas, a-Si type light-receiving members for electrophotography were prepared (Sample Nos. 1001F-1004F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 1001F-1004F, the image was free from interference fringe pattern observed and proved to be satisfactory for practical application.

EXAMPLE 94

Next, a-Si type light-receiving members for electrophotography were prepared according to various procedures using the film deposition device as shown in FIG. 20 in the same manner as in Example 84 except for changing the conditions to those as shown in Table 15F in which the surface layer material was made MgF₂ (Sample Nos. 1701F-1704F).

The mass controllers 2007, 2008, 2010 and 2009 of respective SiH₄, GeH₄, B₂H₆/H₂ and CH₄ were controlled by a computer (HP9845B) so that the flow rates of SiH₄, GeH₄, B₂H₆/H₂ may be as shown in FIG. 53, and also the flow rate of CH₄ for the carbon atom containing layer as shown in FIG. 74.

The layer thicknesses of the respective layers of each light-receiving member thus prepared were measured by an electron microscope to give the results as shown in Table 16F.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

Following the same conditions and the procedure as in Example 86 except for changing NH₃ gas used in Example 86 to CH₄ gas, a-Si type light-receiving members for electrophotography were prepared (Sample Nos. 1101F-1104F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 1101F-1104F, the image was free from interference pattern observed and proved to be satisfactory for practical application.

EXAMPLE 95

Following the same conditions and the procedure as in Example 88 except for changing CH₄ gas used in Example 88 to NO gas, a-Si type light-receiving members for electrophotography were prepared (Sample Nos. 1201F-1204F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 1201E-1204F, the image was free from interference fringe pattern observed and proved to be satisfactory for practical application.

EXAMPLE 96

Following the same conditions and the procedure as in Example 88 except for changing CH₄ gas used in Example 88 to NH₃ gas, a-Si type light-receiving members for electrophotography were prepared (Sample Nos. 1301F-1304F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 1301F-1304F, the image was free from interference pattern observed and proved to be satisfactory for practical application.

EXAMPLE 97

By means of a lathe, aluminum substrates (length (L): 357 mm, outerdiameter (r): 80 mm) were worked to the surface characteristics as shown in Table 2A (Cylinder Nos. 104-106, 109).

Next, a-Si type light-receiving members for electrophotography were prepared according to various procedures using the film deposition device as shown in FIG. 20 in the same manner as in Example 84 except for changing the conditions to those as shown in Table 13F in which the surface layer material was made CeF₃ (Sample Nos. 1401F-1404F).

Figure 76:
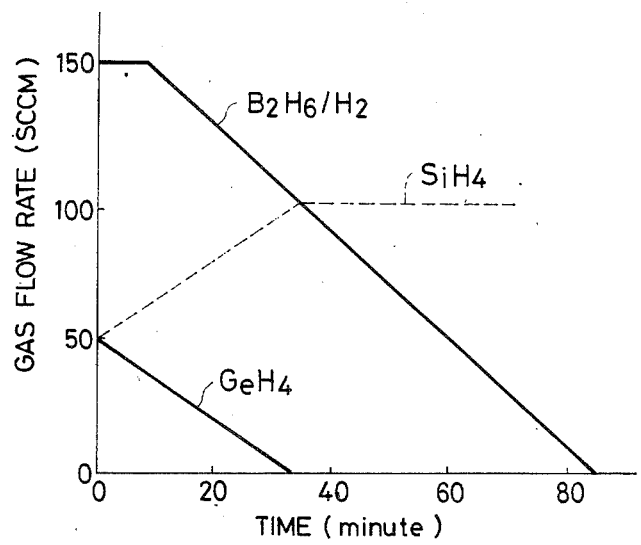

The mass controllers 2007, 2008, 2010 and 2009 of respective SiH₄, GeH₄, B₂H₆/H₂ and NH₃ were controlled by a computer (HP9845B) so that the flow rates of SiH₄, GeH₄, B₂H₆/H₂ may be as shown in FIG. 76, and also the flow rate of NH₃ for the nitrogen atom containing layer as shown in FIG. 73.

The layer thicknesses of the respective layers of each light-receiving member thus prepared were measured by an electron microscope to give the results as shown in Table 14F.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 98

Following the same conditions and the procedure as in Example 97 except for changing $NH_3$ gas used in Example 97 to NO gas, a-Si type light-receiving members for electrophotography were prepared (Sample Nos. 1501F–1504F).

These light-receiving members for electrophotography as prepared above were subjected to image exposure by means of a device as shown ir FIG. 26 (wavelength of laser beam: 780 nm, spot diameter 80 μm), followed by development and transfer to obtain an image. Any of the Sample Nos. 1501F–1504F, the image was free from interference pattern observed and proved to be satisfactory for practical application.

EXAMPLE 99

Following the same conditions and the procedure as in Example 97 except for changing $NH_3$ gas used in Example 97 to $CH_4$ gas, a-Si type light-receiving members for electrophotography were prepared (Sample Nos. 1601F–1604F).

These light-receiving members for electrophotography as prepared above were subjected to image exposure by means of a device as shown in FIG. 26 (wavelength of laser beam: 780 nm, spot diameter 80 μm), followed by development and transfer to obtain in an image. Any of the Sample Nos. 1601F–1604F, the image was free from interference pattern observed and proved to be satisfactory for practical application.

EXAMPLE 100

By means of a lathe, aluminum substrates (length (L): 357 mm, outerdiameter (r): 80 mm) were worked to the surface characteristics as shown in Table 2A (Cylinder Nos. 104–106, 109).

EXAMPLE 101

Following the same conditions and the procedure as in Example 100 except for changing $CH_4$ gas used in Example 100 to NO gas, a-Si type light-receiving members for electrophotography were prepared (Sample Nos. 1801F–1804F).

These light-receiving members for electrophotography as prepared above were subjected to image exposure by means of a device as shown in FIG. 26 (wavelength of laser beam: 780 nm, spot diameter 80 μm), followed by development and transfer to an image. Any of the Sample Nos. 1801F–1804F, the image was free from interference fringe pattern observed proved to be satisfactory for practical application.

EXAMPLE 102

Following the same conditions and the procedure as in Example 100 except for changing $CH_4$ gas used in Example 100 to $NO_3$ gas, a-Si type light-receiving members for electrophotography were prepared (Sample Nos. 1901F–1904F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 1901F–1904F, the image was free from interference pattern observed and proved to be satisfactory for practical application.

EXAMPLE 103

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 94 except for changing the conditions to those as shown in Table 17F in which the surface layer material was made $SiO_2$ (Sample Nos. 2001F–2004F).

Figure 77:
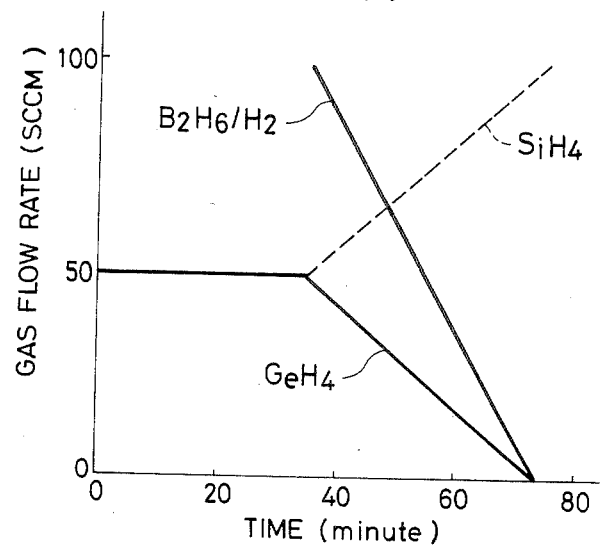

The mass controllers 2007, 2008, 2010 and 2009 of respective $SiH_4$, $GeH_4$, $B_2H_6/H_2$ and NO were controlled by a computer (HP9845B) so that the flow rates of $SiH_4$, $GeH_4$, $B_2H_6/H_2$ may be as shown in FIG. 77, and also the flow rate of NO for the oxygen atom containing layer as shown in FIG. 63.

The layer thicknesses of the respective layers of each light-receiving member thus prepared were measured by an electron microscope to give the results as shown in Table 18F.

These light-receiving members for electrophotography as prepared above were subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 104

Following the same conditions and the procedure as in Example 103 except for changing NO gas used in Example 103 to $NH_3$ gas, a-Si type light-receiving members for electrophotography were prepared (Sample Nos. 2101F–2104F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 2101F–2104F, the image was free from interference fringe pattern observed and proved to be satisfactory for practical application.

EXAMPLE 105

Following the same conditions and the procedure as in Example 103 except for changing NO gas used in Example 103 to $CH_4$ gas, a-Si type light-receiving members for electrophotography were prepared (Sample Nos. 2201F–2204F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 2201F–2204F, the image was free from interference fringe pattern observed and proved to be satisfactory for practical application.

EXAMPLE 106

By means of a lathe, aluminum substrates (length (L): 357 mm, outerdiameter (r): 80 mm) were worked to the surface characteristics as shown in Table 2A (Cylinder Nos. 104–106, 109).

Next, a-Si type light-receiving members for electrophotography were prepared according to various procedures using the film deposition device as shown in FIG. 20 in the same manner as in Example 84 except for changing the conditions to those as shown in Table 19F in which the surface layer material was made ZrO$_2$ and TiO$_2$ (weight ratio 6 : 1) (Sample Nos. 2301F–2304F).

Figure 78:
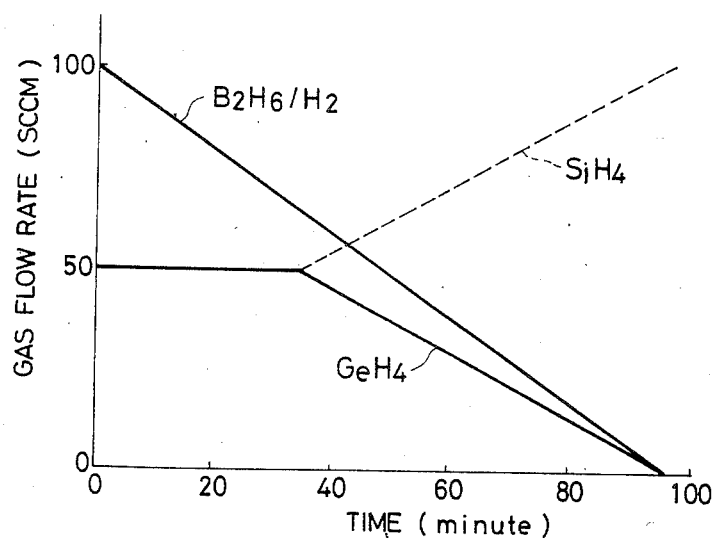

The mass controllers 2007, 2008, 2010 and 2009 of respective SiH$_4$, GeH$_4$, B$_2$H$_6$/H$_2$ and NH$_3$ were controlled by a computer (HP9845B) so that the flow rates of SiH$_4$, GeH$_4$, B$_2$H$_6$/H$_2$ may be as shown in FIG. 78, and also the flow rate of NH$_3$ for the nitrogen atom containing layer as shown in FIG. 75.

The layer thicknesses of the respective layers of each light-receiving member thus prepared were measured by an electron microscope to give the results as shown in Table 20F.

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 107

Following the same conditions and procedure as in Example 106 except for changing NH$_3$ gas used in Example 106 to NO gas, a-Si type light-receiving members for electrophotography were prepared (Sample Nos. 2401F–2404F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 2401F–2404F, the image was free from interference fringe pattern observed and proved to be satisfactory for practical application.

EXAMPLE 108

Following the same conditions and the procedure as in Example 106 except for changing NH$_3$ gas used in Example 106 to CH$_4$ gas, a-Si type light-receiving members for electrophotography were prepared (Sample Nos. 2501F–2504F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the Sample Nos. 2501F–2504F, the image was free from interference fringe pattern observed and proved to be satisfactory for practical application.

EXAMPLE 109

Examples 84 to 108 were repeated except that PH$_3$ gas diluted with H$_2$ to 3000 vol. ppm was used in place of B$_2$H$_6$ gas diluted with H$_2$ to 3000 vol. ppm to prepare light-receiving members for electrophotography (Sample Nos. 2601F–2700F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

EXAMPLE 110

By use of an aluminum substrate worked by a lathe to have the surface characteristic as shown in Table 2A (Cylinder No. 104), with the surface layer material and layer thickness being as shown in Table 304, under otherwise the same conditions as in Example 84, a-Si type light-receiving members for electrophotography were prepared (Sample Nos. 2701F–2722F).

These light-receiving members for electrophotography as prepared above were subjected to image exposure by means of a device as shown in FIG. 26 (wavelength of laser beam: 780 nm, spot diameter 80 μm), followed by development and transfer to obtain an image. Any of the images obtained was free from interference fringe pattern observed and proved to be satisfactory for practical application.

TABLE 1A

| Layer constitution | Starting gas | Gas flow rate (SCCM) | Discharging power (W) | Layer thickness (μm) |
|---|---|---|---|---|
| First layer | H$_2$<br>GeH$_4$<br>SiH$_4$<br>NO | 300<br>50<br>100 | 160 | 5 |
| Second layer | H$_2$<br>SiH$_4$ | 300<br>300 | 150 | 20 |
| Surface layer | Material for surface layer ZrO$_2$ | | 300 | 0.0975 |

TABLE 2A

| | Cylinder No. | 101 | 102 | 103 | 104 | 105 | 106 | 107 | 108 | 109 |
|---|---|---|---|---|---|---|---|---|---|---|
| Surface structure of Al cylinder | Pitch (μm) | 600 | 200 | 100 | 50 | 40 | 25 | 10 | 5.0 | 10 |
| | Depth (μm) | 1.0 | 10 | 1.8 | 2.1 | 1.7 | 0.8 | 0.2 | 2 | 0.6 |
| | Angle (degree) | 0.2 | 5.7 | 2.1 | 5.0 | 4.8 | 3.7 | 2.3 | 38 | 6.8 |

TABLE 3A

| Sample No.<br>No.* | 111A<br>101 | 112A<br>102 | 113A<br>103 | 114A<br>104 | 115A<br>105 | 116A<br>106 | 117A<br>107 | 118A<br>108 |
|---|---|---|---|---|---|---|---|---|
| Difference in layer thickness (μm) | 0.06 | 0.08 | 0.16 | 0.18 | 0.41 | 0.31 | 0.11 | 3.2 |
| Interference | x | x | O | O | ◎ | ◎ | Δ | x |

TABLE 3A-continued

| Sample No. No.* | 111A 101 | 112A 102 | 113A 103 | 114A 104 | 115A 105 | 116A 106 | 117A 107 | 118A 108 |
|---|---|---|---|---|---|---|---|---|
| fringe | | | | | | | | |

*Cylinder No.
(The same note applies to other subsequent tables.)
x Practically unusable
Δ Practically satisfactory
○ Practically good
◎ Practically excellent

TABLE 4A

| Sample No. No.* | 121A 101 | 122A 102 | 123A 103 | 124A 104 | 125A 105 | 126A 106 | 127A 107 | 128A 108 |
|---|---|---|---|---|---|---|---|---|
| Difference in layer thickness of first layer (μm) | 0.05 | 0.041 | 0.1 | 0.19 | 0.31 | 0.22 | 0.1 | 2.6 |
| Difference in layer thickness of second layer (μm) | 0.06 | 0.07 | 0.11 | 0.22 | 0.41 | 0.32 | 0.1 | 3.6 |
| Interference fringe | x | x | ○ | ◎ | ◎ | ◎ | Δ | x | x Practically unusable
Δ Practically satisfactory
○ Practically good
◎ Practically excellent

TABLE 5A

| Layer constitution | Starting gas | Flow rate (SCCM) | High frequency power (W) | Layer thickness (μm) |
|---|---|---|---|---|
| First layer | $H_2$ | 300 | 160 | 3 |
| | $SiH_4$ | 100 | | |
| | $GeH_4$ | 50 | | |
| | $NH_3$ | 30 | | |
| Second layer | $H_2$ | 300 | 300 | 20 |
| | $SiH_4$ | 300 | | |
| Surface layer | Material for surface layer $TiO_2$ | | 300 | 0.0863 |

TABLE 6A

| Sample No. No.* | 401A 101 | 402A 102 | 403A 103 | 404A 104 | 405A 105 | 406A 106 | 407A 107 | 408A 108 |
|---|---|---|---|---|---|---|---|---|
| Difference in layer thickness (μm) | 0.07 | 0.08 | 0.17 | 0.20 | 0.42 | 0.33 | 0.11 | 2.8 |
| Interference fringe | x | x | ○ | ◎ | ◎ | ◎ | Δ | x | x Practically unusable
Δ Practically satisfactory
○ Practically good
◎ Practically excellent

TABLE 7A

| Layer constitution | Starting gas | Flow rate (SCCM) | High frequency power (W) | Layer thickness (μm) |
|---|---|---|---|---|
| First layer | $H_2$ | 300 | 160 | 5 |
| | $SiH_4$ | 100 | | |
| | $GeH_4$ | 50 | | |
| | $NH_3$ | 15 | | |
| Second layer | $H_2$ | 300 | 200 | 20 |
| | $SiH_4$ | 300 | | |
| | $NH_3$ | 15 | | |
| Surface layer | Material for surface layer $CeO_2$ | | 300 | 0.0874 |

TABLE 8A

| Sample No. No.* | 501A 101 | 502A 102 | 503A 103 | 504A 104 | 505A 105 | 506A 106 | 507A 107 | 508A 108 |
|---|---|---|---|---|---|---|---|---|
| Difference in layer thickness of first layer (μm) | 0.05 | 0.07 | 0.1 | 0.21 | 0.31 | 0.22 | 0.1 | 2.6 |
| Difference in layer thickness of second layer (μm) | 0.06 | 0.08 | 0.1 | 0.2 | 0.41 | 0.35 | 0.1 | 3.5 |
| Interference fringe | x | x | ○ | ◎ | ◎ | ◎ | Δ | x | x Practically unusable
Δ Practically satisfactory
○ Practically good
◎ Practically excellent

TABLE 9A

| Layer constitution | Starting gas | Flow rate (SCCM) | High frequency power (W) | Layer thickness (μm) |
|---|---|---|---|---|
| First layer | $H_2$ | 300 | 170 | 2.8 |
| | $SiH_4$ | 50 | | |
| | $GeH_4$ | 100 | | |
| | $CH_4$ | 15 | | |
| Second layer | $H_2$ | 300 | 200 | 21 |
| | $SiH_4$ | 300 | | |
| | $CH_4$ | 15 | | |
| Surface layer | Material for surface layer ZnS | | 300 | 0.0871 |

TABLE 10A

| Sample No. No.* | 901A 101 | 902A 102 | 903A 103 | 904A 104 | 905A 105 | 906A 106 | 907A 107 | 908A 108 |
|---|---|---|---|---|---|---|---|---|
| Difference in layer thickness of first layer (μm) | 0.07 | 0.09 | 0.16 | 0.19 | 0.46 | 0.35 | 0.1 | 3.2 |
| Interference fringe | x | x | ○ | ○ | ◎ | ◎ | Δ | x | x Practically unusable
Δ Practically satisfactory
○ Practically good
◎ Practically excellent

TABLE 11A

| Layer constitution | Starting gas | Flow rate (SCCM) | High frequency power (W) | Layer thickness (μm) |
|---|---|---|---|---|
| First layer | $H_2$ | 300 | 170 | 5.1 |
| | $SiH_4$ | 100 | | |
| | $GeH_4$ | 60 | | |
| | $CH_4$ | 16 | | |
| Second layer | $H_2$ | 300 | 230 | 22 |
| | $SiH_4$ | 300 | | |
| Surface layer | Material for surface layer $Al_2O_3$ | | 300 | 0.120 |

TABLE 12A

| Sample No. | 1101A | 1102A | 1103A | 1104A | 1105A | 1106A | 1107A | 1108A |
|---|---|---|---|---|---|---|---|---|
| No.* | 101 | 102 | 103 | 104 | 105 | 106 | 107 | 108 |
| Difference in layer thickness of first layer (μm) | 0.05 | 0.06 | 0.1 | 0.22 | 0.31 | 0.21 | 0.1 | 2.7 |
| Difference in layer thickness of second layer (μm) | 0.07 | 0.08 | 0.11 | 0.35 | 0.45 | 0.31 | 0.1 | 3.5 |
| Interference fringe | x | x | ○ | ⊚ | ⊚ | ⊚ | Δ | x | x Practically unusable
Δ Practically satisfactory
○ Practically good
⊚ Practically excellent

TABLE 13A

| Sample No. | 1201A | 1202A | 1203A | 1204A | 1205A | 1206A | 1207A | 1208A |
|---|---|---|---|---|---|---|---|---|
| No.* | 101 | 102 | 103 | 104 | 105 | 106 | 107 | 108 |
| Difference in layer thickness (μm) | 0.06 | 0.08 | 0.16 | 0.18 | 0.41 | 0.31 | 0.11 | 3.2 |
| Interference fringe and electrophotographic characteristics | x | x | ○ | ○ | ⊚ | ⊚ | Δ | x | x Practically unusable
Δ Practically satisfactory
○ Practically good
⊚ Practically excellent

TABLE 14A

| Sample No. | 1301A | 1302A | 1303A | 1304A | 1305A | 1306A | 1307A | 1308A |
|---|---|---|---|---|---|---|---|---|
| No.* | 101 | 102 | 103 | 104 | 105 | 106 | 107 | 108 |
| Difference in layer thickness of first layer (μm) | 0.05 | 0.041 | 0.1 | 0.19 | 0.31 | 0.22 | 0.1 | 2.6 |
| Difference in layer thickness of second layer (μm) | 0.06 | 0.07 | 0.11 | 0.22 | 0.41 | 0.32 | 0.1 | 2.6 |
| Interference fringe and electrophotographic characteristics | x | x | ○ | ⊚ | ⊚ | ⊚ | Δ | x | x Practically unusable
Δ Practically satisfactory
○ Practically good
⊚ Practically excellent

TABLE 15A

| Layer constitution | Starting gas | Flow rate (SCCM) | High frequency power (W) | Layer thickness (μm) |
|---|---|---|---|---|
| First layer | $H_2$ | 300 | 160 | 3 |
| | $SiH_4$ | 50 | | |
| | $GeH_4$ | 100 | | |
| | $NH_3$ | 30~0 | | |
| Second layer | $H_2$ | 300 | 300 | 20 |
| | $SiH_4$ | 300 | | |
| Surface layer | Material for surface layer $CeF_3$ | | 300 | 0.123 |

TABLE 17A

| Layer constitution | Starting gas | Flow rate (SCCM) | High frequency power (W) | Layer thickness (μm) |
|---|---|---|---|---|
| First layer | $H_2$ | 300 | 160 | 5 |
| | $SiH_4$ | 100 | | |
| | $GeH_4$ | 50 | | |
| | $NH_3$ | 15~0 | | |
| Second layer | $H_2$ | 300 | 200 | 20 |
| | $SiH_4$ | 300 | | |
| | $NH_3$ | | | |
| Surface layer | Material for surface layer $MgF_2$ | | 300 | 0.141 |

TABLE 16A

| Sample No. | 1501A | 1502A | 1503A | 1504A | 1505A | 1506A | 1507A | 1508A |
|---|---|---|---|---|---|---|---|---|
| No.* | 101 | 102 | 103 | 104 | 105 | 106 | 107 | 108 |
| Difference in layer thickness (μm) | 0.07 | 0.08 | 0.17 | 0.20 | 0.42 | 0.33 | 0.11 | 2.8 |
| Interference fringe and electrophotographic characteristics | x | x | ○ | ⊚ | ⊚ | ⊚ | Δ | x | x Practically unusable
Δ Practically satisfactory
○ Practically good
⊚ Practically excellent

TABLE 18A

| Sample No. | 1701A | 1702A | 1703A | 1704A | 1705A | 1706A | 1707A | 1708A |
|---|---|---|---|---|---|---|---|---|
| No.* | 101 | 102 | 103 | 104 | 105 | 106 | 107 | 108 |
| Difference in layer thickness of first layer ($\mu$m) | 0.05 | 0.07 | 0.1 | 0.21 | 0.31 | 0.22 | 0.1 | 2.6 |
| Difference in layer thickness of second layer ($\mu$m) | 0.06 | 0.08 | 0.1 | 0.2 | 0.41 | 0.35 | 0.1 | 3.5 |
| Interference fringe and electrophotographic characteristics | x | x | O | ⊚ | ⊚ | ⊚ | Δ | x | x Practically unusable
Δ Practically satisfactory
O Practically good
⊚ Practically excellent

TABLE 19A

| Layer constitution | Starting gas | Flow rate (SCCM) | High frequency power (W) | Layer thickness ($\mu$m) |
|---|---|---|---|---|
| First layer | H$_2$ | 300 | 170 | 2.8 |
|  | SiH$_4$ | 100 |  |  |
|  | GeH$_4$ | 50 |  |  |
|  | CH$_4$ | 15~0 |  |  |
| Second layer | H$_2$ | 300 | 200 | 21 |
|  | Si$_4$ | 300 |  |  |
| Surface layer | Material for surface layer SiO$_2$ | | 300 | 0.131 |

TABLE 21A

| Layer constitution | Starting gas | Flow rate (SCCM) | High frequency power (W) | Layer thickness ($\mu$m) |
|---|---|---|---|---|
| First layer | H$_2$ | 300 | 170 | 5.1 |
|  | SiH$_4$ | 100 |  |  |
|  | GeH$_4$ | 60 |  |  |
|  | CH$_4$ | 16~0 |  |  |
| Second layer | H$_2$ | 300 | 230 | 22 |
|  | SiH$_4$ | 300 |  |  |
|  | CH$_4$ |  |  |  |
| Surface layer | Material for surface layer ZrO$_2$ | | 300 | 0.0975 |

TABLE 20A

| Sample No. | 1901A | 1902A | 1903A | 1904A | 1905A | 1906A | 1907A | 1908A |
|---|---|---|---|---|---|---|---|---|
| No.* | 101 | 102 | 103 | 104 | 105 | 106 | 107 | 108 |
| Difference in layer thickness ($\mu$m) | 0.07 | 0.09 | 0.16 | 0.19 | 0.46 | 0.35 | 0.1 | 3.2 |
| Interference fringe and electrophotographic characteristics | x | x | O | O | ⊚ | ⊚ | Δ | x | x Practically unusable
Δ Practically satisfactory
O Practically good
⊚ Practically excellent

TABLE 22A

| Sample No. | 2101A | 2102A | 2103A | 2104A | 2105A | 2106A | 2107A | 2108A |
|---|---|---|---|---|---|---|---|---|
| No.* | 101 | 102 | 103 | 104 | 105 | 106 | 107 | 108 |
| Difference in layer thickness of first layer ($\mu$m) | 0.05 | 0.06 | 0.1 | 0.22 | 0.31 | 0.21 | 0.1 | 2.7 |
| Difference in layer thickness of second layer ($\mu$m) | 0.07 | 0.08 | 0.11 | 0.35 | 0.45 | 0.31 | 0.1 | 3.5 |
| Interference fringe and electrophotographic characteristics | x | x | O | ⊚ | ⊚ | ⊚ | Δ | x | x Practically unusable
Δ Practically satisfactory
O Practically good
⊚ Practically excellent

TABLE 23A (Sample No. 2201A)

| Layer constitution | Gases employed | Flow rate (SCCM) | Flow rate ratio | Discharging power (W) | Layer formation rate (Å/sec) | Layer thickness ($\mu$) |
|---|---|---|---|---|---|---|
| First layer | SiH$_4$/He = 0.05 GeH$_4$/He = 0.05 NO | SiH$_4$ + GeH$_4$ = 50 | NO/(SiH$_4$ + GeH$_4$) = 3/10~0 | 150 | 12 | 1 |
| Second layer | SiH$_4$He = | SiH$_4$ = 50 |  | 150 | 12 | 20 |

TABLE 23A-continued (Sample No. 2201A)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| | 0.05 | | | | | |

TABLE 24A (Sample No. 2202A)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) = 2/10 \sim 0$ | 150 | 12 | 0.5 |
| Second layer | $SiH_4He = 0.05$ | $SiH_4 = 50$ | | 150 | 12 | 20 |

TABLE 25A (Sample No. 2203A)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) = 1/10 \sim 1/100$ | 160 | 14 | 5 |
| Second layer | $SiH_4He = 0.05$ | $SiH_4 = 50$ | $NO/SiH_4 = 1/100$ | 160 | 14 | 15 |

TABLE 26A (Sample No. 2204A)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) = 3/10 \sim 0$ | 160 | 14 | 1.0 |
| Second layer | $SiH_4He = 0.05$ | $SiH_4 = 50$ | | 160 | 12 | 15 |

TABLE 27A (Sample No. 2205A)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | $SiH_4/He = 0.05$<br>$GeH_4/He = 0.05$<br>NO | $SiH_4 + GeH_4 = 50$ | $NO/(SiH_4 + GeH_4) = 3/10 \sim 0$ | 170 | 15 | 1 |
| Second layer | $SiH_4He = 0.05$ | $SiH_4 = 50$ | | 170 | 15 | 20 |

TABLE 28A (Sample No. 2206A)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>NH$_3$ | SiH$_4$ + GeH$_4$ = 50 | NH$_3$/(SiH$_4$ + GeH$_4$) = 1/10~1/100 | 160 | 14 | 5 |
| Second layer | SiH$_4$/He = 0.05 | SiH$_4$ = 50 | NH$_3$/SiH$_4$ = 1/100 | 160 | 14 | 15 |

TABLE 29A (Sample No. 2201A)

| Layer constitution | Gases employed | Flow rate (SCCM) | Flow rate ratio | Discharging power (W) | Layer formation rate (Å/sec) | Layer thickness (μ) |
|---|---|---|---|---|---|---|
| First layer | SiH$_4$/He = 0.05<br>GeH$_4$/He = 0.05<br>CH$_4$ | SiH$_4$ + GeH$_4$ = 50 | CH$_4$/(SiH$_4$ + GeH$_4$) = 3/10~0 | 160 | 14 | 5 |
| Second layer | SiH$_4$He = 0.05<br>CH$_4$ | SiH$_4$ = 50 | CH$_4$/SiH$_4$ = 1/100 | 160 | 14 | 15 |

TABLE 30A

| Condition No. | 2701 | 2702 | 2703 | 2704 | 2705 | 2706 | 2707 | 2708 | 2709 | 2710 |
|---|---|---|---|---|---|---|---|---|---|---|
| Material for surface layer | ZrO$_2$ | | TiO$_2$ | | ZrO$_2$/Ti O$_2$ = 6/1 | | TiO$_2$/Zr O$_2$ = 3/1 | | CeO$_2$ | |
| Refractive index | 2.00 | | 2.26 | | 2.09 | | 2.20 | | 2.23 | |
| Layer thickness (μm) | 0.975 | 0.293 | 0.863 | 0.259 | 0.0933 | 0.280 | 0.0886 | 0.266 | 0.0874 | 0.262 |

| Condition No. | 2711 | 2712 | 2713 | 2714 | 2715 | 2716 | 2717 | 2718 | 2719 | 2720 | 2721 | 2722 |
|---|---|---|---|---|---|---|---|---|---|---|---|---|
| Material for surface layer | ZnS | | Al$_2$O$_3$ | | CeF$_3$ | | Al$_2$O$_3$/ZrO$_2$ = 1/1 | | MgF$_2$ | | SiO$_2$ | |
| Refractive index | 2.24 | | 1.63 | | 1.60 | | 1.68 | | 1.38 | | 1.49 | |
| Layer thickness (μm) | 0.871 | 0.261 | 0.120 | 0.359 | 0.123 | 0.366 | 0.116 | 0.348 | 0.141 | 0.424 | 0.131 | 0.393 |

TABLE 1B

| Layer constitution | Starting gas | Gas flow rate (SCCM) | Discharging power (W) | Deposition rate (Å/sec) | Layer thickness (μm) |
|---|---|---|---|---|---|
| First layer | H$_2$<br>GeH$_4$<br>SiH$_4$<br><br>NO | 300<br>100 → 0<br>0 → 100<br>GeH$_4$ + SiH$_4$ = 100<br>10 | 100 | 9 | 3 |
| Second layer | H$_2$<br>SiH$_4$ | 300<br>300 | 300 | 24 | 20 |
| Surface layer | Material for surface layer ZrO$_2$ | | 300 | 1 | 0.0975 |

TABLE 2B / TABLE 2B-continued

| | Sample No.<br>Al cylinder No. | 201B<br>104 | 202B<br>105 | 203B<br>106 | 204B<br>109 |
|---|---|---|---|---|---|
| Layer thickness of light-receiving layer | Difference in average layer thickness between center and both ends (μm) | 3.2 | 3.2 | 3.2 | 3.2 |
| | Difference in layer thickness of minute | 0.51 | 0.44 | 0.41 | 0.61 |

TABLE 2B-continued

| Sample No. | 201B | 202B | 203B | 204B |
|---|---|---|---|---|
| Al cylinder No. | 104 | 105 | 106 | 109 |
| portion (μm) | | | | |

TABLE 3B

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | $CH_4$ | 10 | | | |
| Second layer | $H_2$ | 300 | 300 | 24 | 20 |
| | $SiH_4$ | 300 | | | |
| Surface layer | | Material for surface layer $TiO_2$ | 300 | 1 | 0.0863 |

TABLE 4B

| Sample No. | 401B | 402B | 403B | 404B |
|---|---|---|---|---|
| Al cylinder No. | 104 | 105 | 106 | 109 |
| Layer thickness of light-receiving layer | Difference in average layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 5B

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| | $NH_3$ | 10 | | | |
| Second layer | $H_2$ | 300 | 300 | 24 | 20 |
| | $SiH_4$ | 300 | | | |
| Surface layer | | Material for surface layer $CeO_2$ | 300 | 1 | 0.0874 |

TABLE 6B

| Sample No. | 601B | 602B | 603B | 604B |
|---|---|---|---|---|
| Al cylinder No. | 104 | 105 | 106 | 109 |
| Layer thickness of light-receiving layer | Difference in average layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 7B

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| | $NH_3$ | 6 | | | |
| Second layer | $H_2$ | 300 | 300 | 24 | 20 |
| | $SiH_4$ | 300 | | | |
| | $NH_3$ | 6 | | | |
| Surface layer | | Material for surface layer ZnS | 300 | 1 | 0.0871 |

TABLE 8B

| Sample No. | 801B | 802B | 803B | 804B |
|---|---|---|---|---|
| Al cylinder No. | 104 | 105 | 106 | 109 |
| Layer thickness of light-receiving layer | Difference in average layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 9B

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |

TABLE 9B-continued

| Layer constitution | Starting gas | Gas flow rate (SCCM) | Discharging power (W) | Deposition rate (Å/sec) | Layer thickness (μm) |
|---|---|---|---|---|---|
| | GeH₄ | 100 → 0 | | | |
| | SiH₄ | 0 → 100 | | | |
| | | GeH₄ + SiH₄ = 100 | | | |
| | NO | 20 → 0 | | | |
| Second layer | H₂ | 300 | 300 | 24 | 20 |
| | SiH₄ | 300 | | | |
| Surface layer | | Material for surface layer ZrO₂ | 300 | 1 | 0.0975 |

TABLE 10B

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 9 | 3 |
| | GeH₄ | 100 → 0 | | | |
| | SiH₄ | 0 → 100 | | | |
| | | GeH₄ + SiH₄ = 100 | | | |
| | NH₃ | 20 → 0 | | | |
| Second layer | H₂ | 300 | 300 | 24 | 20 |
| | SiH₄ | 300 | | | |
| Surface layer | | Material for surface layer ZrO₂ | 300 | 1 | 0.0975 |

TABLE 11B

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 9 | 3 |
| | GeH₄ | 100 → 0 | | | |
| | SiH₄ | 0 → 100 | | | |
| | | GeH₄ + SiH₄ = 100 | | | |
| | NO | 10 → * | | | |
| Second layer | H₂ | 300 | 300 | 24 | 20 |
| | SiH₄ | 300 | | | |
| | NO | * → 0 | | | |
| Surface layer | | Material for surface layer ZrO₂ | 300 | 1 | 0.0975 |

NOTE:
*represents the continuity of change in the gas flow rate. The same note applies to Table 13C.

TABLE 12B

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 9 | 3 |
| | GeH₄ | 100 → 0 | | | |
| | SiH₄ | 0 → 100 | | | |
| | | GeH₄ + SiH₄ = 100 | | | |
| | CH₄ | 10 → 0 | | | |
| Second layer | H₂ | 300 | 300 | 24 | 20 |
| | SiH₄ | 300 | | | |
| Surface layer | | Material for surface layer ZrO₂ | 300 | 1 | 0.0975 |

TABLE 1C

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 10 | 3 |
| | GeH₄ | 50 | | | |
| | SiH₄ | 50 | | | |
| | B₂H₆/H₂ (= 3000 vol ppm) | 100 | | | |
| | NO | 10 | | | |
| Second layer | H₂ | 300 | 300 | 24 | 20 |
| | SiH₄ | 300 | | | |
| Surface | | Material for surface | 300 | 1 | 0.0975 |

TABLE 1C-continued

| Layer constitution | Starting gas | Gas flow rate (SCCM) | Discharging power (W) | Deposition rate (Å/sec) | Layer thickness (μm) |
|---|---|---|---|---|---|
| layer | layer ZrO$_2$ | | | | |

TABLE 2C

| | Sample No. | 201C | 202C | 203C | 204C |
|---|---|---|---|---|---|
| | Al cylinder No. | 104 | 105 | 106 | 109 |
| Layer thickness of light-receiving layer | Difference in average layer thickness between center and both ends of first layer (μm) | 1 | 1 | 1 | 1 |
| | Difference in layer thickness of minute portions in first layer (μm) | 0.2 | 0.15 | 0.1 | 0.25 |
| | Difference in average layer thickness between center and both ends of second layer (μm) | 3 | 3 | 3 | 3 |
| | Difference in layer thickness of minute portions in second layer (μm) | 0.55 | 0.4 | 0.3 | 0.6 |

TABLE 3C

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 1 |
| | | GeH$_4$ | 50 | | | |
| | | SiH$_4$ | 50 | | | |
| | | B$_2$H$_6$/H$_2$ (= 3000 vol ppm) | 100 | | | |
| | | NH$_3$ | 11 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | Material for surface layer ZrO$_2$ | | 300 | 1 | 0.0975 |

TABLE 4C

| | Sample No. | 401C | 402C | 403C | 404C |
|---|---|---|---|---|---|
| | Al cylinder No. | 104 | 105 | 106 | 109 |
| Layer thickness of light-receiving layer | Difference in average layer thickness between center and both ends of first layer (μm) | 0.1 | 0.1 | 0.1 | 0.1 |
| | Difference in layer thickness of minute portions in first layer (μm) | 0.04 | 0.03 | 0.02 | 0.05 |
| | Second layer — Difference in average layer thickness between center and both ends of layer A (μm) | 1.5 | 1.5 | 1.5 | 1.5 |
| | Difference in layer thickness of minute portions in layer A (μm) | 0.2 | 0.12 | 0.1 | 0.3 |
| | Difference in average layer thickness between center and both ends of layer B (μm) | 3 | 3 | 3 | 3 |
| | Difference in layer thickness of minute portions in layer B (μm) | 0.55 | 0.4 | 0.3 | 0.6 |

TABLE 5C

| Layer constitution | | Starting gas | Gas flow rate (SCCM) | Discharging power (W) | Deposition rate (Å/sec) | Layer thickness (μm) |
|---|---|---|---|---|---|---|
| First layer | | H$_2$ | 300 | 100 | 10 | 1 |
| | | GeH$_4$ | 50 | | | |
| | | SiH$_4$ | 50 | | | |
| | | B$_2$H$_6$/H$_2$ (= 3000 vol ppm) | 50 | | | |
| | | CH$_4$ | 10 | | | |
| Second layer | Layer A | H$_2$ | 300 | 100 | 8 | 5 |
| | | SiH$_4$ | 100 | | | |
| | | B$_2$H$_6$/H$_2$ | 100 | | | |

TABLE 5C-continued

| Layer constitution | Starting gas | Gas flow rate (SCCM) | Discharging power (W) | Deposition rate (Å/sec) | Layer thickness (μm) |
|---|---|---|---|---|---|
| Layer B | (= 3000 vol ppm) H₂ SiH₄ | 300 300 | 300 | 24 | 20 |
| Surface layer | Material for surface layer TiO₂ | | 300 | 1 | 0.0863 |

TABLE 6C

| | Sample No. Al cylinder No. | 601C 104 | 602C 105 | 603C 106 | 604C 109 |
|---|---|---|---|---|---|
| Layer thickness of light-receiving layer | Difference in average layer thickness between center and both ends of first layer (μm) | 0.12 | 0.12 | 0.12 | 0.12 |
| | Difference in layer thickness of minute portions in first layer (μm) | 0.05 | 0.04 | 0.03 | 0.06 |
| | Second layer  Difference in average layer thickness between center and both ends of layer A (μm) | 1.5 | 1.5 | 1.5 | 1.5 |
| | Difference in layer thickness of minute portions in layer A (μm) | 0.2 | 0.12 | 0.1 | 0.3 |
| | Difference in average layer thickness between center and both ends of layer B (μm) | 3 | 3 | 3 | 3 |
| | Difference in layer thickness of minute portions in layer B (μm) | 0.55 | 0.4 | 0.4 | 0.6 |

TABLE 7C

| Layer constitution | Starting gas | Gas flow rate (SCCM) | Discharging power (W) | Deposition rate (Å/sec) | Layer thickness (μm) |
|---|---|---|---|---|---|
| First layer | H₂ GeH₄ SiH₄ B₂H₆/H₂ (= 3000 vol ppm) NO | 300 50 50 150  10 | 100 | 10 | 1 |
| Second layer  Layer A | H₂ SiH₄ B₂H₆/H₂ (= 3000 vol ppm) NO | 300 100 100  10 | 100 | 8 | 5 |
| Layer B | H₂ SiH₄ NO | 300 300 10 | 300 | 24 | 20 |
| Surface layer | Material for surface layer TiO₂ | | 300 | 1 | 0.0863 |

TABLE 8C

| | Sample No. Al cylinder No. | 801C 104 | 802C 105 | 803C 106 | 804C 109 |
|---|---|---|---|---|---|
| Layer thickness of light-receiving layer | Difference in average layer thickness between center and both ends of first layer (μm) | 0.1 | 0.1 | 0.1 | 0.1 |
| | Difference in layer thickness of minute portions in first layer (μm) | 0.05 | 0.04 | 0.03 | 0.06 |
| | Second layer  Difference in average layer thickness between center and both ends of layer A (μm) | 1.6 | 1.6 | 1.6 | 1.6 |
| | Difference in layer thickness of minute portions in layer A (μm) | 0.2 | 0.13 | 0.11 | 0.3 |
| | Difference in average layer thickness between center and both ends of layer B (μm) | 3.1 | 3.1 | 3.1 | 3.1 |
| | Difference in layer thickness of minute portions in layer B (μm) | 0.55 | 0.4 | 0.4 | 0.6 |

TABLE 9C

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 1 |
| | | $GeH_4$ | 50 | | | |
| | | $SiH_4$ | 50 | | | |
| | | $NH_3$ | 12 | | | |
| Second layer | Layer A | $H_2$ | 300 | 100 | 8 | 5 |
| | | $SiH_4$ | 100 | | | |
| | | $B_2H_6/H_2$ (= 3000 vol ppm) | 100 | | | |
| | | $NH_3$ | 12 | | | |
| | Layer B | $H_2$ | 300 | 300 | 24 | 20 |
| | | $SiH_4$ | 300 | | | |
| | | $NH_3$ | 12 | | | |
| Surface layer | | Material for surface layer $CeO_2$ | | 300 | 1 | 0.0874 |

TABLE 10C

| | | Sample No. | 1001C | 1002C | 1003C | 1004C |
|---|---|---|---|---|---|---|
| | | Al cylinder No. | 104 | 105 | 106 | 109 |
| Layer thickness of light-receiving layer | | Difference in average layer thickness between center and both ends of first layer (μm) | 0.12 | 0.12 | 0.12 | 0.12 |
| | | Difference in layer thickness of minute portions in first layer (μm) | 0.05 | 0.04 | 0.03 | 0.06 |
| | Second layer | Difference in average layer thickness between center and both ends of layer A (μm) | 1.5 | 1.5 | 1.5 | 1.5 |
| | | Difference in layer thickness of minute portions in layer A (μm) | 0.2 | 0.12 | 0.1 | 0.3 |
| | | Difference in average layer thickness between center and both ends of layer B (μm) | 3 | 3 | 3 | 3 |
| | | Difference in layer thickness of minute portions in layer B (μm) | 0.55 | 0.4 | 0.39 | 0.6 |

TABLE 11C

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 100 | | | |
| | | $B_2H_6/H_2$ (= 3000 vol ppm) | 100 | | | |
| | | $CH_4$ | 8 | | | |
| | Layer B | $H_2$ | 300 | 100 | 10 | 2 |
| | | $GeH_4$ | 50 | | | |
| | | $SiH_4$ | 50 | | | |
| | | $CH_4$ | 8 | | | |
| Second layer | | $H_2$ | 300 | 300 | 24 | 20 |
| | | $SiH_4$ | 300 | | | |
| | | $CH_4$ | 8 | | | |
| Surface layer | | Material for surface layer ZnS | | 300 | 1 | 0.0871 |

TABLE 12C

| | | Sample No. | 1201C | 1202C | 1203C | 1204C |
|---|---|---|---|---|---|---|
| | | Al cylinder No. | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.1 | 0.1 | 0.1 | 0.12 |
| | | Difference in average layer thickness between center and both ends of layer B (μm) | 0.22 | 0.22 | 0.22 | 0.22 |
| | | Difference in layer thickness of minute portions in layer B (μm) | 0.11 | 0.1 | 0.1 | 0.13 |
| | | Difference in average layer thickness between center and both ends of second layer (μm) | 3 | 3 | 3 | 3 |
| | | Difference in layer thickness of | 0.55 | 0.4 | 0.39 | 0.6 |

TABLE 12C-continued

| | Sample No. | 1201C | 1202C | 1203C | 1204C |
|---|---|---|---|---|---|
| | Al cylinder No. | 104 | 105 | 106 | 109 |
| | minute portions in second layer (μm) | | | | |

TABLE 13C

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 100 | | | |
| | | $CH_4$ | 10~* | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| | | $CH_4$ | *~0 | | | |
| Second layer | | $H_2$ | 300 | 300 | 24 | 20 |
| | | $SiH_4$ | 300 | | | |
| Surface layer | | Material for surface layer $Al_2O_3$ | | 300 | 1 | 0.120 |

TABLE 14C

| | | Sample No. | 1401C | 1402C | 1403C | 1404C |
|---|---|---|---|---|---|---|
| | | Al cylinder No. | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.1 | 0.1 | 0.1 | 0.12 |
| | | Difference in average layer thickness between center and both ends of layer B (μm) | 0.22 | 0.22 | 0.22 | 0.22 |
| | | Difference in layer thickness of minute portions in layer B (μm) | 0.11 | 0.1 | 0.1 | 0.13 |
| | Difference in average layer thickness between center and both ends of second layer (μm) | | 3 | 3 | 3 | 3 |
| | Difference in layer thickness of minute portions in second layer (μm) | | 0.55 | 0.4 | 0.39 | 0.6 |

TABLE 15C

| Layer constitution | Starting gas | Gas flow rate (SCCM) | Discharging power (W) | Deposition rate (Å/sec) | Layer thickness (μm) |
|---|---|---|---|---|---|
| First Layer | $H_2$ | 300 | 100 | 10 | 5 |
| | $GeH_4$ | 50 | | | |
| | $SiH_4$ | 50 | | | |
| | $B_2H_6/H_2$ (= 3000 vol ppm) | 100 | | | |
| | NO | 10~0 | | | |
| Second layer | $H_2$ | 300 | 300 | 24 | 20 |
| | $SiH_4$ | 300 | | | |
| Surface layer | Material for surface layer $CeF_3$ | | 300 | 1 | 0.123 |

TABLE 16C

| | | Sample No. | 1601C | 1602C | 1603C | 1604C |
|---|---|---|---|---|---|---|
| | | Al cylinder No. | 104 | 105 | 106 | 109 |
| Layer thickness of light-receiving layer | Difference in average layer thickness between center and both ends of first layer (μm) | | 1.5 | 1.5 | 1.5 | 1.5 |
| | Difference in layer thickness of minute portions in first layer (μm) | | 0.2 | 0.12 | 0.1 | 0.3 |
| | Difference in average layer thickness between center and both ends of second layer (μm) | | 3 | 3 | 3 | 3 |
| | Difference in layer thickness of minute portions in second | | 0.55 | 0.4 | 0.3 | 0.6 |

TABLE 16C-continued

| Sample No. | 1601C | 1602C | 1603C | 1604C |
|---|---|---|---|---|
| Al cylinder No. | 104 | 105 | 106 | 109 |
| layer (μm) | | | | |

TABLE 17C

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 2 |
| | $GeH_4$ | 50 | | | |
| | $SiH_4$ | 50 | | | |
| | $B_2H_6/H_2$ (= 3000 vol ppm) | 100 | | | |
| | $NH_3$ | 10~0 | | | |
| Second layer A | $H_2$ | 300 | 100 | 8 | 3 |
| | $SiH_4$ | 100 | | | |
| | $B_2H_6/H_2$ (= 3000 vol ppm) | 100 | | | |
| Layer B | $H_2$ | 300 | 300 | 24 | 20 |
| | $SiH_4$ | 300 | | | |
| Surface layer | Material for surface layer $MgF_2$ | | 300 | 1 | 0.141 |

TABLE 18C

| | | 1801C | 1802C | 1803C | 1804C |
|---|---|---|---|---|---|
| Sample No. | | | | | |
| Al cylinder No. | | 104 | 105 | 106 | 109 |
| Layer thickness of light-receiving layer | Difference in average layer thickness between center and both ends of first layer (μm) | 0.2 | 0.2 | 0.2 | 0.2 |
| | Difference in layer thickness of minute portions in first layer (μm) | 0.14 | 0.12 | 0.1 | 0.16 |
| Second layer | Difference in average layer thickness between center and both ends of layer A (μm) | 0.3 | 0.3 | 0.3 | 0.3 |
| | Difference in layer thickness of minute portions in layer A (μm) | 0.2 | 0.14 | 0.13 | 0.21 |
| | Difference in average layer thickness between center and both ends of layer B (μm) | 3 | 3 | 3 | 3 |
| | Difference in layer thickness of minute portions in layer B (μm) | 0.57 | 0.4 | 0.3 | 0.6 |

TABLE 19C

| Layer constitution | Starting gas | Gas Flow rate (SCCM) | Discharging power (W) | Deposition rate (Å/sec) | Layer thickness (μm) |
|---|---|---|---|---|---|
| First layer | $H_2$ | 300 | 100 | 10 | 2 |
| | $GeH_4$ | 50 | | | |
| | $SiH_4$ | 50 | | | |
| | $B_2H_6/H_2$ (= 3000 vol ppm) | 50 | | | |
| | $CH_4$ | 10~* | | | |
| Second layer A | $H_2$ | 300 | 100 | 8 | 3 |
| | $SiH_4$ | 100 | | | |
| | $B_2H_6/H_2$ (= 3000 vol ppm) | 100 | | | |
| | $CH_4$ | *~** | | | |
| Layer B | $H_2$ | 300 | 300 | 24 | 20 |
| | $SiH_4$ | 300 | | | |
| | $CH_4$ | **~0 | | | |
| Surface layer | Material for surface layer $SiO_2$ | | 300 | 1 | 0.131 |

NOTE:
* and ** represent the continuity of change in the gas flow rate, respectively. The same note applies to other subsequent tables.

TABLE 20C

| | | 2001C | 2002C | 2003C | 2004C |
|---|---|---|---|---|---|
| Sample No. | | | | | |
| Al cylinder No. | | 104 | 105 | 106 | 109 |
| Layer thickness of light-receiving layer | Difference in average layer thickness between center and both ends of first layer (μm) | 0.2 | 0.2 | 0.2 | 0.2 |

TABLE 20C-continued

|  | Sample No. | 2001C | 2002C | 2003C | 2004C |
|---|---|---|---|---|---|
|  | Al cylinder No. | 104 | 105 | 106 | 109 |
|  | Difference in layer thickness of minute portions in first layer ($\mu$m) | 0.13 | 0.11 | 0.1 | 0.2 |
| Second Layer | Difference in average layer thickness between center and both ends of layer A ($\mu$m) | 0.4 | 0.4 | 0.4 | 0.4 |
|  | Difference in layer thickness of minute portions in layer A ($\mu$m) | 0.13 | 0.12 | 0.11 | 0.2 |
|  | Difference in average layer thickness between center and both ends of layer B ($\mu$m) | 3 | 3 | 3 | 3 |
|  | Difference in layer thickness of minute portions in layer B ($\mu$m) | 0.6 | 0.5 | 0.4 | 0.7 |

TABLE 21C

| Layer constitution | | Starting gas | Gas Flow rate (SCCM) | Discharging power (W) | Deposition rate (Å/sec) | Layer thickness ($\mu$m) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 | | | |
| | | NO | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | NO | *~** | | | |
| | Layer B | $H_2$ | 300 | 300 | 24 | 20 |
| | | $SiH_4$ | 300 | | | |
| | | NO | **~0 | | | |
| Surface layer | | Material for surface layer $ZrO_2:TiO_2 = 6:1$ | | 300 | 1 | 0.0933 |

TABLE 22C

|  |  | Sample No. | 2201C | 2202C | 2203C | 2204C |
|---|---|---|---|---|---|---|
|  |  | Al cylinder No. | 104 | 105 | 106 | 109 |
| Layer thickness of light-receiving layer | | Difference in average layer thickness between center and both ends of first layer ($\mu$m) | 0.2 | 0.2 | 0.2 | 0.2 |
|  |  | Difference in layer thickness of minute portions in first layer ($\mu$m) | 0.12 | 0.11 | 0.1 | 0.14 |
|  | Second layer | Difference in average layer thickness between center and both ends of layer A ($\mu$m) | 0.4 | 0.4 | 0.4 | 0.4 |
|  |  | Difference in layer thickness of minute portions in layer A ($\mu$m) | 0.17 | 0.15 | 0.13 | 0.18 |
|  |  | Difference in average layer thickness between center and both ends of layer B ($\mu$m) | 3.2 | 3.2 | 3.2 | 3.2 |
|  |  | Difference in layer thickness of minute portions in layer B ($\mu$m) | 0.6 | 0.55 | 0.5 | 0.7 |

TABLE 23C

| Layer constitution | | Starting gas | Gas Flow rate (SCCM) | Discharging power (W) | Deposition rate (Å/sec) | Layer thickness ($\mu$m) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $NH_3$ | 10~* | | | |
| Second layer | Layer A | $H_2$ | 300 | 100 | 8 | 3 |
| | | $SiH_4$ | 100 | | | |
| | | $B_2H_6/H_2$ (= 3000 vol ppm) | 100 | | | |
| | | $NH_3$ | *~** | | | |
| | Layer B | $H_2$ | 300 | 300 | 24 | 20 |
| | | $SiH_4$ | 300 | | | |

TABLE 23C-continued

| Layer constitution | Starting gas | Gas Flow rate (SCCM) | Discharging power (W) | Deposition rate (Å/sec) | Layer thickness (μm) |
|---|---|---|---|---|---|
| Surface layer | NH₃<br>Material for surface layer<br>Al₂O₃:ZrO₂ = 1:1 | **~0 | 300 | 1 | 0.116 |

TABLE 24C

| | | Sample No. | 2401C | 2402C | 2403C | 2404C |
|---|---|---|---|---|---|---|
| | | Al cylinder No. | 104 | 105 | 106 | 109 |
| Layer thickness of light-receiving layer | | Difference in average layer thickness between center and both ends of first layer (μm) | 0.2 | 0.2 | 0.2 | 0.2 |
| | | Difference in layer thickness of minute portions in first layer (μm) | 0.12 | 0.11 | 0.1 | 0.14 |
| | Second layer | Difference in average layer thickness between center and both ends of layer A (μm) | 0.4 | 0.4 | 0.4 | 0.4 |
| | | Difference in layer thickness of minute portions in layer A (μm) | 0.17 | 0.15 | 0.13 | 0.18 |
| | | Difference in average layer thickness between center and both ends of layer B (μm) | 3.2 | 3.2 | 3.2 | 3.2 |
| | | Difference in layer thickness of minute portions in latex B (μm) | 0.6 | 0.55 | 0.5 | 0.7 |

TABLE 25C

| Layer constitution | | Starting gas | Gas Flow rate (SCCM) | Discharging power (W) | Deposition rate (Å/sec) | Layer thickness (μm) |
|---|---|---|---|---|---|---|
| First layer | Layer A | H₂<br>GeH₄<br>SiH₄<br>B₂H₆/H₂<br>(= 3000 vol ppm)<br>NO | 300<br>50<br>50<br>100<br><br>8 | 100 | 10 | 2 |
| | Layer B | H₂<br>GeH₄<br>SiH₄ | 300<br>50<br>50 | 100 | 10 | 2 |
| Second layer | | H₂<br>SiH₄ | 300<br>300 | 300 | 24 | 20 |
| Surface layer | | Material for surface layer MgF₂ | | 300 | 1 | 0.424 |

TABLE 26C

| | | Sample No. | 2601C | 2602C | 2603C | 2604C |
|---|---|---|---|---|---|---|
| | | Al cylinder No. | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.13 | 0.11 | 0.1 | 0.15 |
| | | Difference in average layer thickness between center and both ends of layer B (μm) | 0.2 | 0.2 | 0.2 | 0.2 |
| | | Difference in layer thickness of minute portions in layer B (μm) | 0.13 | 0.12 | 0.11 | 0.14 |
| | | Difference in average layer thickness between center and both ends of second layer (μm) | 3 | 3 | 3 | 3 |
| | | Difference in layer thickness of minute portions in second layer (μm) | 0.5 | 0.44 | 0.4 | 0.6 |

TABLE 27C

| Layer constitution | | Starting gas | Gas Flow rate (SCCM) | Discharging power (W) | Deposition rate (Å/sec) | Layer thickness (μm) |
|---|---|---|---|---|---|---|
| First | Layer | H₂ | 300 | 100 | 10 | 2 |

TABLE 27C-continued

| Layer constitution | | Starting gas | Gas Flow rate (SCCM) | Discharging power (W) | Deposition rate (Å/sec) | Layer thickness (μm) |
|---|---|---|---|---|---|---|
| layer | A | GeH₄ | 50 | | | |
| | | SiH₄ | 50 | | | |
| | | NH₃ | 11 | | | |
| | Layer | H₂ | 300 | | | |
| | B | GeH₄ | 50 | 100 | 10 | 2 |
| | | SiH₄ | 50 | | | |
| | | B₂H₆/H₂ (= 300 vol ppm) | 100 | | | |
| Second layer | | H₂ | 300 | 300 | 24 | 20 |
| | | SiH₄ | 300 | | | |
| Surface layer | | Material for surface layer MgF₂ | | 300 | 1 | 0.424 |

TABLE 28C

| | | | 2801C | 2802C | 2803C | 2804C |
|---|---|---|---|---|---|---|
| | Sample No. | | | | | |
| | Al cylinder No. | | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.11 | 0.11 | 0.1 | 0.13 |
| | | Difference in average layer thickness between center and both ends of layer B (μm) | 0.21 | 0.21 | 0.21 | 0.21 |
| | | Difference in layer thickness of minute portions in layer B (μm) | 0.13 | 0.12 | 0.11 | 0.14 |
| | Difference in average layer thickness between center and both ends of second layer (μm) | | 3 | 3 | 3 | 3 |
| | Difference in layer thickness of minute portions in second layer (μm) | | 0.4 | 0.35 | 0.3 | 0.5 |

TABLE 1D

| Cylinder No. | | 110 | 111 | 112 | 113 |
|---|---|---|---|---|---|
| Surface structure of Al cylinder | Pitch (μm) | 55 | 45 | 20 | 15 |
| | Depth (μm) | 2.41 | 1.89 | 0.65 | 0.89 |
| | Angle (degree) | 5.0 | 4.8 | 3.7 | 6.8 |

TABLE 2D

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 9 | 3 |
| | GeH₄ | 100 → 0 | | | |
| | SiH₄ | 0 → 100 | | | |
| | B₂H₆/H₂ (= 3000 vol ppm) | GeH₄ + SiH₄ = 100 | | | |
| | NO | 12 | | | |
| Second layer | H₂ | 300 | | | |
| | SiH₄ | 300 | 300 | 24 | 20 |
| Surface layer | ZrO₂ | | 300 | 24 | 0.0975 |

TABLE 3D

| | Sample No. | 201D | 202D | 203D | 204D |
|---|---|---|---|---|---|
| | Al cylinder No. | 104 | 105 | 106 | 109 |
| Layer thickness of light-receiving layer | Difference in average layer thickness between center and both ends of first layer (μm) | 1 | 1 | 1 | 1 |
| | Difference in layer thickness of minute portions in first layer (μm) | 0.2 | 0.15 | 0.1 | 0.25 |
| | Difference in average layer thickness between center and both ends of second layer (μm) | 3 | 3 | 3 | 3 |
| | Difference in layer thickness | 0.51 | 0.44 | 0.41 | 0.61 |

TABLE 3D-continued

| Sample No. | 201D | 202D | 203D | 204D |
|---|---|---|---|---|
| Al cylinder No. | 104 | 105 | 106 | 109 |
| of minute portions in second layer (μm) | | | | |

TABLE 4D

| | Sample No. | 301D | 302D | 303D | 304D |
|---|---|---|---|---|---|
| | Al cylinder No. | 110 | 111 | 112 | 113 |
| Layer thickness of light-receiving layer | Difference in average layer thickness between center and both ends of first layer (μm) | 1 | 1 | 1 | 1 |
| | Difference in layer thickness of minute portions in first layer (μm) | 0.19 | 0.14 | 0.1 | 0.25 |
| | Difference in average layer thickness between center and both ends of second layer (μm) | 3.1 | 3.1 | 3.1 | 3.1 |
| | Difference in layer thickness | 0.45 | 0.42 | 0.39 | 0.50 |

TABLE 4D-continued

| Sample No. | 301D | 302D | 303D | 304D |
|---|---|---|---|---|
| Al cylinder No. | 110 | 111 | 112 | 113 | of minute portions in second layer (μm)

TABLE 5D

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 3 |
| | | GeH₄ | 50 → 0 | | | |
| | | SiH₄ | 50 → 100 | | | |
| | | B₂H₆/H₂ (= 3000 vol ppm) | 100 GeH₄ + SiH₄ = 100 | | | |
| | | NH₃ | 8 | | | |
| Second layer | Layer A | H₂ | 300 | 100 | 8 | 5 |
| | | SiH₄ | 100 | | | |
| | | B₂H₆/H₂ (= 3000 vol ppm) | 100 | | | |
| | | NH₃ | 8 | | | |
| | Layer B | H₂ | 300 | 300 | 24 | 20 |
| | | SiH₄ | 300 | | | |
| | | NH₃ | 8 | | | |
| Surface layer | | TiO₂ | | 300 | 24 | 0.0863 |

TABLE 6D

| | Sample No. | 601D | 602D | 603D | 604D |
|---|---|---|---|---|---|
| | Al cylinder No. | 104 | 105 | 106 | 109 |
| Layer thickness of light-receiving layer | Difference in average layer thickness between center and both ends of first layer (μm) | 0.1 | 0.1 | 0.1 | 0.1 |
| | Difference in layer thickness of minute portions in first layer (μm) | 0.04 | 0.03 | 0.02 | 0.05 |
| | Second layer Difference in average layer thickness between center and both ends of layer A (μm) | 1.5 | 1.5 | 1.5 | 1.5 |
| | Difference in layer thickness of minute portions in layer A (μm) | 0.2 | 0.12 | 0.1 | 0.3 |
| | Difference in average layer thickness between center and both ends of layer B (μm) | 3 | 3 | 3 | 3 |
| | Difference in layer thickness of minute portions in layer B (μm) | 0.55 | 0.4 | 0.3 | 0.6 |

TABLE 7D

| | Sample No. | 701D | 702D | 703D | 704D |
|---|---|---|---|---|---|
| | Al cylinder No. | 110 | 111 | 112 | 113 |
| Layer thickness of light-receiving layer | Difference in average layer thickness between center and both ends of first layer (μm) | 0.1 | 0.1 | 0.1 | 0.1 |
| | Difference in layer thickness of minute portions in first layer (μm) | 0.04 | 0.03 | 0.02 | 0.05 |
| | Second layer Difference in average layer thickness between center and both ends of layer A (μm) | 1.49 | 1.49 | 1.49 | 1.49 |
| | Difference in layer thickness of minute portions in layer A (μm) | 0.2 | 0.12 | 0.1 | 0.3 |
| | Difference in average layer thickness between center and both ends of layer B (μm) | 2.9 | 2.9 | 2.9 | 2.9 |
| | Difference in layer thickness of minute portions in layer B (μm) | 0.51 | 0.44 | 0.41 | 0.61 |

TABLE 8D

| Layer constitution | Starting gas | Gas flow rate (SCCM) | Discharging power (W) | Deposition rate (Å/sec) | Layer thickness (μm) |
|---|---|---|---|---|---|
| First layer | H₂ | 300 | 100 | 10 | 3 |
| | GeH₄ | 100 → 0 | | | |
| | SiH₄ | 0 → 100 | | | |
| | B₂H₆/H₂ (= 3000 vol ppm) | 100 GeH₄ + SiH₄ = 100 | | | |

TABLE 8D-continued

| Layer constitution | Starting gas | Gas flow rate (SCCM) | Discharging power (W) | Deposition rate (Å/sec) | Layer thickness (μm) |
|---|---|---|---|---|---|
| Second layer | CH₄<br>H₂<br>SiH₄ | 10 → 0<br>300<br>300 | 300 | 24 | 20 |
| Surface layer | CeO₂ | | 300 | 24 | 0.0874 |

TABLE 9D

| | | | | | |
|---|---|---|---|---|---|
| | Sample No. | 1001D | 1002D | 1003D | 1004D |
| | Al cylinder No. | 104 | 105 | 106 | 109 |
| Layer thickness of light receiving layer | Difference in average layer thickness between center and both ends of first layer (μm) | 1 | 1 | 1 | 1 |
| | Difference in layer thickness of minute portions in first layer (μm) | 0.2 | 0.15 | 0.1 | 0.25 |
| | Difference in average layer thickness between center and both ends of second layer (μm) | 3 | 3 | 3 | 3 |
| | Difference in layer thickness of minute portions in second layer (μm) | 0.55 | 0.4 | 0.3 | 0.6 |

TABLE 10D

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂<br>GeH₄<br>SiH₄<br>B₂H₆/H₂<br>(= 3000 vol ppm)<br>NO | 300<br>50 → 0<br>50 → 100<br>50<br><br>GeH₄ + SiH₄ = 100<br>10 → * | 100 | 10 | 3 |
| Second layer | Layer A | H₂<br>SiH₄<br>B₂H₆/H₂<br>(= 3000 vol ppm)<br>NO | 300<br>100<br>100<br><br>* → ** | 100 | 8 | 5 |
| | Layer B | H₂<br>SiH₄<br>NO | 300<br>300<br>** → 0 | 300 | 24 | 20 |
| Surface layer | | ZnS | | 300 | 24 | 0.0871 |

TABLE 11D

| | | | | | |
|---|---|---|---|---|---|
| | Sample No. | 1301D | 1302D | 1303D | 1304D |
| | Al cylinder No. | 104 | 105 | 106 | 109 |
| Layer thickness of light-receiving layer | Difference in average layer thickness between center and both ends of first layer (μm) | 0.12 | 0.12 | 0.12 | 0.12 |
| | Difference in layer thickness of minute portions in first layer (μm) | 0.05 | 0.04 | 0.03 | 0.06 |
| | Second layer: Difference in average layer thickness between center and both ends of layer A (μm) | 1.5 | 1.5 | 1.5 | 1.5 |
| | Difference in layer thickness of minute portions in layer A (μm) | 0.2 | 0.12 | 0.1 | 0.3 |
| | Difference in average layer thickness between center and both ends of layer B (μm) | 3 | 3 | 3 | 3 |
| | Difference in layer thickness of minute portions in layer B (μm) | 0.55 | 0.4 | 0.4 | 0.6 |

TABLE 12D

| Layer constitution | Starting gas | Gas flow rate (SCCM) | Discharging power (W) | Deposition rate (Å/sec) | Layer thickness (μm) |
|---|---|---|---|---|---|
| First layer | H₂<br>GeH₄ | 300<br>50 → 0 | 100 | 10 | 3 |

TABLE 12D-continued

| Layer constitution | | Starting gas | Gas flow rate (SCCM) | Discharging power (W) | Deposition rate (Å/sec) | Layer thickness (μm) |
|---|---|---|---|---|---|---|
| Second layer | Layer A | SiH$_4$<br>NH$_3$<br>H$_2$<br>SiH$_4$<br>B$_2$H$_6$/H$_2$<br>(= 3000 vol ppm) | 50 → 100<br>GeH$_4$ + SiH$_4$ = 100<br>10 → *<br>300<br>100<br>100 | 100 | 8 | 5 |
| | Layer B | NH$_3$<br>H$_2$<br>SiH$_4$<br>NH$_3$ | * → <br>300<br>300<br> → 0 | 300 | 24 | 20 |
| Surface layer | | ZnS | | 300 | 24 | 0.0871 |

TABLE 13D

| | | Sample No.<br>Al cylinder No. | 1401D<br>104 | 1402D<br>105 | 1403D<br>106 | 1404D<br>109 |
|---|---|---|---|---|---|---|
| Layer thickness of light-receiving layer | | Difference in average layer thickness between center and both ends of first layer (μm) | 0.12 | 0.12 | 0.12 | 0.12 |
| | | Difference in layer thickness of minute portions in first layer (μm) | 0.05 | 0.04 | 0.03 | 0.06 |
| | Second layer | Difference in average layer thickness between center and both ends of layer A (μm) | 1.5 | 1.5 | 1.5 | 1.5 |
| | | Difference in layer thickness of minute portions in layer A (μm) | 0.2 | 0.12 | 0.1 | 0.3 |
| | | Difference in average layer thickness between center and both ends of layer B (μm) | 3 | 3 | 3 | 3 |
| | | Difference in layer thickness of minute portions in layer B (μm) | 0.55 | 0.4 | 0.39 | 0.6 |

TABLE 14D

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$<br>GeH$_4$<br>SiH$_4$<br>B$_2$H$_6$/H$_2$<br>(= 3000 vol ppm)<br>CH$_4$ | 300<br>100 → 0<br>0 → 100<br>100<br>10 → * | 100 | 10 | 1.5 |
| | Layer B | H$_2$<br>GeH$_4$<br>SiH$_4$<br>CH$_4$ | 300<br>50 → 0<br>50 → 100<br>* → ** | 100 | 10 | 1.5 |
| Second layer | | H$_2$<br>SiH$_4$<br>CH$_4$ | 300<br>300<br>** → 0 | 300 | 24 | 20 |
| Surface layer | | ZnS | | 300 | 24 | 0.0871 |

TABLE 15D

| | | Sample No.<br>Al cylinder No. | 1501D<br>104 | 1502D<br>105 | 1503D<br>106 | 1504D<br>109 |
|---|---|---|---|---|---|---|
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.1 | 0.1 | 0.1 | 0.12 |
| | | Difference in average layer thickness between center and both ends of layer B (μm) | 0.22 | 0.22 | 0.22 | 0.22 |
| | | Difference in layer thickness of minute portions in layer B (μm) | 0.11 | 0.1 | 0.1 | 0.13 |
| | | Difference in average layer thickness between center and both ends of second layer (μm) | 3 | 3 | 3 | 3 |

TABLE 15D-continued

| Sample No. | 1501D | 1502D | 1503D | 1504D |
|---|---|---|---|---|
| Al cylinder No. | 104 | 105 | 106 | 109 |
| Difference in layer thickness of minute portions in second layer ($\mu$m) | 0.55 | 0.4 | 0.39 | 0.6 |

TABLE 1E

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$ | 300 | 100 | 10 | 1 |
| | $GeH_4$ | 100 | | | |
| | $SiH_4$ | 100 | | | |
| | $B_2H_6/H_2$ (= 3000 vol ppm) | $B_2H_6/(GeH_4 + SiH_4) = 3/100 \rightarrow 0$ | | | |
| | NO | 12 | | | |
| Second layer | $H_2$ | 300 | 300 | 24 | 20 |
| | $SiH_4$ | 300 | | | |
| Surface layer | Material for surface layer $ZrO_2$ | | 300 | 1 | 0.0975 |

TABLE 2E

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$ | 300 | 100 | 14 | 3 |
| | $GeH_4$ | 100 | | | |
| | $SiH_4$ | 50 | | | |
| | $B_2H_6/H_2$ (= 3000 vol ppm) | $B_2H_6/(GeH_4 + SiH_4) = 5/100 \rightarrow 0$ | | | |
| | $NH_3$ | 10 | | | |
| Second layer | $H_2$ | 300 | 300 | 24 | 20 |
| | $SiH_4$ | 300 | | | |
| | $NH_3$ | 10 | | | |
| Surface layer | Material for surface layer $ZrO_2$ | | 300 | 1 | 0.0975 |

TABLE 3E

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$ | 300 | 100 | 12 | 5 |
| | $GeH_4$ | 50 | | | |
| | $SiH_4$ | 100 | | | |
| | $B_2H_6/H_2$ (= 3000 vol ppm) | $B_2H_6/(GeH_4 + SiH_4) = 1/100 \rightarrow 0$ | | | |
| | $CH_4$ | 15 | | | |
| Second layer | $H_2$ | 300 | 300 | 24 | 20 |
| | $SiH_4$ | 300 | | | |
| Surface layer | Material for surface layer $TiO_2$ | | 300 | 1 | 0.0863 |

TABLE 4E

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$ | 300 | 100 | 8 | 7 |
| | $GeH_4$ | 15 | | | |
| | $SiH_4$ | 135 | | | |
| | $B_2H_6/H_2$ (= 3000 vol ppm) | $B_2H_6/(GeH_4 + SiH_4) = 1/100 \rightarrow 0$ | | | |
| | NO | 15 | | | |
| Second layer | $H_2$ | 300 | 300 | 24 | 20 |
| | $SiH_4$ | 300 | | | |
| | NO | 15 | | | |
| Surface layer | Material for surface layer $TiO_2$ | | 300 | 1 | 0.0863 |

TABLE 5E

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 150 → 110 | | | |
| | | $NH_3$ | 10 → 0 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 110 → 0 | | | |
| | Layer B | $H_2$ | 300 | 300 | 24 | 20 |
| | | $SiH_4$ | 300 | | | |
| Surface layer | | Material for surface layer $CeO_2$ | | 300 | 1 | 0.0874 |

TABLE 6E

| | | Sample No. | 701E | 702E | 703E | 704E |
|---|---|---|---|---|---|---|
| | | Al cylinder No. | 104 | 105 | 106 | 109 |
| Layer thickness of light-receiving layer | | Difference in average layer thickness between center and both ends of first layer (μm) | 0.2 | 0.2 | 0.2 | 0.2 |
| | | Difference in layer thickness of minute portions in first layer (μm) | 0.12 | 0.11 | 0.1 | 0.14 |
| | Second layer | Difference in average layer thickness between center and both ends of layer A (μm) | 0.4 | 0.4 | 0.4 | 0.4 |
| | | Difference in layer thickness of minute portions in layer A (μm) | 0.17 | 0.15 | 0.13 | 0.18 |
| | | Difference in average layer thickness between center and both ends of layer B (μm) | 3.2 | 3.2 | 3.2 | 3.2 |
| | | Difference in layer thickness of minute portions in layer B (μm) | 0.6 | 0.55 | 0.5 | 0.7 |

TABLE 7E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 → 0 | | | |
| | | $CH_4$ | 10 → 0 | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |
| Surface layer | | Material for surface layer ZnS | | 300 | 1 | 0.0871 |

TABLE 8E

| | | Sample No. | 1001E | 1002E | 1003E | 1004E |
|---|---|---|---|---|---|---|
| | | Al cylinder No. | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.13 | 0.11 | 0.1 | 0.15 |
| | | Difference in average layer thickness between center and both ends of layer B (μm) | 0.2 | 0.2 | 0.2 | 0.2 |
| | | Difference in layer thickness of minute portions in layer B (μm) | 0.13 | 0.12 | 0.11 | 0.14 |
| | | Difference in average layer thickness between center and both ends of second | 3 | 3 | 3 | 3 |

TABLE 8E-continued

| Sample No. | 1001E | 1002E | 1003E | 1004E |
|---|---|---|---|---|
| Al cylinder No. | 104 | 105 | 106 | 109 |
| layer (μm) Difference in layer thickness of minute portions in second layer (μm) | 0.5 | 0.44 | 0.4 | 0.6 |

TABLE 9E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $SiH_4$ | 50 | | | |
| | | $GeH_4$ | 50 | | | |
| | | NO | 10 → * | | | |
| | Layer B | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 50 → 0 | | | |
| | | NO | * → ** | | | |
| Second layer | | $H_2$ | 300 | 300 | 24 | 20 |
| | | $SiH_4$ | 300 | | | |
| | | NO | ** → 0 | | | |
| Surface layer | | Material for surface layer $Al_2O_3$ | | 300 | 1 | 0.120 |

TABLE 10E

| | | | 1301E | 1302E | 1303E | 1304E |
|---|---|---|---|---|---|---|
| Sample No. Al cylinder No. | | | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.11 | 0.11 | 0.1 | 0.13 |
| | | Difference in average layer thickness between center and both ends of layer B (μm) | 0.21 | 0.21 | 0.21 | 0.21 |
| | | Difference in layer thickness of minute portions in layer B (μm) | 0.13 | 0.12 | 0.11 | 0.14 |
| | Difference in average layer thickness between center and both ends of second layer (μm) | | 3 | 3 | 3 | 3 |
| | Difference in layer thickness of minute portions in second layer (μm) | | 0.4 | 0.35 | 0.3 | 0.5 |

TABLE 11E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $SiH_4$ | 50 | | | |
| | | $GeH_4$ | 50 | | | |
| | | $B_2H_6/H_2$ (= 3000 vol ppm) | 50 → *** | | | |
| | | $NH_3$ | 10 → * | | | |
| | Layer B | $H_2$ | 300 | 100 | 8 | 3 |
| | | $GeH_4$ | 50 | | | |
| | | $SiH_4$ | 50 | | | |
| | | $B_2H_6/H_2$ (= 3000 vol ppm) | *** → 0 | | | |
| | | $NH_3$ | * → ** | | | |
| Second layer | | $H_2$ | 300 | 300 | 24 | 20 |
| | | $SiH_4$ | 300 | | | |
| | | $NH_3$ | ** → 0 | | | |
| Surface layer | | Material for surface layer $CeF_3$ | | 300 | 1 | 0.123 |

Note:
***represents the continuity of change in the gas flow rate.

TABLE 12E

| | Sample No. | 1601E | 1602E | 1603E | 1604E |
|---|---|---|---|---|---|
| | Al cylinder No. | 104 | 105 | 106 | 109 |
| Layer thickness of light-receiving layer | Difference in average layer thickness between center and both ends of first layer ($\mu$m) | 0.2 | 0.2 | 0.2 | 0.2 |
| | Difference in layer thickness of minute portions in first layer ($\mu$m) | 0.12 | 0.11 | 0.1 | 0.14 |
| Second layer | Difference in average layer thickness between center and both ends of layer A ($\mu$m) | 0.4 | 0.4 | 0.4 | 0.4 |
| | Difference in layer thickness of minute portions in layer A ($\mu$m) | 0.17 | 0.15 | 0.13 | 0.18 |
| | Difference in average layer thickness between center and both ends of layer B ($\mu$m) | 3.2 | 3.2 | 3.2 | 3.2 |
| | Difference in layer thickness of minute portions in layer B ($\mu$m) | 0.6 | 0.55 | 0.5 | 0.7 |

TABLE 1F

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | | $GeH_4 + SiH_4 = 100$ | | | |
| | $B_2H_6/H_2$ (= 3000 vol ppm) | 150 → 0 | | | |
| | NO | 12 | | | |
| Second layer | $H_2$ | 300 | 300 | 24 | 20 |
| | $SiH_4$ | 300 | | | |
| Surface layer | Material for surface layer $ZrO_2$ | | 300 | 1 | 0.0975 |

TABLE 2F

| | Sample No. | 101F | 102F | 103F | 104F |
|---|---|---|---|---|---|
| | Al cylinder No. | 104 | 105 | 106 | 109 |
| Layer thickness of light-receiving layer | Difference in average layer thickness between center and both ends ($\mu$m) | 3.2 | 3.2 | 3.2 | 3.2 |
| | Difference in layer thickness of minute portion ($\mu$m) | 0.51 | 0.44 | 0.41 | 0.61 |

TABLE 3F

| | Sample No. | 201F | 202F | 203F | 204F |
|---|---|---|---|---|---|
| | Al cylinder No. | 104 | 105 | 106 | 109 |
| Layer thickness of light-receiving layer | Difference in average layer thickness between center and both ends ($\mu$m) | 3.2 | 3.2 | 3.2 | 3.2 |
| | Difference in layer thickness of minute portion ($\mu$m) | 0.45 | 0.42 | 0.39 | 0.50 |

TABLE 4F

| Layer constitution | Starting gas | Gas flow rate (SCCM) | Discharging power (W) | Deposition rate (Å/sec) | Layer thickness ($\mu$m) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | | $GeH_4 + SiH_4 = 100$ | | | |
| | $B_2H_6/H_2$ (= 3000 vol ppm) | 50 → 0 | | | |
| | $NH_3$ | 12 | | | |
| Second layer | $H_2$ | 300 | 300 | 24 | 20 |
| | $SiH_4$ | 300 | | | |
| | $NH_3$ | 12 | | | |
| Surface layer | Material for surface layer $TiO_2$ | | 300 | 1 | 0.0863 |

TABLE 5F

| | Sample No. | 301F | 302F | 303F | 304F |
|---|---|---|---|---|---|
| | Al cylinder No. | 104 | 105 | 106 | 109 |
| Layer thickness of light-receiving layer | Difference in average layer thickness between center and both ends ($\mu$m) | 3.2 | 3.2 | 3.2 | 3.2 |
| | Difference in layer thickness of minute portion ($\mu$m) | 0.42 | 0.40 | 0.38 | 0.48 |

TABLE 6F

| | Sample No.<br>Al cylinder No. | 401F<br>104 | 402F<br>105 | 403F<br>106 | 404F<br>109 |
|---|---|---|---|---|---|
| Layer thickness of light-receiving layer | Difference in average layer thickness between center and both ends ($\mu$m) | 3.2 | 3.2 | 3.2 | 3.2 |

TABLE 6F-continued

| | Sample No.<br>Al cylinder No. | 401F<br>104 | 402F<br>105 | 403F<br>106 | 404F<br>109 |
|---|---|---|---|---|---|
| | Difference in layer thickness of minute portion ($\mu$m) | 0.40 | 0.38 | 0.36 | 0.45 |

TABLE 7F

| Layer constitution | | Starting gas | Gas flow rate (SCCM) | Discharging power (W) | Deposition rate (Å/sec) | Layer thickness ($\mu$m) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| | | $CH_4$ | 15 | | | |
| Second layer | Layer A | $H_2$ | 300 | 100 | 10 | 3 |
| | | $SiH_4$ | 100 | | | |
| | | $B_2H_6/H_2$<br>(= 3000 vol ppm) | 100 → 0 | | | |
| | Layer B | $H_2$ | 300 | 300 | 24 | 20 |
| | | $SiH_4$ | 300 | | | |
| Surface layer | | Material for surface layer $CeO_2$ | | 300 | 1 | 0.0874 |

TABLE 8F

| | | Sample No.<br>Al cylinder No. | 501F<br>104 | 502F<br>105 | 503F<br>106 | 504F<br>109 |
|---|---|---|---|---|---|---|
| Layer thickness of light-receiving layer | | Difference in average layer thickness between center and both ends of first layer ($\mu$m) | 0.2 | 0.2 | 0.2 | 0.2 |
| | | Difference in layer thickness of minute portions in first layer ($\mu$m) | 0.13 | 0.11 | 0.1 | 0.2 |
| | Second layer | Difference in average layer thickness between center and both ends of layer A ($\mu$m) | 0.4 | 0.4 | 0.4 | 0.4 |
| | | Difference in layer thickness of minute portions in layer A ($\mu$m) | 0.13 | 0.12 | 0.11 | 0.2 |
| | | Difference in average layer thickness between center and both ends of layer B ($\mu$m) | 3 | 3 | 3 | 3 |
| | | Difference in layer thickness of minute portions in layer B ($\mu$m) | 0.6 | 0.5 | 0.4 | 0.7 |

TABLE 9F

| Layer constitution | | Starting gas | Gas flow rate (SCCM) | Discharging power (W) | Deposition rate (Å/sec) | Layer thickness ($\mu$m) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| | | $B_2H_6/H_2$<br>(= 3000 vol ppm) | 100 → * | | | |
| | | NO | 10 | | | |
| Second layer | Layer A | $H_2$ | 300 | 100 | 10 | 3 |
| | | $SiH_4$ | 100 | | | |
| | | $B_2H_6/H_2$<br>(= 3000 vol ppm) | * → 0 | | | |
| | | NO | 10 | | | |
| | Layer B | $H_2$ | 300 | 300 | 24 | 20 |
| | | $SiH_4$ | 300 | | | |
| | | NO | 10 | | | |
| Surface layer | | Material for surface layer ZnS | | 300 | 1 | 0.0871 |

TABLE 10F

| | Sample No.<br>Al cylinder No. | 601F<br>104 | 602F<br>105 | 603F<br>106 | 604F<br>109 |
|---|---|---|---|---|---|
| Layer thickness of light-receiving layer | Difference in average layer thickness between center and both ends of first layer ($\mu$m) | 0.2 | 0.2 | 0.2 | 0.2 |

TABLE 10F-continued

| | | Sample No. Al cylinder No. | 601F 104 | 602F 105 | 603F 106 | 604F 109 |
|---|---|---|---|---|---|---|
| | | Difference in layer thickness of minute portions in first layer (μm) | 0.14 | 0.12 | 0.1 | 0.16 |
| | Second layer | Difference in average layer thickness between center and both ends of layer A (μm) | 0.3 | 0.3 | 0.3 | 0.3 |
| | | Difference in layer thickness of minute portions in layer A (μm) | 0.2 | 0.14 | 0.13 | 0.21 |
| | | Difference in average layer thickness between center and both ends of layer B (μm) | 3 | 3 | 3 | 3 |
| | | Difference in layer thickness of minute portions in layer B (μm) | 0.57 | 0.4 | 0.3 | 0.6 |

TABLE 11F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$<br>$GeH_4$<br>$SiH_4$<br>$B_2H_6/H_2$<br>(= 3000 vol ppm)<br>$NH_3$ | 300<br>50 → 25<br>50 → 75<br>100 → 0<br><br>10 | 100 | 10 | 2 |
| | Layer B | $H_2$<br>$GeH_4$<br>$SiH_4$<br>$NH_3$ | 300<br>25 → 0<br>75 → 100<br>10 | 100 | 10 | 2 |
| Second layer | | $H_2$<br>$SiH_4$ | 300<br>300 | 300 | 24 | 20 |
| Surface layer | | Material for surface layer $Al_2O_3$ | | 300 | 1 | 0.120 |

TABLE 12F

| | | Sample No. Al cylinder No. | 701F 104 | 702F 105 | 703F 106 | 704F 109 |
|---|---|---|---|---|---|---|
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.1 | 0.1 | 0.1 | 0.12 |
| | | Difference in average layer thickness between center and both ends of layer B (μm) | 0.22 | 0.22 | 0.22 | 0.22 |
| | | Difference in layer thickness of minute portions in layer B (μm) | 0.11 | 0.1 | 0.1 | 0.13 |
| | Difference in average layer thickness between center and both ends of second layer (μm) | | 3 | 3 | 3 | 3 |
| | Difference in layer thickness of minute portions in second layer (μm) | | 0.55 | 0.4 | 0.39 | 0.6 |

TABLE 13F

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$<br>$GeH_4$<br>$SiH_4$<br>$B_2H_6/H_2$<br>(= 3000 vol ppm)<br>$NH_3$ | 300<br>50 → 0<br>50 → 100<br>150 → 110<br><br>10 → 0 | 100 | 10 | 2 |
| Second layer | Layer A | $H_2$<br>$SiH_4$<br>$B_2H_6/H_2$<br>(= 3000 vol ppm) | 300<br>100<br>110 → 0 | 100 | 10 | 3 |
| | Layer B | $H_2$<br>$SiH_4$ | 300<br>300 | 300 | 24 | 20 |
| Surface | | Material for surface | | 300 | 1 | 0.123 |

TABLE 13F-continued

| Layer constitution | Starting gas | Gas flow rate (SCCM) | Discharging power (W) | Deposition rate (Å/sec) | Layer thickness (μm) |
|---|---|---|---|---|---|
| layer | layer CeF$_3$ | | | | |

TABLE 14F

| | Sample No. | 1401F | 1402F | 1403F | 1404F |
|---|---|---|---|---|---|
| | Al cylinder No. | 104 | 105 | 106 | 109 |
| Layer thickness of light-receiving layer | Difference in average layer thickness between center and both ends of first layer (μm) | 0.2 | 0.2 | 0.2 | 0.2 |
| | Difference in layer thickness of minute portions in first layer (μm) | 0.12 | 0.11 | 0.1 | 0.14 |
| Second layer | Difference in average layer thickness between center and both ends of layer A (μm) | 0.4 | 0.4 | 0.4 | 0.4 |
| | Difference in layer thickness of minute portions in layer A (μm) | 0.17 | 0.15 | 0.13 | 0.18 |
| | Difference in average layer thickness between center and both ends of layer B (μm) | 3.2 | 3.2 | 3.2 | 3.2 |
| | Difference in layer thickness of minute portions in layer B (μm) | 0.6 | 0.55 | 0.5 | 0.7 |

TABLE 15F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 → * | | | |
| | | SiH$_4$ | 50 → ** | | | |
| | | B$_2$H$_6$/H$_2$ (= 3000 vol ppm) | 100 → 0 | | | |
| | | CH$_4$ | 10 → 0 | | | |
| | Layer B | H$_2$ | 300 | 100 | 10 | 2 |
| | | GeH$_4$ | * → 0 | | | |
| | | SiH$_4$ | ** → 100 | | | |
| Second layer | | H$_2$ | 300 | 300 | 24 | 20 |
| | | SiH$_4$ | 300 | | | |
| Surface layer | | Material for surface layer MgF$_2$ | | 300 | 1 | 0.141 |

TABLE 16F

| | | Sample No. | 1701F | 1702F | 1703F | 1704F |
|---|---|---|---|---|---|---|
| | | Al cylinder No. | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.13 | 0.11 | 0.1 | 0.15 |
| | | Difference in average layer thickness between center and both ends of layer B (μm) | 0.2 | 0.2 | 0.2 | 0.2 |
| | | Difference in layer thickness of minute portions in layer B (μm) | 0.13 | 0.12 | 0.11 | 0.14 |
| | Difference in average layer thickness between center and both ends of second layer (μm) | | 3 | 3 | 3 | 3 |
| | Difference in layer thickness of minute portions in second layer (μm) | | 0.5 | 0.44 | 0.4 | 0.6 |

TABLE 17F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 2 |
| | | GeH$_4$ | 50 | | | |
| | | SiH$_4$ | 50 | | | |

TABLE 17F-continued

| Layer constitution | | Starting gas | Gas flow rate (SCCM) | Discharging power (W) | Deposition rate (Å/sec) | Layer thickness (μm) |
|---|---|---|---|---|---|---|
| | Layer B | NO<br>H₂<br>GeH₄<br>SiH₄<br>B₂H₆/H₂<br>(= 3000 vol ppm)<br>NO | 10 → *<br>300<br>50 → 0<br>50 → 100<br>100 → 0<br><br>* → ** | 100 | 10 | 2 |
| Second layer | | H₂<br>SiH₄<br>NO | 300<br>300<br>** → 0 | 300 | 24 | 20 |
| Surface layer | | Material for surface layer SiO₂ | | 300 | 1 | 0.131 |

TABLE 18F

| | | | 2001F | 2002F | 2003F | 2004F |
|---|---|---|---|---|---|---|
| | Sample No.<br>Al cylinder No. | | 104 | 105 | 106 | 109 |
| Layer thickness of light-receiving layer | First layer | Difference in average layer thickness between center and both ends of layer A (μm) | 0.2 | 0.2 | 0.2 | 0.2 |
| | | Difference in layer thickness of minute portions in layer A (μm) | 0.11 | 0.11 | 0.1 | 0.13 |
| | | Difference in average layer thickness between center and both ends of layer B (μm) | 0.21 | 0.21 | 0.21 | 0.21 |
| | | Difference in layer thickness of minute portions in layer B (μm) | 0.13 | 0.12 | 0.11 | 0.14 |
| | Difference in average layer thickness between center and both ends of second layer (μm) | | 3 | 3 | 3 | 3 |
| | Difference in layer thickness of minute portions in second layer (μm) | | 0.4 | 0.35 | 0.3 | 0.5 |

TABLE 19F

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂<br>GeH₄<br>SiH₄<br>B₂H₆/H₂<br>(= 3000 vol ppm)<br>NH₃ | 300<br>50<br>50<br>100 → ***<br><br>10 → * | 100 | 10 | 2 |
| Second layer | Layer A | H₂<br>GeH₄<br>SiH₄<br>B₂H₆/H₂<br>(= 3000 vol ppm)<br>NH₃ | 300<br>50 → 0<br>50 → 100<br>*** → 100<br><br>* → ** | 100 | 8 | 3 |
| | Layer B | H₂<br>SiH₄<br>NH₃ | 300<br>300<br>** → 0 | 300 | 24 | 20 |
| Surface layer | | Material for surface layer ZrO₂/TiO₂ = 6:1 | | 300 | 1 | 0.0933 |

Note: *, , and * represent the continuity of change in the gas flow rate, respectively.

TABLE 20F

| | | | 2301F | 2302F | 2303F | 2304F |
|---|---|---|---|---|---|---|
| | Sample No.<br>Al cylinder No. | | 104 | 105 | 106 | 109 |
| Layer thickness of light-receiving layer | Difference in average layer thickness between center and both ends of first layer (μm) | | 0.2 | 0.2 | 0.2 | 0.2 |
| | Difference in layer thickness of minute portions in first layer (μm) | | 0.12 | 0.11 | 0.1 | 0.14 |
| | Second layer | Difference in average layer thickness between center and both ends of layer A (μm) | 0.4 | 0.4 | 0.4 | 0.4 |
| | | Difference in layer thickness of minute portions in layer A (μm) | 0.17 | 0.15 | 0.13 | 0.18 |

TABLE 20F-continued

| Sample No. | 2301F | 2302F | 2303F | 2304F |
|---|---|---|---|---|
| Al cylinder No. | 104 | 105 | 106 | 109 |
| Difference in average layer thickness between center and both ends of layer B ($\mu$m) | 3.2 | 3.2 | 3.2 | 3.2 |
| Difference in layer thickness of minute portions in layer B ($\mu$m) | 0.6 | 0.55 | 0.5 | 0.7 |

What we claim is:

1. A light-receiving member comprising a light-receiving layer of a multi-layer structure having a first layer comprising an amorphous material containing silicon atoms and germanium atoms, a second layer comprising an amorphous material containing silicon atoms and exhibiting photoconductivity and a surface layer having reflection preventive function provided on a substrate successively from the substrate side, said light-receiving layer containing at least one selected from oxgen atoms, carbon atoms and nitrogen atoms and having at least one pair of non-parallel interfaces within a short range and said non-parallel interfaces being arranged in a large number in at least one direction within the plane perpendicular to the layer thickness direction.

2. An electrophotographic system comprising a light-receiving member comprising a light-receiving layer of a multi-layer structure having a first layer comprising an amorphous material containing silicon atoms and germanium atoms, a second layer comprising an amorphous material containing silicon atoms and exhibiting photoconductivity and a surface layer having reflection preventive function provided on a substrate successively from the substrate side, said light-receiving layer containing at least one selected from oxgen atoms, carbon atoms and nitrogen atoms and having at least one pair of non-parallel interfaces within a short range and said non-parallel interfaces being arranged in a large number in at least one direction within the plane perpendicular to the layer thickness direction.

3. The invention according to claim 1 or 2, wherein the non-parallel interfaces are arranged regularly.

4. The invention according to claim 1 or 2, wherein the non-parallel interfaces are arranged in cycles.

5. The invention according to claim 1 or 2, wherein the short range is 0.3$\mu$ to 500$\mu$.

6. The invention according to claim 1 or 2, wherein the non-parallel interfaces are formed on the basis of the unevenness arranged regularly provided on the surface of said substrate.

7. The invention according to claim 6, wherein the said unevenness is formed by reverse-V-shaped linear projections.

8. The invention according to claim 7, wherein the longitudinal section of said reverse-V-Shaped linear projection is substantially an isosceles triangle.

9. The invention according to claim 7, wherein the longitudinal section of said reverse-V-shaped linear projection is substantially a right triangle.

10. The invention according to claim 7, wherein the longitudinal section of said reverse-V-shaped linear projection is substantially a scalene triangle.

11. The invention according to claim 1 or 2, wherein the substrate is cylindrical.

12. The invention according to claim 11, wherein the reverse-V-shaped linear projection has a spiral structure within the plane of said substrate.

13. The invention according to claim 12, wherein the spiral structure is a multiple spiral structure.

14. The invention according to claim 7, wherein the reverse-V-shaped linear projection is divided in its edge line direction.

15. The invention according to claim 11, wherein the edge line direction of the reverse-V-shaped linear projection is along the center axis of the cylindrical substrate.

16. The invention according to claim 7, wherein the unevenness has slanted planes.

17. The invention according to claim 16, wherein the slanted planes are mirror finished.

18. The invention according to claim 6, wherein on the free surface of the light-receiving layer is formed an unevenness arranged with the same pitch as the unevenness provided on the substrate surface.

19. The invention according to claim 1 or 2, wherein the distribution state of germanium atoms in the first layer is ununiform in the layer thickness direction.

20. The invention according to claim 19, the ununiform distribution state of germanium atoms is more enriched toward the substrate side.

21. The invention according to claim 1 or 2, wherein a substance for controlling conductivity is contained in the first layer.

22. The invention according to claim 21, wherein the substance for controlling conductivity is an atom belonging to the group III or the group V of the periodic table.

23. The invention according to claim 1 or 2, wherein a substance for controlling conductivity is contained in the second layer.

24. The invention according to claim 23, wherein the substance for controlling conductivity is an atom belonging to the group III or the group v of the periodic table.

25. The invention according to claim 1 or 2, wherein the light-receiving layer has a layer region (PN) containing a substance for controlling conductivity.

26. The invention according to claim 25, wherein the distribution state of the substance for controlling conductivity in the layer region (PN) is ununiform in the layer thickness direction.

27. The invention according to claim 25, wherein the distribution state of the substance for controlling conductivity in the layer region (PN) is uniform in the layer thickness direction.

28. The invention according to claim 25, wherein the substance for controlling conductivity is an atom belonging to the group III or the group V of the periodic table.

29. The invention according to claim 25, wherein the layer region (PN) is provided in the first layer.

30. The invention according to claim 25, wherein the layer region (PN) is provided in the second layer.

31. The invention according to claim 25, wherein the layer region (PN) is provided at the end portion on the substrate side of the light-receiving layer.

32. The invention according to claim 25, wherein the layer region (PN) is provided over both the first layer and the second layer.

33. The invention according to claim 25, wherein the layer region (PN) occupies a layer region in the light-receiving layer.

34. The invention according to claim 33, wherein the content of the substance for controlling conductivity in the layer region (PN) is 0.01 to $5 \times 10^4$ atomic ppm.

35. The invention according to claim 1 or 2, wherein at least one of hydrogen atoms and halogen atoms are contained in the first layer.

36. The invention according to claim 1 or 2, wherein 0.01 to 40 atomic % of hydrogen atoms are contained in the first layer.

37. The invention according to claim 1 or 2, wherein 0.01 to 40 atomic % of halogen atoms are contained in the first layer.

38. The invention according to claim 1 or 2, wherein 0.01 to 40 atomic % as a total of hydrogen atoms and halogen atoms are contained in the first layer.

39. The invention according to claim 1 or 2, wherein 1 to 40 atomic % of hydrogen atoms are contained in the second layer.

40. The invention according to claim 1 or 2, wherein 1 to 40 atomic % of halogen atoms are contained in the second layer.

41. The invention according to claim 1 or 2, wherein 1 to 40 atomic % as a total of hydrogen atoms and halogen atoms are contained in the second layer.

42. The invention according to claim 1 or 2, wherein at least one of hydrogen atoms and halogen atoms are contained in the second layer.

43. The invention according to claim 1 or 2, wherein the first layer has a layer thickness of 30 Å to 50μ.

44. The invention according to claim 1 or 2, wherein the second layer has a layer thickness of 0.5 to 90μ.

45. The invention according to claim 1 or 2, wherein the light receiving layer has a layer thickness of 1 to 100μ.

46. The invention according to claim 1 or 2, wherein the layer thickness $T_B$ of the first layer and the layer thickness T of the second layer satisfy the relationship of $T_B/T \leq 1$.

47. The invention according to claim 1 or 2, wherein the light-receiving layer contains at least one kind of atoms selected from oxygen atoms, carbon atoms and nitrogen atoms in uniform distribution state in the layer thickness direction.

48. The invention according to claim 1 or 2, wherein the light-receiving layer contains at least one kind of atoms selected from oxygen atoms, carbon atoms and nitrogen atoms in nonuniform distribution state in the layer thickness direction.

49. The invention according to claim 1 or 2, wherein the light-receiving layer has a layer region (OCN) containing at least one kind of atoms selected from oxygen atoms, carbon atoms and nitrogen atoms.

50. The invention according to claim 49, wherein the layer region (OCN) is provided at the end portion on the substrate side of the light-receiving layer.

51. The invention according to claim 50, wherein the layer region (OCN) contains 0.001 to 50 atomic % of oxygen atoms.

52. The invention according to claim 50, wherein the layer region (OCN) contains 0.001 to 50 atomic % of nitrogen atoms.

53. The invention according to claim 50, wherein oxygen atoms are contained in the layer region (OCN) in nonuniform distribution state in the layer thickness direction.

54. The invention according to claim 50, wherein oxygen atoms are contained in the layer region (OCN) in uniform distribution state in the layer thickness direction.

55. The invention according to claim 50, wherein nitrogen atoms are contained in the layer region (OCN) in nonuniform distribution state in the layer thickness direction.

56. The invention according to claim 50, wherein nitrogen atoms are contained in the layer region (OCN) in uniform distribution state in the layer thickness direction.

57. An electrophotographic image forming process comprising:
   (a) applying a charging treatment to the light receiving member of claim 1 or 2;
   (b) irradiating the light receiving member with a laser beam carrying information to form an electrostatic latent image; and
   (c) developing said electrostatic latent image.

* * * * *

UNITED STATES PATENT AND TRADEMARK OFFICE
CERTIFICATE OF CORRECTION

PATENT NO. : 4,678,733

DATED : July 7, 1987

INVENTOR(S) : KEISHI SAITOH, ET AL.

Page 1 of 13

It is certified that error appears in the above-identified patent and that said Letters Patent is hereby corrected as shown below:

SHEET 30

Figure 71, "GAS FROW RATE RATIO" should read --GAS FLOW RATE RATIO--.

COLUMN 1

Line 2, "LIGHT RECEIVING" should read --LIGHT-RECEIVING--.
Line 3, "A-SI:GE (C,N,O) A-SI/SURFACE" should read --A-Si:Ge (C,N,O) A-Si/SURFACE--.
Line 34, "small" should read --small---.
Line 35, "size" should read --sized--.
Line 50, "layer,for" should read --layer, for--.

COLUMN 2

Line 18, "an" should read --a--.
Line 40, "$R_1$ from" should read --$R_1$ reflected from--.

COLUMN 3

Line 15, "sized" should read --sizes--.

COLUMN 4

Line 57, "prevent" should read --present--.

UNITED STATES PATENT AND TRADEMARK OFFICE
CERTIFICATE OF CORRECTION

PATENT NO. : 4,678,733
DATED : July 7, 1987
INVENTOR(S) : KEISHI SAITOH, ET AL.

It is certified that error appears in the above-identified patent and that said Letters Patent is hereby corrected as shown below:

COLUMN 8

Line 12, "is" should read --in--.
Line 57, "considerations," should read --consideration,--.
Line 60, "near infrared" should read --near-infrared--.

COLUMN 9

Line 37, "now the" should read --now to the--.
Line 52, "A-SiGe(H,X)," should read --"A-SiGe(H,X)"),--.

COLUMN 14

Line 2, "so called" should read --so-called--.
Line 32, "ion plating" should read --ion-plating--.
Line 67, "siH$_2$I$_2$," should read --SiH$_2$I$_2$,--.

COLUMN 15

Line 47, "a-Si(H,X)" should read --A-Si(H,X)--.

COLUMN 16

Line 3, "halo gen" should read --halogen--.

COLUMN 20

Line 7, "acetyllene" should read --acetylene--.

UNITED STATES PATENT AND TRADEMARK OFFICE
CERTIFICATE OF CORRECTION

PATENT NO. : 4,678,733

DATED : July 7, 1987

INVENTOR(S) : KEISHI SAITOH, ET AL.

It is certified that error appears in the above-identified patent and that said Letters Patent is hereby corrected as shown below:

COLUMN 21

Line 18, delete "depending on.".
Line 39, "desired" should read --as desired--.
Line 48, "so called" should read --so-called--.
Line 51, "and" should read --and/or--.
Line 51, delete "and-".
Line 52, delete "/or".
Line 66, delete "be" (first occurrence).

COLUMN 22

Line 26, "a" should read --an--.
Line 58, "so called" should read --so-called--.
Line 60, "layer containing" should read --layer region containing--.
Line 63, "so" should read --so---.

COLUMN 23

Line 64, "was" should read --is--.

COLUMN 24

Line 22, "in Figure," should read --in the Figure,--.
Line 27, "shown Figs. 27" should read --shown in Figs. 27--.

UNITED STATES PATENT AND TRADEMARK OFFICE
CERTIFICATE OF CORRECTION

PATENT NO. : 4,678,733

DATED : July 7, 1987

INVENTOR(S) : KEISHI SAITOH, ET AL.

It is certified that error appears in the above-identified patent and that said Letters Patent is hereby corrected as shown below:

COLUMN 25

Line 49, "high speed" should read --high-speed--.
Line 66, "apply" should read --applying--.
Line 68, "a" should read --an--.

COLUMN 26

Line 20, "bomb" should read --a bomb--.
Line 67, "period time" should read --period of time--.

COLUMN 27

Line 22, "vide," should read --vice,--.

COLUMN 28

Line 7, "aboe mentioned" should read --above-mentioned--.

COLUMN 29

Line 57, "205 μm" should read --2.5 μm--.
Line 59, "members" should read --member--.

COLUMN 30

Line 21, "$GeH_4$" should read --and $GeH_4$--.
Line 37, "above mentioned" should read --above mentioned--.

UNITED STATES PATENT AND TRADEMARK OFFICE
CERTIFICATE OF CORRECTION

PATENT NO. : 4,678,733

DATED : July 7, 1987

INVENTOR(S) : KEISHI SAITOH, ET AL.

It is certified that error appears in the above-identified patent and that said Letters Patent is hereby corrected as shown below:

COLUMN 31

Line 68, "layer 0.3 µm." should read --layer was 0.3 µm.--.

COLUMN 34

Line 3, "sutstrate" should read --substrates--.

COLUMN 39

Line 2, "substrate" should read --substrates--.
Line 27, "substrate" should read --substrates--.

COLUMN 40

Line 9, "substrate" should read --substrates--.
Line 40, "substrate" should read --substrates--.

COLUMN 41

Line 3, "substrate" should read --substrates--.
Line 33, "substrate" should read --substrates--.
Line 63, "substrate" should read --substrates--.

COLUMN 42

Line 25, "substrate" should read --substrates--.
Line 37, "compouter" should read --computer--.
Line 56, "substrate" should read --substrates--.

UNITED STATES PATENT AND TRADEMARK OFFICE
CERTIFICATE OF CORRECTION

PATENT NO. : 4,678,733

DATED : July 7, 1987

INVENTOR(S) : KEISHI SAITOH, ET AL.

It is certified that error appears in the above-identified patent and that said Letters Patent is hereby corrected as shown below:

COLUMN 43

Line 13, "substrate" should read --substrates--.
    Line 51, "NO." should read --No.--.

COLUMN 44

Line 28, "substrate" should read --substrates--.

COLUMN 45

Line 18, "substrate" should read --substrates--.
    Line 50, "substrate" should read --substrates--.

COLUMN 46

Line 41, "substrate" should read --substrates--.
    Line 44, "in 2A" should read --in Table 2A--.

COLUMN 47

Line 37, "substrate" should read --substrates--.

COLUMN 48

Line 3, "substrate" should read --substrates--.
    Line 37, "substrate" should read --substrates--.

UNITED STATES PATENT AND TRADEMARK OFFICE
CERTIFICATE OF CORRECTION

PATENT NO. : 4,678,733            Page 7 of 13

DATED : July 7, 1987

INVENTOR(S) : KEISHI SAITOH, ET AL.

It is certified that error appears in the above-identified patent and that said Letters Patent is hereby corrected as shown below:

COLUMN 49

Line 38, "substrate" should read --substrates--.
Line 39, "were under" should read --were worked under--.
Line 67, "substrate" should read --substrates--.

COLUMN 50

Line 24, "Example 66" should read --EXAMPLE 66-- (centered).
Line 58, "NO." should read --No.--.

COLUMN 53

Line 26, "fringed" should read --fringe--.

COLUMN 54

Line 19, close up right margin.
Line 20, close up left margin.

COLUMN 55

Line 64, "2010 controlled" should read --2010 were controlled--.
Line 66, "$B_bH_6/H_2$" should read --$B_2H_6/H_2$--.
Line 68, "manners" should read --manner--.

UNITED STATES PATENT AND TRADEMARK OFFICE
CERTIFICATE OF CORRECTION

PATENT NO. : 4,678,733

DATED : July 7, 1987

INVENTOR(S) : KEISHI SAITOH, ET AL.

It is certified that error appears in the above-identified patent and that said Letters Patent is hereby corrected as shown below:

COLUMN 56

Line 10, "N." should read --Nos.--.
    Line 25, "2010 controlled" should read --2010 were controlled--.
    Line 56, "2010 controlled" should read --2010 were controlled--.

COLUMN 57

Line 1, "301F-304F, and" should read --301F-304F, the image was free from any interference fringe pattern observed and--.
    Line 15, "2010 controlled" should read --2010 were controlled--.
    Line 42, "CeO$_2$" should read --CeO$_2$--.

COLUMN 58

Line 37, "2010 controlled" should read --2010 were controlled--.
    Line 66, "Any" should read --In any--.

COLUMN 59

Line 4, close up right margin.
    Line 5, close up left margin.
    Line 13, "Any" should read --In any--.
    Line 28, "Any" should read --In any--.
    Line 41, "mass controllers" should read --mass flow controllers--.

UNITED STATES PATENT AND TRADEMARK OFFICE
CERTIFICATE OF CORRECTION

PATENT NO. : 4,678,733
DATED : July 7, 1987
INVENTOR(S) : KEISHI SAITOH, ET AL.

It is certified that error appears in the above-identified patent and that said Letters Patent is hereby corrected as shown below:

COLUMN 59 (continued)

Lines 34-58, The four paragraphs beginning with "Next, a-Si . . ." and ending with "for practical application." should be moved to Example 100 and added in Column 61, line 37, after "Nos. 104-106, 109)."

COLUMN 60

Line 1, "Any" should read --In any--.
    Line 16, "Any" should read --In any--.
    Line 33, "Any" should read --In any--.
    Line 50, "mass controllers" should read --mass flow controllers--.

COLUMN 61

Line 10, "is" should read --in--.
    Line 13, "Any" should read --In any--.
    Line 14, "interference pattern" should read --interference fringe pattern--.
    Line 28, delete "in".
    Line 29, "Any" should read --In any--.
    Line 30, "interference pattern" should read --interference fringe pattern--.
    Line 49, "to an" should read --to obtain an--.
    Line 49, "Any" should read --In any--.
    Line 51, "observed proved" should read --observed and proved--.
    Line 58, "N0$_3$" should read --NO$_3$--.

UNITED STATES PATENT AND TRADEMARK OFFICE
CERTIFICATE OF CORRECTION

PATENT NO. : 4,678,733

DATED : July 7, 1987

INVENTOR(S) : KEISHI SAITOH, ET AL.

It is certified that error appears in the above-identified patent and that said Letters Patent is hereby corrected as shown below:

COLUMN 61 (continued)

Line 66, "Any" should read --In any--.
Line 67, "interference pattern" should read --interference fringe pattern--.

COLUMN 62

Line 12, "SiO2" should read --$SiO_2$--.
Line 14, "mass controllers" should read --mass flow controllers--.
Line 45, "Any" should read --In any--.
Line 61, "Any" should read --In any--.

COLUMN 63

Line 8, "ZrO2" should read --$ZrO_2$--.
Line 10, "mass controllers" should read --mass flow controllers--.
Line 33, close up right margin.
Line 34, close up left margin.
Line 40, "Any" should read --In any--.
Line 67, "Any" should read --In any--.

COLUMN 64

Line 23, "Table 304," should read --Table 30A,--.

UNITED STATES PATENT AND TRADEMARK OFFICE
CERTIFICATE OF CORRECTION

PATENT NO. : 4,678,733
DATED : July 7, 1987
INVENTOR(S) : KEISHI SAITOH, ET AL.

It is certified that error appears in the above-identified patent and that said Letters Patent is hereby corrected as shown below:

COLUMN 71

Table 24A, "$SiH_4He =$" should read --$SiH_4/He =$--.
Table 25A, "$SiH_4He =$" should read --$SiH_4/He =$--.
Table 26A, "$SiH_4He =$" should read --$SiH_4/He =$--.
Table 27A, "$SiH_4He =$" should read --$SiH_4/He =$--.

COLUMN 73

Table 29A, "$SiH_4He =$" should read --$SiH_4/He =$--.
Table 29A, "(Sample No. 2201A)" should read --(Sample No. 2207A)--.
Table 29A, "$CH_4/(SiH_4 + GeH_4) =$" 3/10~0
should read --$CH_4/(SiH_4 + GeH_4) =$-- 1/10~1/100

COLUMN 91

Table 24C, "latex B" should read --layer B--.

COLUMN 93

Table 2D, "$GeH_4 + SiH4 = 100$" should read --$GeH_4 + SiH_4 = 100$--.

UNITED STATES PATENT AND TRADEMARK OFFICE
CERTIFICATE OF CORRECTION

PATENT NO. : 4,678,733
DATED : July 7, 1987
INVENTOR(S) : KEISHI SAITOH, ET AL.

It is certified that error appears in the above-identified patent and that said Letters Patent is hereby corrected as shown below:

COLUMN 110

Table 8F, "Second" should read --Second--.
      layer                          layer
      layer
   Table 8F, close up vertical extra space.

COLUMN 117

Line 56, "reverse-V-Shaped" should read
         --reverse-V-shaped--.

COLUMN 118

Line 22, "claim 7," should read --claim 6,--.
   Line 33, "19, the" should read --19, wherein the--.
   Line 48, "group v" should read --group V--.

COLUMN 119

Line 43, "light receiving" should read --light-receiving--.

UNITED STATES PATENT AND TRADEMARK OFFICE
CERTIFICATE OF CORRECTION

PATENT NO. : 4,678,733                   Page 13 of 13

DATED : July 7, 1987

INVENTOR(S) : KEISHI SAITOH, ET AL.

It is certified that error appears in the above-identified patent and that said Letters Patent is hereby corrected as shown below:

COLUMN 120

Line 42, "light receiv-" should read --light-receiv---.
    Line 44, "light receiving" should read --light-receiving--.

Signed and Sealed this

Seventeenth Day of May, 1988

Attest:

DONALD J. QUIGG

Attesting Officer            Commissioner of Patents and Trademarks